United States Patent
Said et al.

(10) Patent No.: US 11,515,273 B2
(45) Date of Patent: *Nov. 29, 2022

(54) BONDED ASSEMBLY CONTAINING OXIDATION BARRIERS, HYBRID BONDING, OR AIR GAP, AND METHODS OF FORMING THE SAME

(71) Applicant: SANDISK TECHNOLOGIES LLC, Addison, TX (US)

(72) Inventors: Ramy Nashed Bassely Said, San Jose, CA (US); Senaka Kanakamedala, San Jose, CA (US); Raghuveer S. Makala, Campbell, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 63 days.

This patent is subject to a terminal disclaimer.

(21) Appl. No.: 16/851,839

(22) Filed: Apr. 17, 2020

(65) Prior Publication Data
US 2021/0028136 A1     Jan. 28, 2021

Related U.S. Application Data

(63) Continuation-in-part of application No. 16/523,029, filed on Jul. 26, 2019, now Pat. No. 11,139,272.

(51) Int. Cl.
*H01L 23/00* (2006.01)
*H01L 23/522* (2006.01)
*H01L 25/065* (2006.01)

(52) U.S. Cl.
CPC .......... *H01L 24/09* (2013.01); *H01L 23/5228* (2013.01); *H01L 24/03* (2013.01);
(Continued)

(58) Field of Classification Search
CPC . H01L 2224/80048; H01L 2224/80895; H01L 2224/80896
See application file for complete search history.

(56) References Cited

U.S. PATENT DOCUMENTS 8,802,538 B1   8/2014  Liu et al.
9,515,085 B2  12/2016  Rabkin et al.
(Continued)

FOREIGN PATENT DOCUMENTS

KR  10-2013-0136900 A  12/2013
KR  10-2014-0017446 A   2/2014

OTHER PUBLICATIONS

Said, R.N.B. et al., "Bonded Assembly Containing Oxidation Barriers, Hybrid Bonding, Or Air Gap, and Methods of Forming the Same," U.S. Appl. No. 16/851,908, filed Apr. 17, 2020.
(Continued)

*Primary Examiner* — Fernando L Toledo
*Assistant Examiner* — Valerie N Newton
(74) *Attorney, Agent, or Firm* — The Marbury Law Group PLLC

(57) ABSTRACT

At least one polymer material may be employed to facilitate bonding between the semiconductor dies. Plasma treatment, formation of a blended polymer, or formation of polymer hairs may be employed to enhance bonding. Alternatively, air gaps can be formed by subsequently removing the polymer material to reduce capacitive coupling between adjacent bonding pads.

20 Claims, 57 Drawing Sheets

(52) U.S. Cl.
CPC ............... *H01L 24/27* (2013.01); *H01L 24/30* (2013.01); *H01L 24/83* (2013.01); *H01L 25/0657* (2013.01)

(56) References Cited

U.S. PATENT DOCUMENTS

| | | | |
|---|---|---|---|
| 10,115,459 B1 | 10/2018 | Yamada et al. | |
| 10,115,681 B1 | 10/2018 | Ariyoshi | |
| 10,283,243 B2 | 5/2019 | Nishida | |
| 10,354,980 B1 | 7/2019 | Mushiga et al. | |
| 10,354,987 B1 | 7/2019 | Mushiga et al. | |
| 10,381,322 B1 | 8/2019 | Azuma et al. | |
| 10,381,362 B1 | 8/2019 | Cui et al. | |
| 11,139,272 B2* | 10/2021 | Makala | H01L 24/89 |
| 2003/0111441 A1 | 6/2003 | Jerominek et al. | |
| 2003/0230799 A1 | 12/2003 | Yee et al. | |
| 2004/0041393 A1 | 3/2004 | Lee | |
| 2005/0023703 A1 | 2/2005 | Sebesta et al. | |
| 2005/0186704 A1 | 8/2005 | Yee et al. | |
| 2006/0087039 A1 | 4/2006 | Cheng et al. | |
| 2006/0128142 A1 | 6/2006 | Whelan et al. | |
| 2006/0289989 A1 | 12/2006 | Yee et al. | |
| 2007/0148912 A1 | 6/2007 | Morita et al. | |
| 2009/0001557 A1 | 1/2009 | Renavikar et al. | |
| 2009/0039499 A1 | 2/2009 | Chainer | |
| 2009/0051036 A1 | 2/2009 | Abbott | |
| 2009/0302459 A1 | 12/2009 | Chainer | |
| 2011/0084403 A1 | 4/2011 | Yang et al. | |
| 2011/0156251 A1 | 6/2011 | Chu et al. | |
| 2011/0165732 A1 | 7/2011 | Abbott | |
| 2011/0221059 A1 | 9/2011 | Tang et al. | |
| 2011/0226841 A1 | 9/2011 | Wei et al. | |
| 2011/0312131 A1 | 12/2011 | Renavikar et al. | |
| 2013/0161816 A1 | 6/2013 | Chu et al. | |
| 2014/0175655 A1 | 6/2014 | Chen et al. | |
| 2014/0246770 A1 | 9/2014 | Jha et al. | |
| 2014/0339700 A1 | 11/2014 | Ren et al. | |
| 2015/0228575 A1 | 8/2015 | Sameshima | |
| 2015/0258769 A1 | 9/2015 | Farah | |
| 2017/0062366 A1 | 3/2017 | Enquist | |
| 2017/0133296 A1 | 5/2017 | Jha et al. | |
| 2017/0200691 A1 | 7/2017 | Fujino et al. | |
| 2019/0051628 A1 | 2/2019 | Liu et al. | |
| 2019/0221557 A1 | 7/2019 | Kim et al. | |
| 2019/0252361 A1 | 8/2019 | Nishida | |
| 2020/0051945 A1 | 2/2020 | Pan et al. | |
| 2020/0066745 A1 | 2/2020 | Yu et al. | |
| 2021/0320075 A1* | 10/2021 | Hou | H01L 25/0657 |

OTHER PUBLICATIONS

Notification of Transmittal of the International Search Report and Written Opinion of the International Search Authority for International Patent Application No. PCT/US2020/024580, dated Jul. 29, 2020, 10 pages.
USPTO Office Communication, Non-Final Office Action for U.S. Appl. No. 16/523,029, dated Feb. 22, 20 pages.
Endoh, T. et al., "Novel Ultra High Density Flash Memory with a Stacked-Surrounding Gate Transistor (S-GT) Structured Cell," IEDM Proc., pp. 33-36, (2001).
Suzuki, S. et al., "Native Oxide layers formed on the surface of ultra high-purity iron and copper investigated by angle resolved XPS", Materials Transactions, JIM, vol. 38, 1004-1009 (1997).
Kang, C.G. et al., "Effects of multi-layer graphene capping on Cu interconnects", Nanotechnology 24, 115707, 6 pages (2013).
Kwak, J. et al., "Oxidation behavior of graphene-coated copper at intrinsic graphene defects of different origins", Nature Communications. 8, 1549, 12 pages (2017).
Zhang, M. et al., "Selective LPCVD growth of graphene on patterned copper and its growth mechanism", Applied Physics Letters, 109, 253109 (2016), 6 pages.
Yeh, C-H et al., "Scalable Graphite/Copper Bi-shell Composite for High-Performance Interconnects", ACS Nano, vol. 8(1), 275-282 (2014).
Liu, C. et al., "Fluxless Soldering of Copper Substrates Using Self-Assembled Monolayers for Preservation", IEEE Transactions on Components and Packaging Technologies, vol. 29, No. 3, Sep. 2006, 10 pages.
Gandhi, D.D. et al., "Annealing-induced interfacial toughening using a molecular nanolayer", Nature, vol. 447, 299-302 (May 2007).
Sung, M.M. et al., "Self-Assembled Monolayers of Alkanethiols on Clean Copper Surfaces", Bull. Korean Chem. vol. 22, No. 7, pp. 748-752 (2001).
Gandhi, D.D. et al., "Copper Diffusion and mechanical toughness at Cu-silica interfaces glued with polyelectrolyte nanolayers", Journal of Applied Physics. 101, 084505, (2007) 5pages.
Sébastien, G. et al., "Biaxially oriented polypropylene (BOPP) surface modification by nitrogen atmospheric pressure glow discharge (APGD) and by air corona," Plasmas and Polymers 7.1 (2002): 71-88.
Geim, A. K. et al., "Microfabricated adhesive mimicking gecko foot-hair," Nature materials 2.7 (2003): 461-463.
Das, J. H. et al., "Metal diffusion in polymers." IEEE Transactions on Components, Packaging, and Manufacturing Technology: Part B 17.4 (1994): 620-625.
Shacham-Diamand, Y., et al., "Copper transport in thermal SiO2." Journal of the Electrochemical Society 140.8 (1993): 2427.
Liu, C. et al., "Fluxless Soldering of Copper Substrates Using Self-Assembled Monolayers for Preservation," IEEE Trans on Comp. & Packaging Tech. 29, 3, 512-521 (2006).
Kohl, P.A. et al., "Air-Gaps for Electrical Interconnections." Electrochemical and Solid-State Letters 1.1 (1998): 49-51.
Hung, C.J. et al., "Novel reactive compatibilization strategy on immiscible polypropylene and polystyrene blend." Journal of Applied Polymer Science 107.2 (2008): 831-839.
Kwon, O.J. et al., "Surface characteristics of polypropylene film treated by an atmospheric pressure plasma." Surface and Coatings Technology 192.1 (2005): 1-10.
Pandiyaraj, K.S. et al., "Adhesive properties of polypropylene (PP) and polyethylene terephthalate (PET) film surfaces treated by DC glow discharge plasma." Vacuum 83.2 (2008): 332-339.
Tidjani, A. et al., "Polypropylene-graft-maleic anhydride-nanocomposites: I-Characterization and thermal stability of nanocomposites produced under nitrogen and in air." Polymer Degradation and Stability 82.1 (2003): 133-140.
Świtała-Żeliazkow, M. "Thermal degradation of copolymers of styrene with dicarboxylic acids-II: Copolymers obtained by radical copolymerisation of styrene with maleic acid or fumaric acid." Polymer degradation and stability 91.6 (2006): 1233-1239.
U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/288,656, filed Feb. 28, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.

(56) References Cited

OTHER PUBLICATIONS

U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/722,745, filed Dec. 20, 2019, SanDisk Technologies LLC.
U.S. Appl. No. 16/722,824, filed Dec. 20, 2019, SanDisk Technologies LLC.

\* cited by examiner

BONDED ASSEMBLY CONTAINING OXIDATION BARRIERS, HYBRID BONDING, OR AIR GAP, AND METHODS OF FORMING THE SAME

RELATED APPLICATIONS

The instant application is a continuation-in-part (CIP) application of U.S. application Ser. No. 16/523,029 filed on Jul. 26, 2019, the entire contents of which are incorporated herein by reference.

FIELD

The present disclosure relates generally to the field of semiconductor devices, and particularly to a bonded assembly containing oxidation barriers, adhesion enhancers, polymers, and/or air gaps for metal-to-metal or hybrid bonded wafers and methods for forming the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a bonded assembly is provided, which comprises: a first semiconductor die comprising a first substrate, first semiconductor devices, and first bonding pads that are electrically connected to a respective node of the first semiconductor devices and laterally surrounded by a first pad-level dielectric layer, wherein the first pad-level dielectric layer comprises a stack of a first proximal polymer material layer and a first distal polymer material layer having at least one of greater hydrophilicity or greater cross-linking density than first proximal polymer material layer; and a second semiconductor die comprising a second substrate, second semiconductor devices, and second bonding pads that are electrically connected to a respective node of the second semiconductor devices and laterally surrounded by a second pad-level dielectric layer, wherein each of the second bonding pads is bonded to a respective one of the first bonding pads, and the first distal polymer material layer contacts the second pad-level dielectric layer.

According to another aspect of the present disclosure, a bonded assembly is provided, which comprises: a first semiconductor die comprising a first substrate, first semiconductor devices, and first bonding pads that are electrically connected to a respective node of the first semiconductor devices; a second semiconductor die comprising a second substrate, second semiconductor devices, and second bonding pads that are electrically connected to a respective node of the second semiconductor devices; and a pad-level polymer material layer including a blend of two miscible polymer materials laterally surrounding the first bonding pads and the second bonding pads.

According to yet another aspect of the present disclosure, a method of forming a bonded assembly is provided, which comprises: providing a first semiconductor die comprising a first substrate, first semiconductor devices, and first bonding pads that are electrically connected to a respective node of the first semiconductor devices and laterally surrounded by a first polymer material layer including a first polymer material; providing a second semiconductor die comprising a second substrate, second semiconductor devices, and second bonding pads that are electrically connected to a respective node of the second semiconductor devices and laterally surrounded by a second polymer material layer including a second polymer material, wherein the second polymer material is miscible with and is different from the first polymer material, wherein the second polymer material is miscible with the first polymer material; bringing the first semiconductor die and the second semiconductor die into contact with each other such that the second bonding pads are disposed on a respective one of the first bonding pads; and mixing the first polymer material and the second polymer material, whereby a pad-level polymer material layer including a blend of first polymer material and the second polymer material is formed.

According to still another aspect of the present disclosure, a bonded assembly is provided, which comprises: a first semiconductor die comprising a first substrate, first semiconductor devices, and first bonding pads that are electrically connected to a respective node of the first semiconductor devices and laterally surrounded by a first pad-level dielectric layer, wherein the first pad-level dielectric layer comprises a first polymer material layer and first polymer hairs extending from a horizontal surface of the first polymer material layer, having a diameter or maximum width from 0.1 microns to 10 microns, a height from 0.1 microns to 5 microns, and periodicity from 0.2 microns to 10 microns; and a second semiconductor die comprising a second substrate, second semiconductor devices, and second bonding pads that are electrically connected to a respective node of the second semiconductor devices and laterally surrounded by a second pad-level dielectric layer, wherein each of the second bonding pads is bonded to a respective one of the first bonding pads, and the first polymer hairs contact the second pad-level dielectric layer.

According to even another aspect of the present disclosure, a method of forming a bonded assembly is provided, which comprises: providing a first semiconductor die comprising a first substrate, first semiconductor devices, and first bonding pads that are electrically connected to a respective node of the first semiconductor devices and laterally surrounded by a first pad-level dielectric layer, wherein the first pad-level dielectric layer comprises a stack of a first pad-level silicon-containing dielectric layer and a first polymer material layer including a first polymer material; providing a second semiconductor die comprising a second substrate, second semiconductor devices, and second bonding pads that are electrically connected to a respective node of the second semiconductor devices and laterally surrounded by a second pad-level dielectric layer; and bonding the first bonding pads to the second bonding pads while the first polymer material contacts the second pad-level dielectric layer.

According to a further aspect of the present disclosure, a bonded assembly is provided, which comprises: a first semiconductor die comprising a first substrate, first semiconductor devices, and first bonding pads that are electrically connected to a respective node of the first semiconductor devices and laterally surrounded by a first pad-level dielectric layer, wherein the first pad-level dielectric layer comprises a first distal surface that is more proximal to the first substrate than distal surfaces of the first bonding pads are to the first substrate; and a second semiconductor die comprising a second substrate, second semiconductor devices, and second bonding pads that are electrically connected to a respective node of the second semiconductor devices and laterally surrounded by a second pad-level dielectric layer, wherein each of the second bonding pads is bonded to a respective one of the first bonding pads, the second pad-level dielectric layer comprises a second distal surface that is more proximal to the second substrate than distal surfaces of the second bonding pads are to the first substrate, and an air gap is present between the first pad-level dielectric material layer and the second pad-level dielectric layer, and the air gap laterally surrounds each bonded pair of the first bonding pad and second bonding pad.

According to an embodiment of the present disclosure, a method of forming a bonded assembly includes providing a first semiconductor die containing a first substrate, first semiconductor devices, and first bonding pads that are electrically connected to a respective node of the first semiconductor devices, forming a first oxidation barrier layer on physically exposed surfaces of the first bonding pads, providing a second semiconductor die containing a second substrate, second semiconductor devices, and second bonding pads that are electrically connected to a respective node of the second semiconductor devices, and bonding the second bonding pads to the first bonding pads with at least the first oxidation barrier layer located between the respective first and second bonding pads.

According to another embodiment of the present disclosure, a bonded assembly comprises a first semiconductor die comprising a first substrate, first semiconductor devices, and first bonding pads that are electrically connected to a respective node of the first semiconductor devices, and a second semiconductor die comprising a second substrate, second semiconductor devices, and second bonding pads that are electrically connected to a respective node of the second semiconductor devices, wherein each of the second bonding pads is bonded to a respective one of the first bonding pads. Each bonded pair of a first bonding pad and a second bonding pad includes an interfacial region that includes volumes that are within 10 nm from an interface between the first bonding pad and the second bonding pad; and each interfacial region has an average volume carbon density that is greater than $1.0 \times 10^{16}/cm^3$.

DETAILED DESCRIPTION

Figure 1:
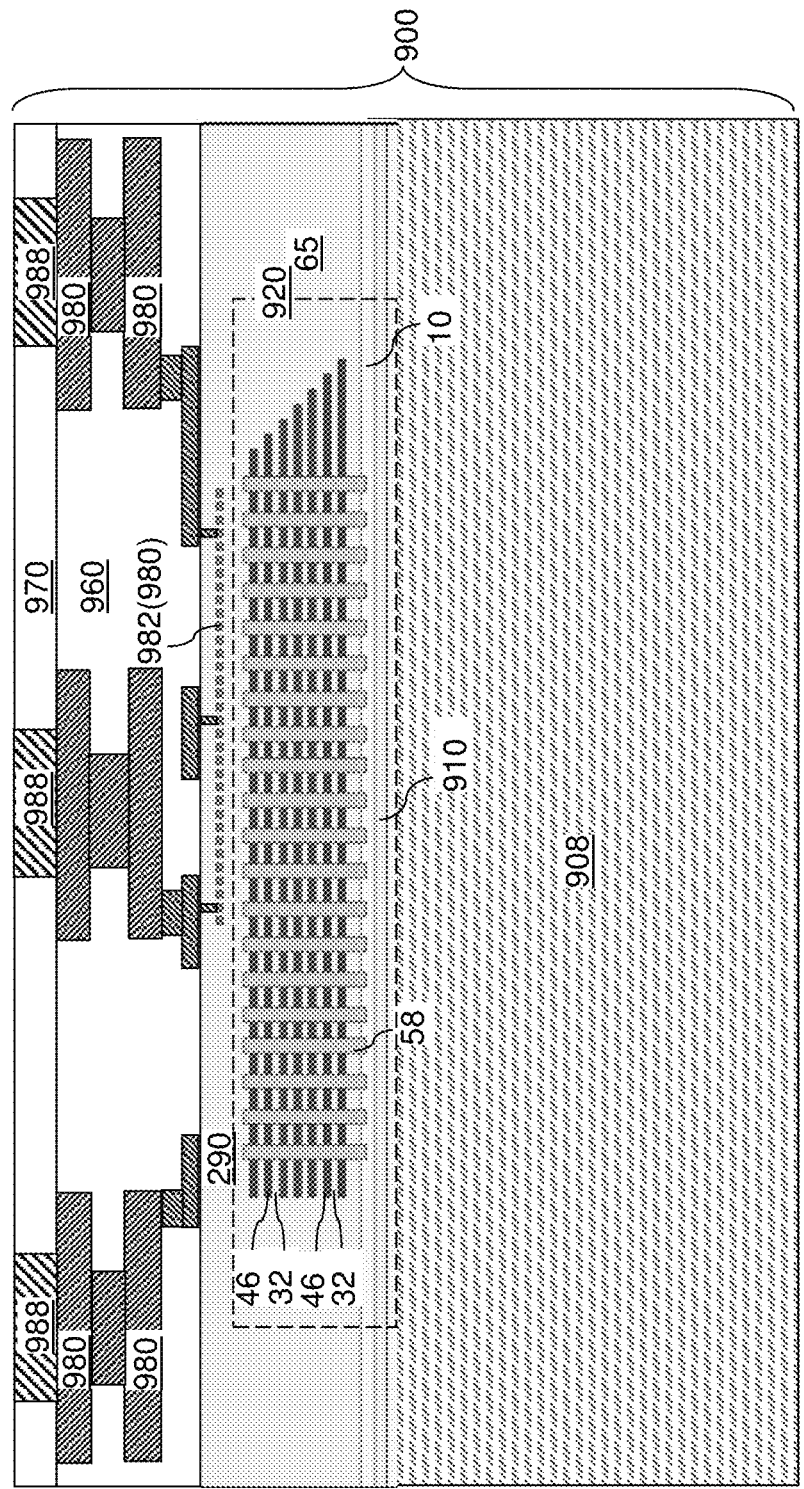
FIG. 1 is a schematic vertical cross-sectional view of a first semiconductor die after formation of a first bonding dielectric layer and first bonding pads according to a first embodiment of the present disclosure.

Hybrid wafer-to-wafer bonding utilizes chemical bond formation between pad dielectric material layers and between electrically conductive bonding pads of opposing wafers. Metal-to-metal bonding utilizes bond formation between electrically conductive bonding pads of opposing wafers. The present inventors determined that in both types of bonding, the exposed surfaces of electrically conductive bonding pads, such as copper bonding pads for example, readily oxidize prior to bonding to form a metal oxide (e.g., copper oxide) interlayer at the bonding interface. The metal oxide interlayer increases the resistivity of the bond between the electrically conductive bonding pads of opposing wafers.

In some embodiments of the present disclosure an oxidation barrier is formed on at least one bonding pad to reduce or eliminate a formation of the metal oxide interlayer at the bonding interface. In one embodiment, the oxidation barrier may comprise a carbon-containing material. The oxidation barrier may be used in a bonded assembly that is bonded by either hybrid bonding or metal-to-metal bonding, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming A page is also the smallest unit that may be selected to a read operation.

Referring to FIG. 1, a first semiconductor die 900 according to a first embodiment of the present disclosure is illustrated. The first semiconductor die 900 includes a first substrate 908, first semiconductor devices 920 overlying the first substrate 908, first dielectric material layers (290, 960, 970) overlying the first semiconductor devices, and first metal interconnect structures 980 embedded in the first dielectric material layers (290, 960, 970). In one embodiment, the first substrate 908 may be a commercially available silicon wafer having a thickness in a range from 500 microns to 1 mm.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

The first dielectric material layers (290, 960, 970) may include first contact-level dielectric layers 290 embedding contact via structures and bit lines 982, first interconnect-level dielectric layers 960 that embed a subset of the first metal interconnect structures 980 located above the first contact-level dielectric layers 290, and a first bonding dielectric layer 970 that is formed above the first interconnect-level dielectric layer 960. The bit lines 982 are a subset of the first metal interconnect structures 980 and may electrically contact drain regions located above the semiconductor channel at the top of the memory opening fill structures 58. The contact via structures contact various nodes of the first semiconductor devices. Interconnect metal lines and interconnect metal via structures, which are subsets of the first metal interconnect structures 980) may be embedded in the first interconnect-level dielectric layers 960. The first metal interconnect structures 980 may be located within the first interconnect-level dielectric layers 960 or within the first bonding dielectric layer 970.

Each of the first contact-level dielectric layers 290 and the first interconnect-level dielectric layers 960 may include a dielectric material such as undoped silicate glass, a doped silicate glass, organosilicate glass, silicon nitride, a dielectric metal oxide, or a combination thereof. The first bonding dielectric layer 970 may include, and/or consist essentially of, a silicon oxide material such as undoped silicate glass (e.g., silicon oxide) or a doped silicate glass. The thickness of the first bonding dielectric layer 970 may be in a range from 100 nm to 3,000 nm, although lesser and greater thicknesses may also be employed. The first bonding dielectric layer 970 may have a planar top surface, which may be provided, for example, by a planarization process such as a chemical mechanical polishing (CMP) process. A topmost layer of the first interconnect-level dielectric layers 960 may be a dielectric diffusion barrier layer (not expressly shown), which may be a silicon nitride layer having a thickness in a range from 10 nm to 300 nm.

First bonding pads 988 are formed in the first bonding dielectric layer 970, for example, by forming pad cavities in the first bonding dielectric layer 970 and filling the pad cavities with at least one conductive material. Alternatively, the bonding pads 988 are formed on the first metal interconnect structures 980 first, followed by forming the first bonding dielectric layer 970 over and around the first bonding pads 988, followed by planarizing the first bonding dielectric layer 970 to expose the top surface of the first bonding pads 988. The at least one conductive material may be a metallic (i.e., metal or metal alloy) material that may be bonded to the same metallic material or to another metallic material by metal-to-metal or hybrid bonding. For example, each of the first bonding pads 988 may include an optional metallic barrier liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP.

Each of the first bonding pads 988 is surrounded by the first bonding dielectric layer 970 and contacts a respective underlying one of the first metal interconnect structures 980. Each of the first bonding pads 988 is electrically connected to a respective node of the first semiconductor devices 920.

Figure 2:
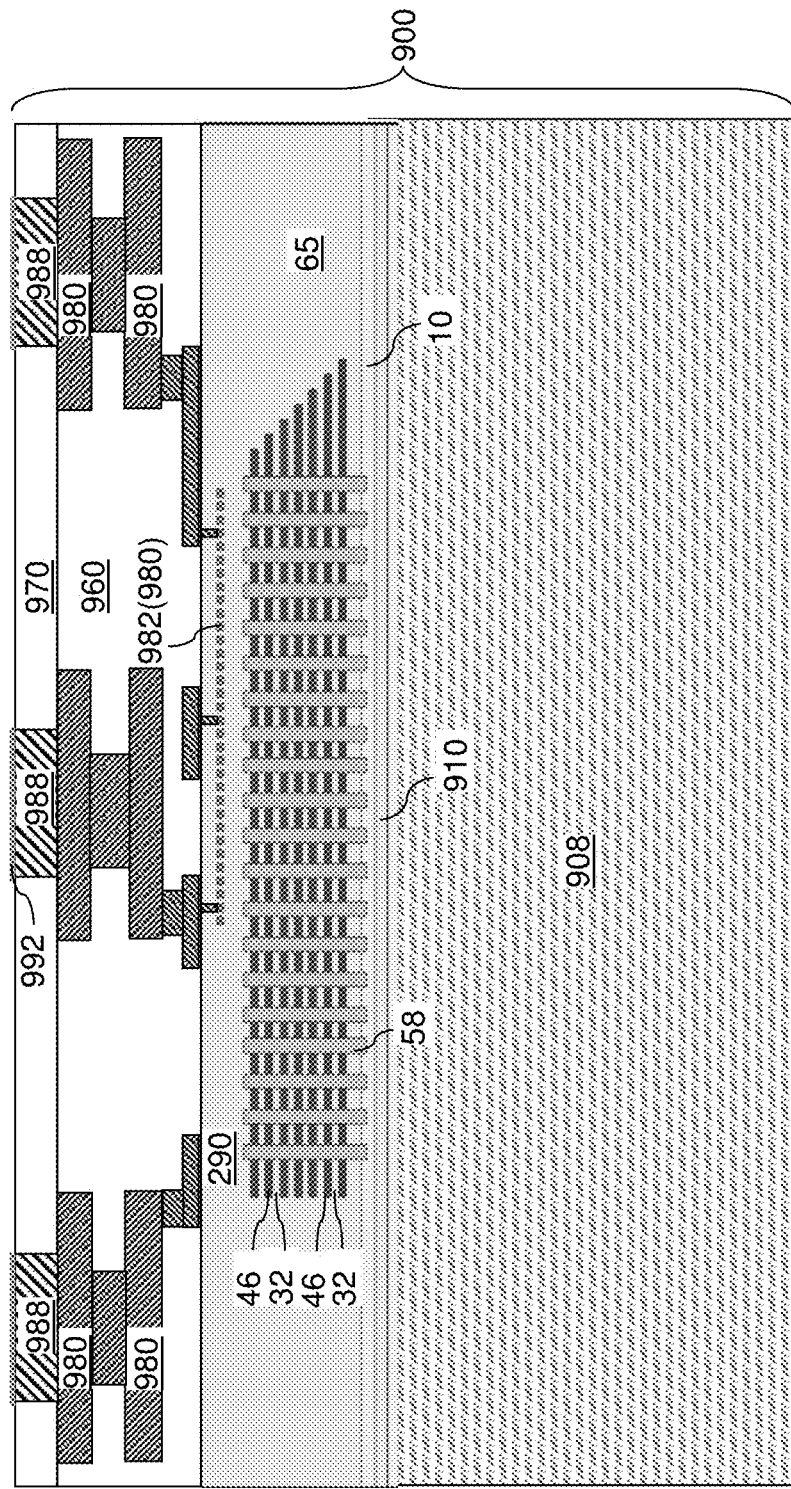
FIG. 2 is a schematic vertical cross-sectional view of the first semiconductor die after selective formation of a first carbon-based oxidation barrier layer according to the first embodiment of the present disclosure.

Referring to FIG. 2, a first oxidation barrier layer 992 may be formed on the physically exposed surfaces (e.g., top surface) of the first bonding pads 988. The first oxidation barrier layer 992 may be formed by any suitable deposition method on the exposed surfaces of the first bonding pads 988, such as by selective deposition, by lift-off or by non-selective deposition followed by patterning (e.g., photolithographic patterning and etching). The first oxidation barrier layer 992 comprises a material which prevents or reduces oxidation of the first bonding pads by at least 50%. In one embodiment, the oxidation barrier layer may comprise a first carbon-based oxidation barrier layer 992 which includes a first carbon-based oxidation barrier material. The first carbon-based oxidation barrier layer 992 is formed on the physically exposed surfaces of the first bonding pads 988 without forming the first carbon-based oxidation barrier material on the physically exposed surfaces of the first bonding dielectric layer 970. Thus, the first carbon-based oxidation barrier layer 992 may be formed as discrete material portions that are located on a top surface of a respective one of the first bonding pads 988.

As used herein, a carbon-based oxidation barrier material refers to a material that may function as an oxidation barrier for a metallic material and includes carbon atoms at a weight percentage greater than 50%. The carbon-based oxidation barrier material may include carbon atoms at a weight percentage in a range from 50% to 100%, such as from 80% to 99%. The carbon-based oxidation barrier material may consist essentially of carbon, or may include non-carbon atoms. The first carbon-based oxidation barrier layer 992 may be an electrically conductive material, such as graphene or metallic carbon nanotubes. Alternatively, the first carbon-based oxidation barrier layer 992 may be an electrically insulating material which has a sufficiently small thickness which does not substantially increase the resistivity of the interface of the bonding pads after bonding. The first carbon-based oxidation barrier layer 992 may have a thickness in a range from 0.3 nm to 3 nm, although a greater thickness may also be used.

In one embodiment, the first carbon-based oxidation barrier layer 992 may comprise a material consisting essentially of carbon. For example, the first carbon-based oxidation barrier layer 992 may comprise amorphous carbon, diamond-like carbon, graphene, or carbon nanotubes. The carbon atoms of the first carbon-based oxidation barrier material may combine with residual oxygen atoms on, or in, the first bonding pads 988 and second bonding pads of a second semiconductor die to which the first bonding pads 988 are bonded during a subsequent anneal process. The first carbon-based oxidation barrier layer 992 may be formed by a selective chemical vapor deposition process that nucleates the first carbon-based oxidation barrier material on the physically exposed surfaces of the first bonding pads 988 without nucleating the first carbon-based oxidation barrier material on the physically exposed surfaces of the first bonding dielectric layer 970. During the selective chemical vapor deposition (CVD) process, structures formed by assembly of carbon atoms may nucleate only on the metallic surfaces of the first bonding pads 988, and do not nucleate on the physically exposed surfaces of the first bonding dielectric layer 970, thereby forming the first carbon-based oxidation barrier layer 992 only on the physically exposed surfaces of the first bonding pads 988. The selective chemical vapor deposition process may be a thermal chemical vapor deposition process, such as low pressure CVD (LPCVD) or may be a plasma enhanced chemical vapor deposition process (PECVD), such as electron cyclotron resonance CVD (ECR-CVD). For example, graphene may be selectively formed on copper using LPCVD or ECR-CVD.

In another embodiment, the first carbon-based oxidation barrier layer 992 may be formed by a coating process in which the first carbon-based oxidation barrier material is chemically bonded to the physically exposed surfaces of the first bonding pads 988 without attachment to the physically exposed surfaces of the first bonding dielectric layer 970. In one embodiment, the first carbon-based oxidation barrier layer 992 may include a monolayer of a self-assembly material (SAM). In one embodiment, the self-assembly material may include an alkane thiol precursor compound having a first end with affinity to a material of the first bonding pads 988 and without affinity to a material of the first bonding dielectric layer 970. Thus, the self-assembly material may be self-assembled onto the physically exposed surfaces of the first bonding pads 988 without being attached to the first bonding dielectric layer 970 by depositing a suspension containing the SAM precursors onto the first bonding pads 988 and the first bonding dielectric layer 970. In this case, the first carbon-based oxidation barrier material may decompose partially or completely during a subsequent anneal process in which the first bonding pads 988 are bonded to second bonding pads of a second semiconductor die.

Generally, the first carbon-based oxidation barrier layer 992 prevents or reduces surface oxidation of the material of the first bonding pads 988. By reducing the amount of oxygen incorporated into surface portions of the first bonding pads 988, the first bonding pads 988 may have a greater bonding strength upon bonding to second bonding pads of a second semiconductor die, and a lower resistivity interface between the first and second bonding pads.

Figure 3:
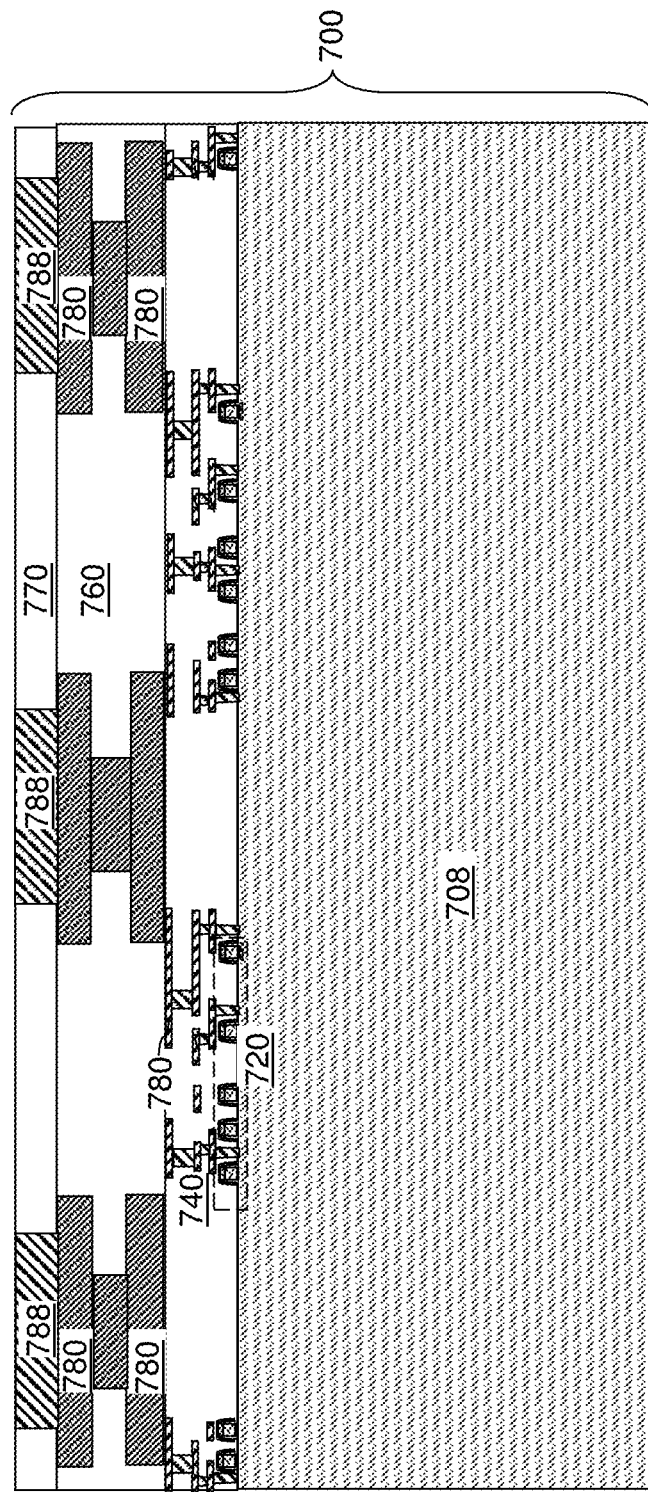
FIG. 3 is a schematic vertical cross-sectional view of a second semiconductor die according to the first embodiment of the present disclosure.

Referring to FIG. 3, a second semiconductor die 700 is illustrated. The second semiconductor die 700 includes a second substrate 708, second semiconductor devices 720 overlying the second substrate 708, second dielectric material layers (740, 760, 770) overlying the second semiconductor devices 720, and second metal interconnect structures 780 embedded in the second dielectric material layers (740, 760, 770). In one embodiment, the second semiconductor devices 720 may include at least one complementary metal oxide semiconductor (CMOS) circuitry including field effect transistors. In one embodiment, the second substrate 708 may be a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive lines 46), and bit lines 982, the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second dielectric material layers (740, 760, 770) may include proximal interconnect-level dielectric layers 740 embedding a proximal subset of the second metal interconnect structures 780 that is proximal to the second substrate 708, distal interconnect-level dielectric layers 760 embedding a distal subset of second metal interconnect structures 780 that is distal from the second substrate 708, and a second bonding dielectric layer 770 that is formed above the distal interconnect-level dielectric layers 760. The second metal interconnect structures 780 may be located within the proximal interconnect-level dielectric layer 740, within the distal interconnect-level dielectric layers 760, or within the second bonding dielectric layer 770.

The proximal interconnect-level dielectric layers 740 and the distal interconnect-level dielectric layers 760 may include a dielectric material such as undoped silicate glass (e.g., silicon oxide), a doped silicate glass, organosilicate glass, silicon nitride, a dielectric metal oxide, or a combination thereof. The second bonding dielectric layer 770 may include undoped silicate glass or a doped silicate glass (e.g., a doped or undoped silicon oxide material). The thickness of the second bonding dielectric layer 770 may be in a range from 100 nm to 3,000 nm, although lesser and greater thicknesses may also be employed. The second bonding dielectric layer 770 may have a planar top surface, which may be provided, for example, by a planarization process such as a chemical mechanical polishing (CMP) process.

Second bonding pads 788 are formed in the second bonding dielectric layer 770, for example, by forming pad cavities in the second bonding dielectric layer 770 and filling the pad cavities with at least one conductive material. Alternatively, the bonding pads 788 are formed on the second metal interconnect structures 780 first, followed by forming the second bonding dielectric layer 770 over and around the second bonding pads 788, followed by planarizing the second bonding dielectric layer 770 to expose the top surface of the second bonding pads 788. The at least one conductive material may be a metallic (i.e., metal or metal alloy) material that may be bonded to the same metallic material or to another metallic material by metal-to-metal or hybrid bonding. For example, each of the first bonding pads 988 may include an optional metallic barrier liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP. The material of the second bonding pads 788 may be the same as, or may be different from, the material of the first bonding pads 988.

Each of the second bonding pads 788 is embedded in the second bonding dielectric layer 770 and contacts a respective underlying one of the second metal interconnect structures 780. Each of the second bonding pads 788 is electrically connected to a respective node of the second semiconductor devices 720.

The types of devices of the first semiconductor die 900 and of the second semiconductor die 700 may be selected in any manner such that the devices 920 of the first semiconductor die 900 and the devices 720 of the second semiconductor die 700 may communicate with each other, and control, and or are controlled by, devices in the other semiconductor die. In one embodiment, one of the first semiconductor die 900 and the second semiconductor die 700 comprises a memory die including memory elements, such as a three-dimensional array of memory elements, and another of the first semiconductor die 900 and the second semiconductor die 700 comprises a logic die including peripheral circuitry configured to operate the memory elements, such as the three-dimensional array of memory elements.

Figure 4:
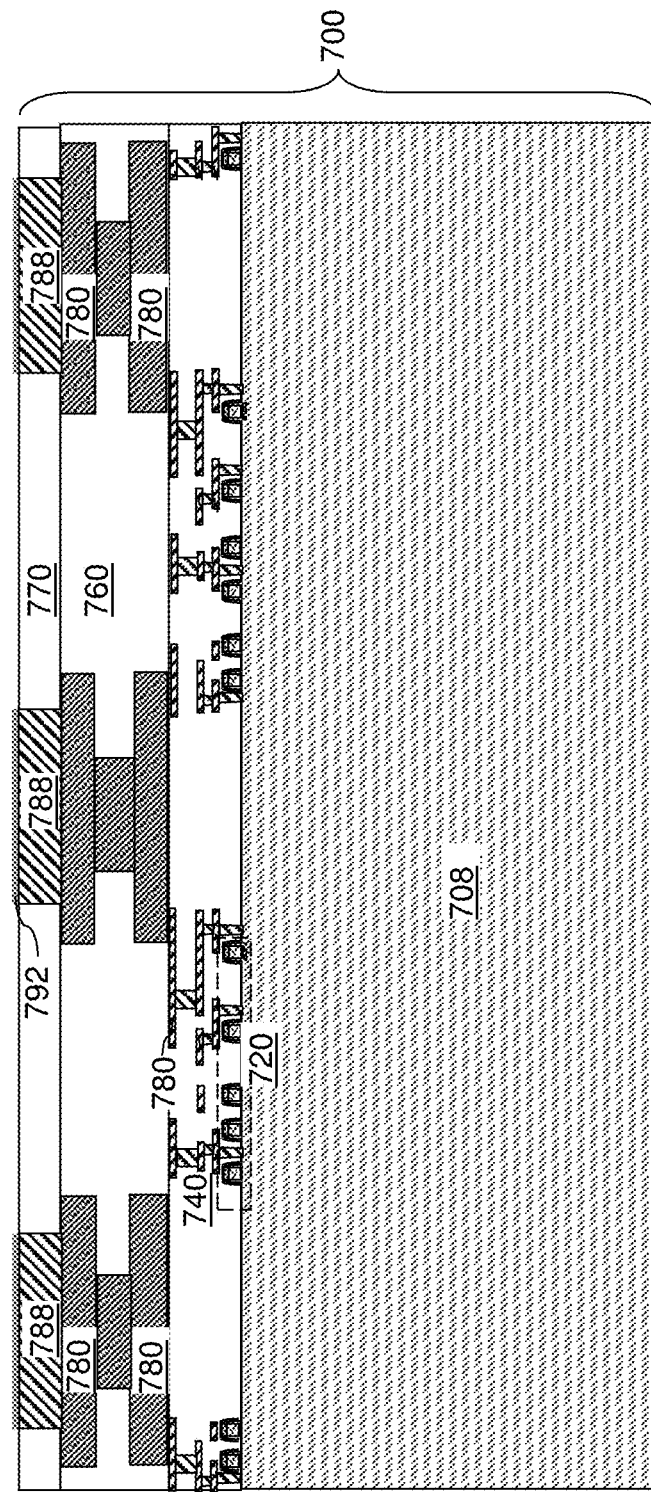
FIG. 4 is a schematic vertical cross-sectional view of the second semiconductor die after selective formation of a second carbon-based oxidation barrier layer according to the first embodiment of the present disclosure.

Referring to FIG. 4, a second oxidation barrier layer 792 may be optionally formed on the physically exposed surfaces (e.g., top surface) of the second bonding pads 788. The second oxidation barrier layer 792 (if present) may be the same as or different from the material of the first oxidation barrier layer 992. The second oxidation barrier layer 792 may be formed by any suitable deposition method on the exposed surfaces of the second bonding pads 788, such as by selective deposition, by lift-off or by non-selective deposition followed by patterning (e.g., photolithographic patterning and etching). The second oxidation barrier layer 792 comprises a material which prevents or reduces oxidation of the second bonding pads by at least 50%. In one embodiment, the second oxidation barrier layer may comprise a second carbon-based oxidation barrier layer 792 which includes a second carbon-based oxidation barrier material, as defined above with respect to the first carbon-based oxidation barrier layer 992. The second carbon-based oxidation barrier layer 792 is formed on the physically exposed surfaces of the second bonding pads 788 without forming the second carbon-based oxidation barrier material on the physically exposed surfaces of the second bonding dielectric layer 770. Thus, the second carbon-based oxidation barrier layer 792 may be formed as discrete material portions that are located on a top surface of a respective one of the second bonding pads 788. The second carbon-based oxidation barrier layer 792 may have a thickness in a range from 0.3 nm to 3 nm, although a greater thickness may also be used.

In one embodiment, the second carbon-based oxidation barrier layer 792 may comprise a material consisting essentially of carbon. For example, the second carbon-based oxidation barrier layer 792 may comprise amorphous carbon, diamond-like carbon, graphene, or carbon nanotubes. The carbon atoms of the second carbon-based oxidation barrier material may combine with residual oxygen atoms on, or in, the second bonding pads 788 and the first bonding pads 988 to which the second bonding pads 788 are bonded during a subsequent anneal process. The second carbon-based oxidation barrier layer 792 may be formed by a selective chemical vapor deposition process that nucleates the second carbon-based oxidation barrier material on the physically exposed surfaces of the second bonding pads 788 without nucleating the second carbon-based oxidation barrier material on the physically exposed surfaces of the second bonding dielectric layer 770. During the selective chemical vapor deposition (CVD) process, structures formed by assembly of carbon atoms may nucleate only on the metallic surfaces of the second bonding pads 788, and do not nucleate on the physically exposed surfaces of the second bonding dielectric layer 770, thereby forming the second carbon-based oxidation barrier layer 792 only on the physically exposed surfaces of the second bonding pads 792. The selective chemical vapor deposition process may be a thermal chemical vapor deposition process, or may be a plasma-assisted chemical vapor deposition process (PECVD), such as electron cyclotron resonance CVD (ECR-CVD). For example, graphene may be selectively formed on copper using LPCVD or ECR-CVD.

In another embodiment, the second carbon-based oxidation barrier layer 792 may be formed by a coating process in which the second carbon-based oxidation barrier material is chemically bonded to the physically exposed surfaces of the second bonding pads 788 without attachment to the physically exposed surfaces of the second bonding dielectric layer 770. In one embodiment, the second carbon-based oxidation barrier layer 792 may include a monolayer of a self-assembly material (SAM). In one embodiment, the self-assembly material may include an alkane thiol precursor compound having a first end with affinity to a material of the second bonding pads 788 and without affinity to a material of the second bonding dielectric layer 770. Thus, the self-assembly material may be self-assembled onto the physically exposed surfaces of the second bonding pads 788 without being attached to the second bonding dielectric layer 770

In one embodiment, the first carbon-based oxidation barrier layer 992 may include a first self-assembly material having a first end having a first head group attached to the first bonding pads 988, and a second end having a first terminal (i.e., tail) group. The second carbon-based oxidation barrier layer 792 may include a second self-assembly material having a first end having a second head group attached to the second bonding pads 788, and a second end having a second terminal (i.e., tail) group configured to chemically bond to the first terminal group of the first self-assembly material. The first head group may be the same as or different from the second head group. The first terminal group may be the same or different from the second terminal group. In one embodiment, the second carbon-based oxidation barrier material may decompose partially or completely during a subsequent anneal process in which the second bonding pads 788 are bonded to the first bonding pads 988 of the first semiconductor die 900.

Generally, the second carbon-based oxidation barrier layer 792 prevents or reduces surface oxidation of the material of the second bonding pads 788. By reducing the amount of oxygen incorporated into surface portions of the second bonding pads 788, the second bonding pads 788 may have a greater bonding strength upon bonding to the first bonding pads 988 of the first semiconductor die 900, and a lower resistivity interface between the first and second bonding pads.

Figure 5:
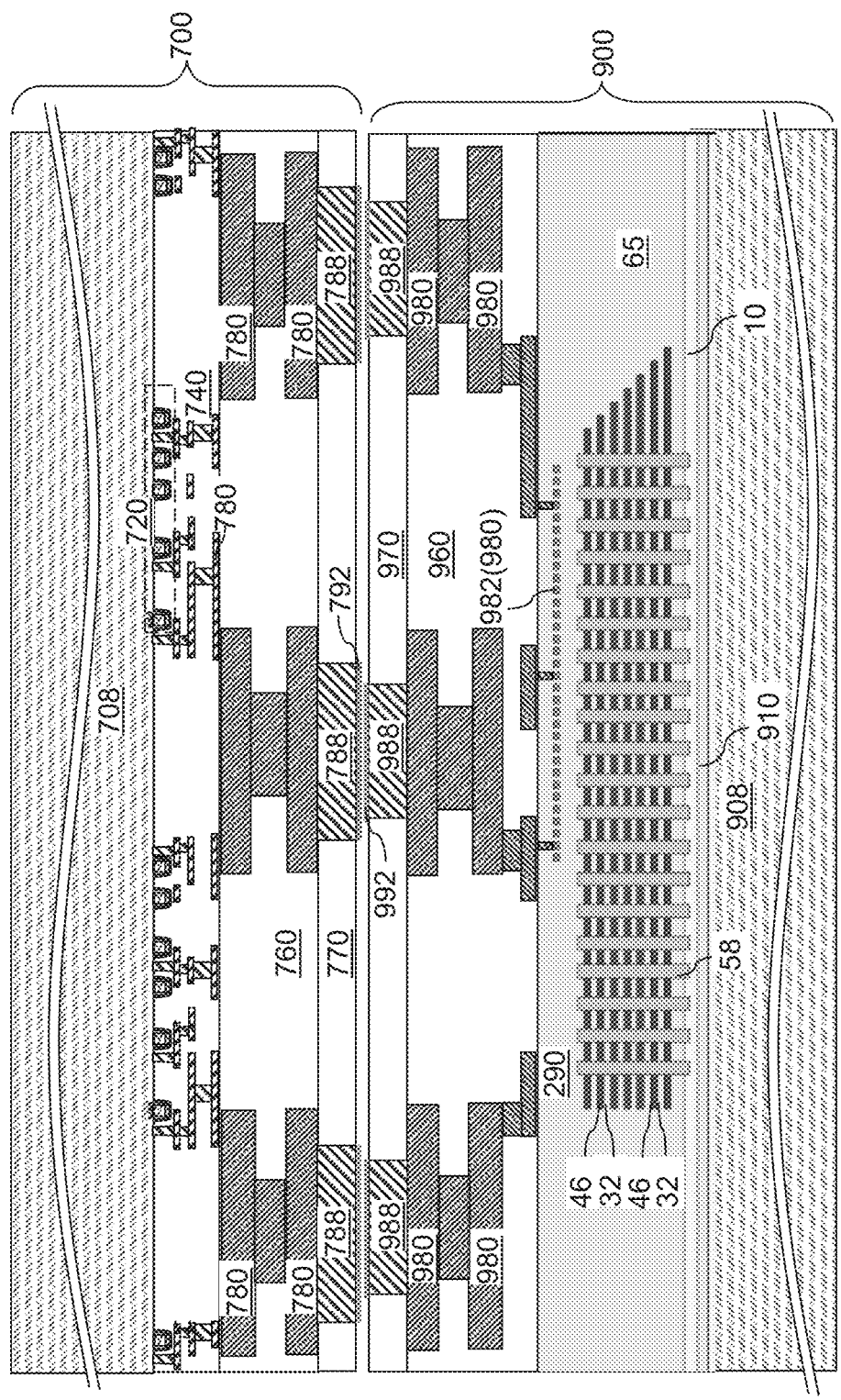
FIG. 5 is a schematic vertical cross-sectional view of a first exemplary structure including the first semiconductor die and the second semiconductor die after disposing the second bonding pads over the first bonding pads according to the first embodiment of the present disclosure.

Referring to FIG. 5, the first semiconductor die 900 and the second semiconductor die 700 are oriented such that the first bonding dielectric layer 970 faces the second bonding dielectric layer 770. The second semiconductor die 700 and the first semiconductor die 900 are brought into contact such that a surface of the second dielectric material layers (740, 760, 770) (such as a surface of the second bonding dielectric layer 770) contacts a surface of the first dielectric material layers (290, 960, 970) (such as a surface of the first bonding dielectric layer 970). The first semiconductor die 900 and the second semiconductor die 700 may be laterally aligned such that each second bonding pad 788 faces a respective one of the first bonding pads 988. In one embodiment, the pattern of the second bonding pads 788 may be a mirror image of the pattern of the first bonding pads 988 with optional differences in the size of bonding pads between the first semiconductor die 900 and the second semiconductor die 700. In one embodiment, the first bonding pads 988 and the corresponding second bonding pads 788 may have the same size (i.e., lateral width). In another embodiment, the first bonding pads 988 and the corresponding second bonding pads 788 may have different sizes. In one embodiment, areal overlap between each facing pair of a first bonding pad 988 and a second bonding pad 788 may be at least 80%, and/or at least 90%, such as 90 to 100%, of the area of the smaller one of the first bonding pad 988 and the second bonding pad 788.

Figure 6B:
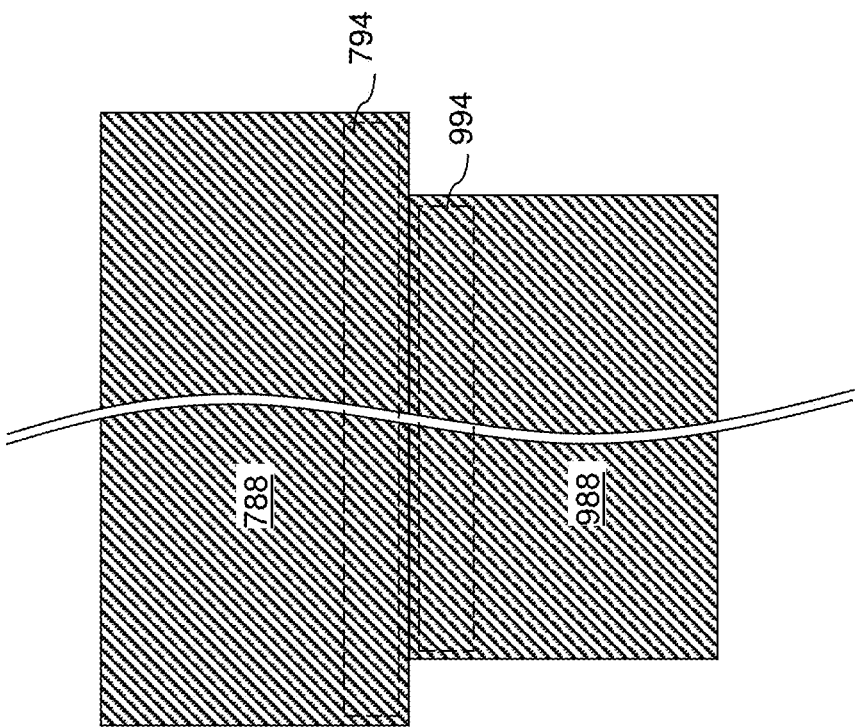
FIG. 6B is a magnified view of the mating pair of the first bonding pad and the second bonding pad in the first configuration after the second bonding pad is bonded to the first bonding pad.
Figure 6A:
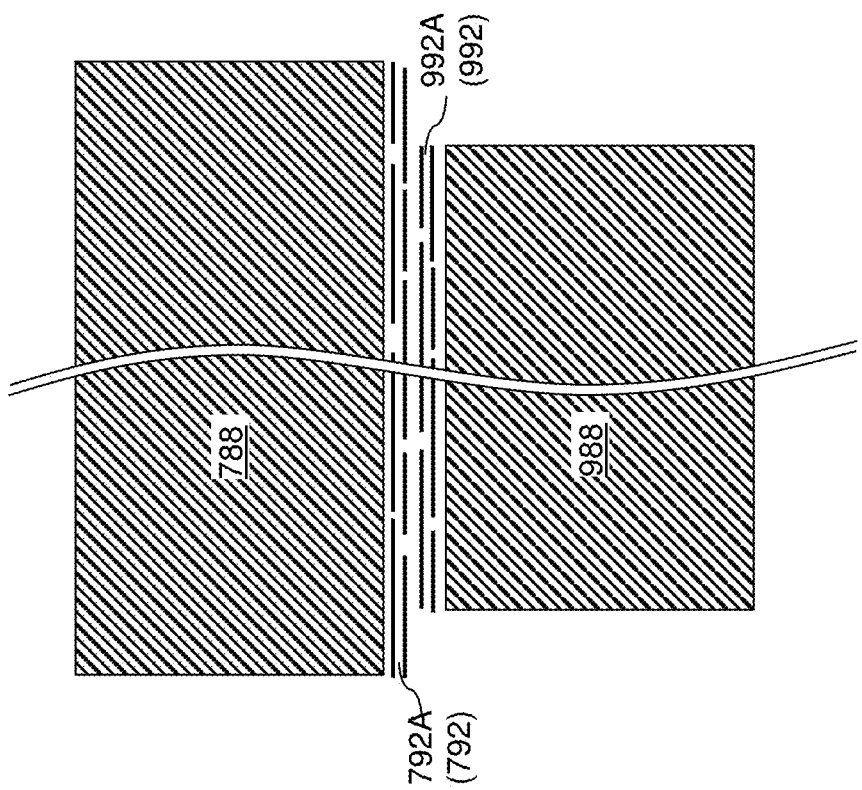
FIG. 6A is a magnified view of a mating pair of a first bonding pad and a second bonding pad at the processing step of FIG. 5 in a first configuration in which the first and second carbon-based oxidation barrier layers comprise a two-dimensional carbon-containing material.

Referring to FIG. 6A, a magnified view of a mating pair of a first bonding pad 988 and a corresponding second bonding pad 788 is shown at the processing step of FIG. 5 in a first configuration, in which the first and second carbon-based oxidation barrier layers (992, 792) comprise a two-dimensional carbon-containing material. In this case, each portion of the first carbon-based oxidation barrier layer 992 may be a portion of a first two-dimensional carbon-containing material layer 992A having a thickness in a range from 0.3 nm to 3 nm, consisting essentially of carbon, and including material selected from amorphous carbon, diamond-like carbon, graphene, and carbon nanotubes. Each portion of the second carbon-based oxidation barrier layer 792 may be a portion of a second two-dimensional carbon-containing material layer 792A having a thickness in a range from 0.3 nm to 3 nm, consisting essentially of carbon, and including material selected from amorphous carbon, diamond-like carbon, graphene, and carbon nanotubes.

Referring to FIG. 6B, the second bonding pads 788 may be bonded to the first bonding pads 988 by performing an anneal process that induces metal-to-metal bonding between the second bonding pads 788 and the first bonding pads 988 and optionally dielectric bonding between the respective bonding dielectric layers 970 and 770. Generally, the second bonding pads 788 may be bonded to the first bonding pads 988 with at least the first carbon-based oxidation barrier layer 992 there between. In one embodiment, only the first carbon-based oxidation barrier layer 992 is present between a mating pair of a first bonding pad 988 and a second bonding pad 788. In another embodiment, the first carbon-based oxidation barrier layer 992 and the second carbon-based oxidation barrier layer 792 are present between a mating pair of a first bonding pad 988 and a second bonding pad 788. The first carbon-based oxidation barrier material and the second carbon-based oxidation barrier material, if present, may optionally diffuse into the first bonding pads 988 and the second bonding pads 788 during the bonding process, and/or the bonding pad metal, such as copper may diffuse into the first and/or second carbon-based oxidation barrier material.

The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius. Residual oxygen atoms on, or in, the first bonding pads 988 and the second bonding pads 788 may combine with the first and/or second carbon-based oxidation barrier material, such as graphene during the anneal. For example, the oxygen atoms may diffuse from the bonding pads through the graphene via Stone-Wales defects and form a carboxyl group on the graphene surface which may aid in the bonding process. The graphene may also improve the resistance and breakdown current density of copper in the bonding pads.

An optional first interfacial region 994 may be formed in a surface portion of each first bonding pad 988, and/or an optional second interfacial region 794 may be formed in a surface portion of each second bonding pad 788. Each interfacial region (994, 794) may include carbon atoms provided from the first carbon-based oxidation barrier layer 992 and the optional second carbon-based oxidation barrier layer 792. Each bonded pair of a first bonding pad 988 and a second bonding pad 788 may include a respective interfacial region (994, 794) that includes volumes that are within 10 nm from an interface between the first bonding pad 988 and the second bonding pad 788. In one embodiment, each interfacial region (994, 794) may have an average volume carbon density that is greater than $1.0 \times 10^{16}/cm^3$, such as $5 \times 10^{16}/cm^3$ to $1 \times 10^{22}/cm^3$.

In one embodiment, oxide-to-oxide bonding may optionally simultaneously occur between the first bonding dielectric layer 970 and the second bonding dielectric layer 770 during bonding of the second bonding pads 788 to the first bonding pads 988. In this hybrid bonding embodiment, the second bonding dielectric layer 770 may be bonded to the first bonding dielectric layer 970 during bonding of the second bonding pads 788 to the first bonding pads 988 via oxide-to-oxide bonding.

Figures 7A, 7B:
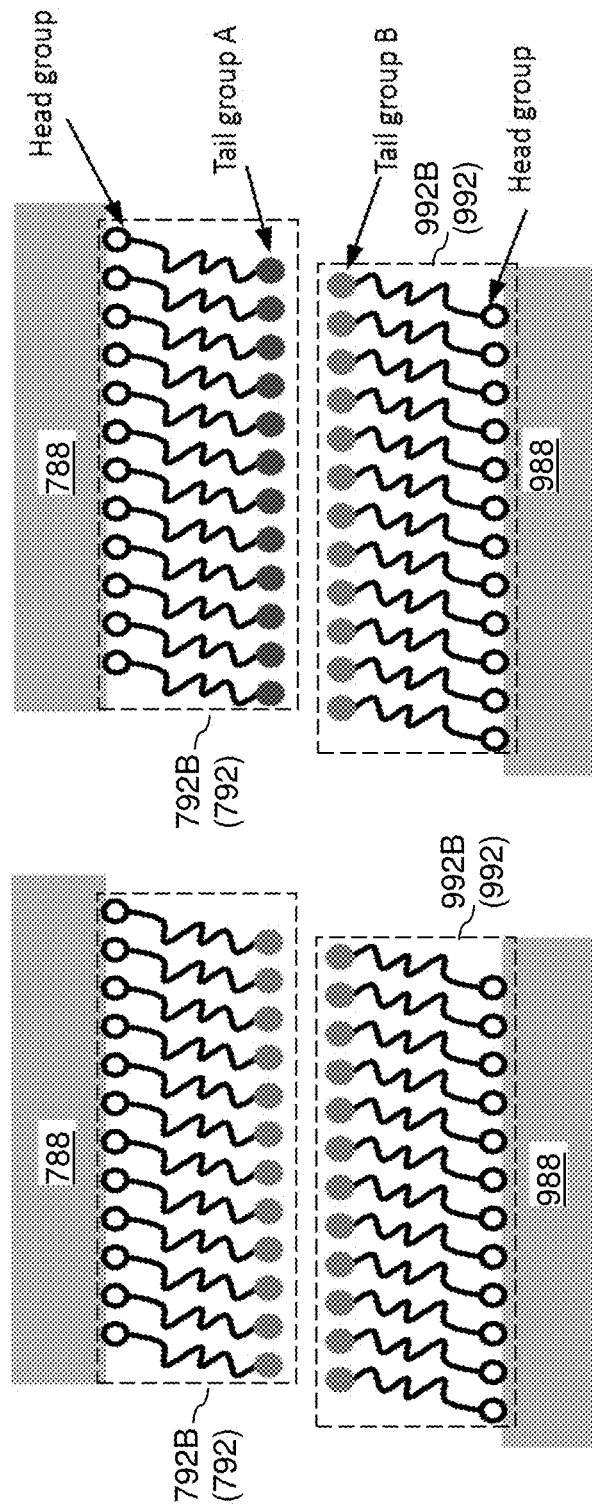
FIG. 7A is a magnified view of a mating pair of a first bonding pad and a second bonding pad at the processing step of FIG. 5 in a second configuration in which the first and second carbon-based oxidation barrier layers comprise self-assembly materials.
FIG. 7B is a magnified view of a mating pair of a first bonding pad and a second bonding pad at the processing step of FIG. 5 in a third configuration in which the first and second carbon-based oxidation barrier layers comprise self-assembly materials.

Referring to FIG. 7A, a magnified view of a mating pair of a first bonding pad 988 and a second bonding pad 788 is shown at the processing step of FIG. 5 in a second configuration, in which the first and second carbon-based oxidation barrier layers (922, 722) comprise self-assembly materials. In this case, each portion of the first carbon-based oxidation barrier layer 992 may be a portion of a first carbon-containing self-assembly material layer 992B formed by a coating process in which a first carbon-based oxidation barrier material is attached to the physically exposed surfaces of the first bonding pads 988 without attachment to the physically exposed surfaces of the first bonding dielectric layer 970. Likewise, each portion of the second carbon-based oxidation barrier layer 792 may be a portion of a second carbon-containing self-assembly material layer 792B formed by a coating process in which a second carbon-based oxidation barrier material is attached to the physically exposed surfaces of the second bonding pads 788 without attachment to the physically exposed surfaces of the second bonding dielectric layer 770. In one embodiment, each of the first carbon-containing self-assembly material layer 992B and the second carbon-containing self-assembly material layer 792B may include a monolayer of a self-assembly material (SAM), which may include an alkane compound having a first end with affinity to a material of the first bonding pads 988 or the second bonding pads 788 and without affinity to a material of the first bonding dielectric layer 970 or the second bonding dielectric layer 770. In one embodiment, each of the first carbon-containing self-assembly material layer 992B and the second carbon-containing self-assembly material layer 792B may include carbon atoms at a weight percentage greater than 50%.

In one embodiment, the first carbon-containing self-assembly material layer 992B and the second carbon-containing self-assembly material layer 792B may include a monolayer of an alkane thiol having a chemical formula of $CH_3(CH_2)_{n-1}SH$.

Referring to FIG. 7B, a magnified view of a mating pair of a first bonding pad 988 and a second bonding pad 788 is shown at the processing step of FIG. 5 in a third configuration. The first and second carbon-based oxidation barrier layers (992, 792) comprise self-assembly materials as in the second configuration illustrated in FIG. 7A. In this case, the first carbon-containing self-assembly material layer 992B may include a monolayer of a first self-assembly material. The first self-assembly material may include an alkane compound having a first end (i.e., a first head group) with affinity to a material of the first bonding pads 988 and without affinity to the material of the first bonding dielectric layer 970 and having a second end (i.e., a first tail group). The second carbon-containing self-assembly material layer 792B may include a monolayer of a second self-assembly material. The second self-assembly material may include an alkane compound having a first end (i.e., a second head group) with affinity to a material of the second bonding pads 788 and without affinity to the material of the second bonding dielectric layer 770 and having a second end (i.e., a second tail group). The second end (e.g., second tail group A) of the second self-assembly material may include a functional group that is selectively bonded to a functional group of the second end (e.g., the first tail group B) of the first self-assembly material. For example, a self-assembly material may include a thiol (e.g., sulfur containing) head group configured to bond to a copper bonding pad, a $CH_2$ backbone and a methyl ($CH_3$) or a hydroxide tail group configured to bind to another similar or different tail group of the corresponding SAM bonded to the opposing corresponding bonding pad. In this embodiment, the opposing SAMs (792B, 992B) function as adhesion layers which bond to each other and improve the adhesion between the opposing bonding pads.

Figure 7C:
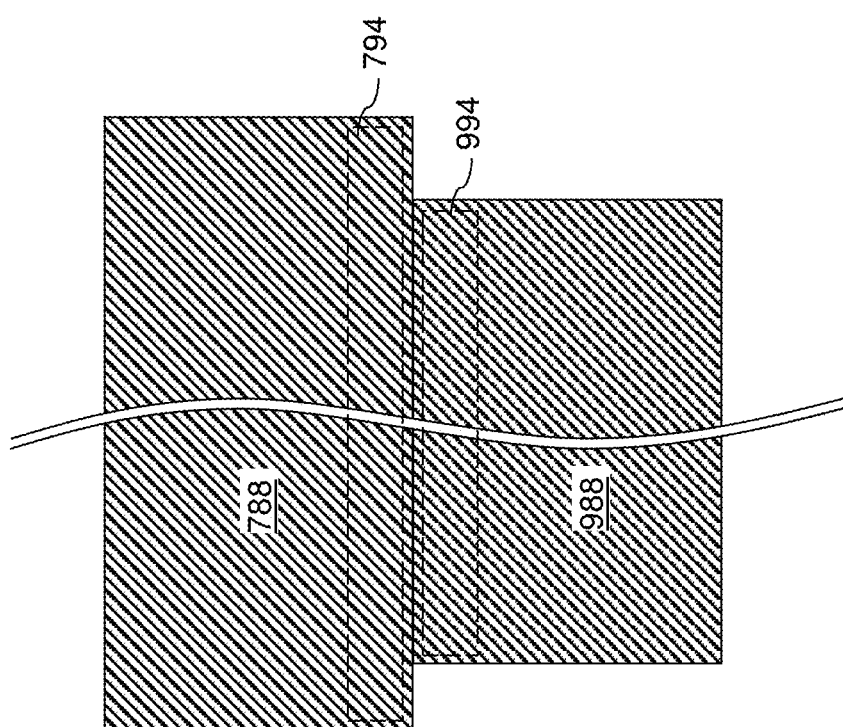
FIG. 7C is a magnified view of the mating pair of the first bonding pad and the second bonding pad in the second configuration or in the third configuration after the second bonding pad is bonded to the first bonding pad.

Referring to FIG. 7C, the second bonding pads 788 may be bonded to the first bonding pads 988 by performing an anneal process that induces metal-to-metal bonding between the second bonding pads 788 and the first bonding pads 988. The same processing steps may be used as the processing steps of FIG. 6B. The first carbon-based oxidation barrier layer 992 (comprising the first carbon-containing self-assembly material layer 992B) and the second carbon-based oxidation barrier layer 792 (comprising the second carbon-containing self-assembly material layer 792B) are present between a mating pair of a first bonding pad 988 and a second bonding pad 788. The first carbon-based oxidation barrier material and the second carbon-based oxidation barrier material may break apart into individual atoms and/or groups of atoms, and diffuse into the first bonding pads 988 and the second bonding pads 788 during the bonding process.

The carbon atoms, in combination with oxygen atoms and/or hydrogen atoms and/or additional atoms such as nitrogen and/or sulfur provided in the first and second carbon-containing self-assembly material layers (992B, 792B), or in an atomic form, are distributed in surface regions of the first bonding pads 988 and in surface regions of the second bonding pads 788. An optional first interfacial region 994 may be formed in a surface portion of each first bonding pad 988, and/or an optional second interfacial region 794 may be formed in a surface portion of each second bonding pad 788. Each interfacial region (994, 794) may include carbon atoms provided from the first carbon-based oxidation barrier layer 992 and the optional second carbon-based oxidation barrier layer 792. Each bonded pair of a first bonding pad 988 and a second bonding pad 788 includes a respective interfacial region (994, 794) that includes volumes that are within 10 nm from an interface between the first bonding pad 988 and the second bonding pad 788. In one embodiment, each interfacial region (994, 794) may have an average volume carbon density that is greater than $1.0 \times 10^{16}/cm^3$, such as $5 \times 10^{16}/cm^3$ to $1 \times 10^{22}/cm^3$. The SAMs may serve as adhesion layers that enhance the bond strength of the bonding pads to the bonding dielectric layer of the opposing die if the size and/or relative position of the pair of corresponding bonding pads are different or offset. The SAMs may prevent or reduce metal (e.g., copper) diffusion from the bonding pads into the bonding dielectric layer of the opposing die if the size and/or relative position of the pair of corresponding bonding pads are different or offset. The SAMs may also protect the bonding pads from oxidation and contamination.

In one embodiment, oxide-to-oxide bonding may simultaneously occur between the first bonding dielectric layer 970 and the second bonding dielectric layer 770 during bonding of the second bonding pads 788 to the first bonding pads 988. In this hybrid bonding case, the second bonding dielectric layer 770 may be bonded to the first bonding dielectric layer 970 during bonding of the second bonding pads 788 to the first bonding pads 988 via oxide-to-oxide bonding.

Figure 8:
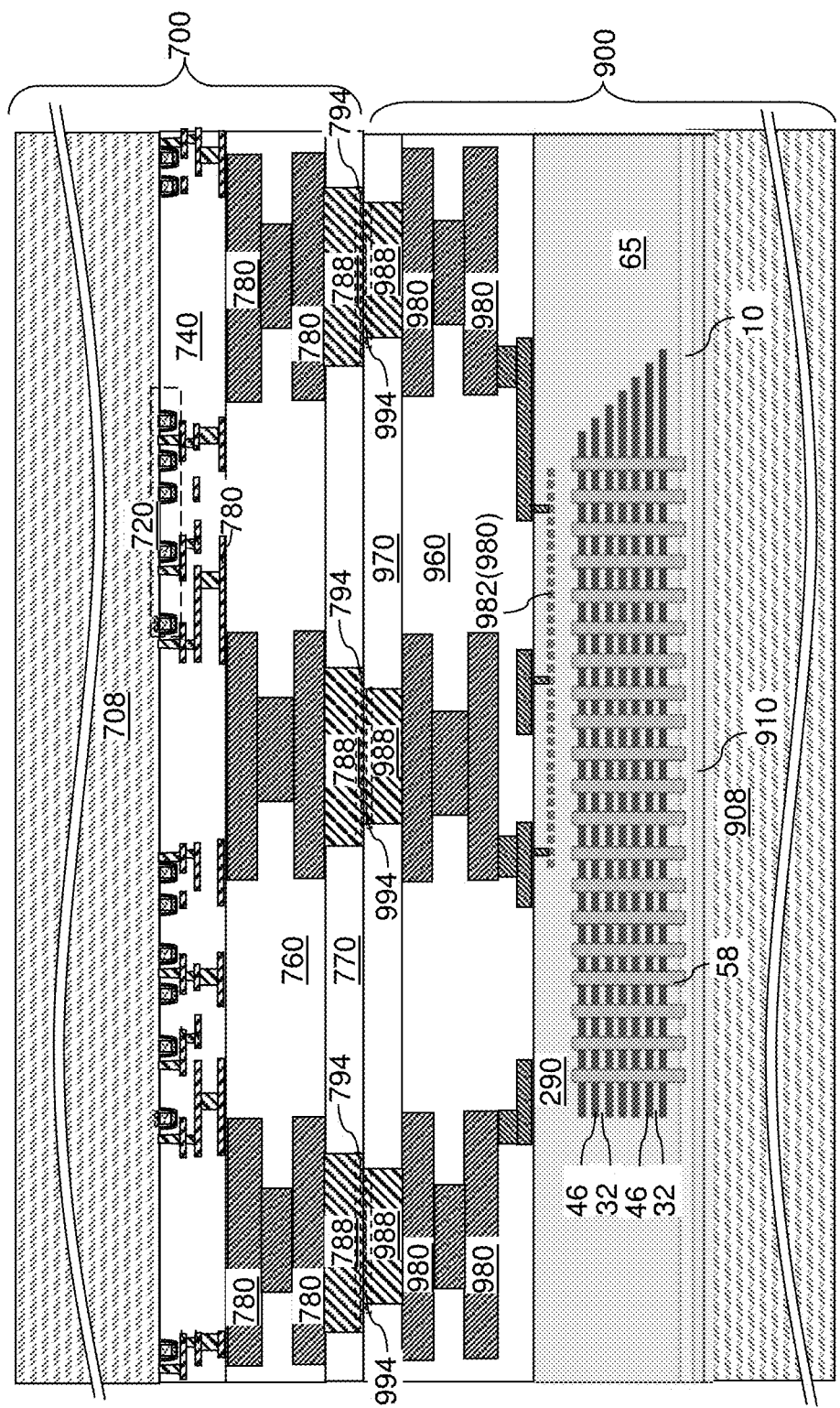
FIG. 8 is a schematic vertical cross-sectional view of the first exemplary structure at the processing step of FIG. 6B or FIG. 7C according to the first embodiment of the present disclosure.

Referring to FIG. 8, a bonded assembly including the first semiconductor die 900 and the second semiconductor die 700 is illustrated after the processing steps of FIG. 6B or after the processing steps of FIG. 7C. This completes the bonding process. Alternatively, additional process steps may be performed as described below with respect to FIG. 9.

Figure 9:
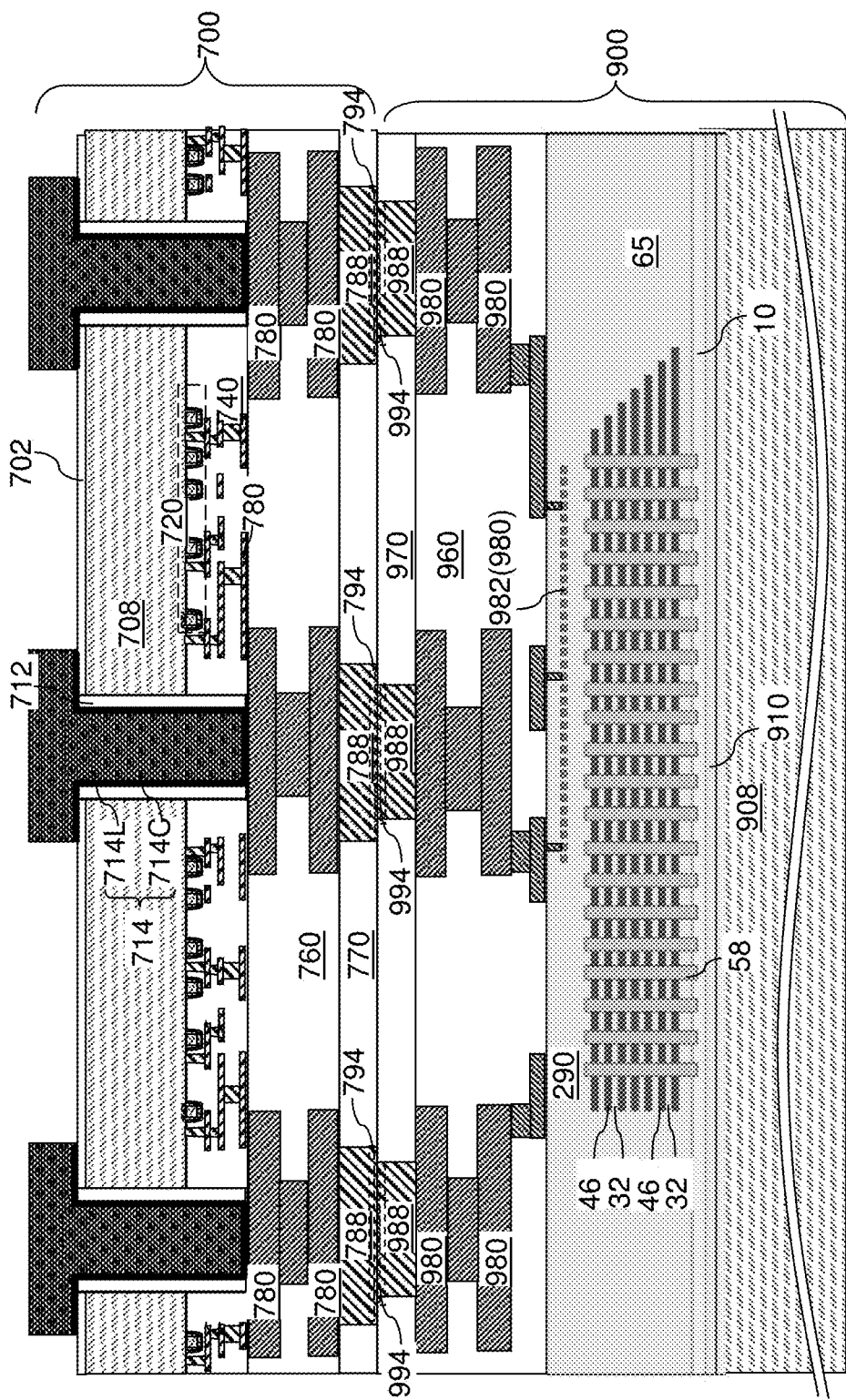
FIG. 9 is a schematic vertical cross-sectional view of the first exemplary structure after thinning the first substrate and forming through-substrate via structures through the first substrate according to the first embodiment of the present disclosure.

Referring to FIG. 9, optional through-substrate contact via structures 714 may be formed through the second substrate 708 or through the first substrate 908. The second substrate 708 (or the first substrate 908) may be thinned from the backside by grinding, polishing, an anisotropic etch, or an isotropic etch. A backside insulating layer 702 may be formed on the backside of the second substrate 708. A photoresist layer (not shown) may be applied on the backside of the second substrate 708, and may be lithographically patterned to form opening therethrough. The location of the openings through the patterned photoresist layer may be selected such that each opening through the photoresist layer is located entirely within the area of a respective one of the second metal interconnect structures 780.

An anisotropic etch process may be performed using the patterned photoresist layer as an etch mask layer. The anisotropic etch process may etch through unmasked regions of the second substrate 708 and through the proximal interconnect-level dielectric material layers 740. The etch chemistries of the various steps of the anisotropic etch process may be selected to etch through the various unmasked material portions, and the terminal step of the anisotropic etch process may include an etch chemistry that anisotropically etches one of the proximal interconnect-level dielectric material layers 740 selective to the metallic material of the second metal interconnect structures.

Via cavities extending at least through the second substrate 708 and the proximal interconnect-level dielectric material layers 740 may be formed. The via cavities are herein referred to as through-substrate via cavities. Each of the through-substrate via cavities may include a respective vertical or substantially vertical sidewall, and vertically extends from the backside surface of the second substrate 708 to a proximal surface of a respective one of the second metal interconnect structures 780, which may be a metal pad. Thus, a proximal surface of a second metal interconnect structure 780 (such as a proximal surface of a bonding pad) is physically exposed at the bottom of each through-substrate via cavity.

At least one electrically conductive material such as at least one metallic material may be deposited in the through-substrate via cavities. The at least one conductive material may include, for example, a metallic barrier liner material such as TiN, TaN, and/or WN, and a metallic fill material such as W, Co, Cu, Ru, and/or Mo. The at least one conductive material may be deposited by physical vapor deposition or chemical vapor deposition or atomic layer deposition or electrochemical deposition or electro-less deposition or combinations thereof. The at least one conductive material may be patterned into discrete portions to provide through-substrate via structures 714. The upper portion of each through-substrate via structure 714 that protrudes above the backside insulating layer 702 includes a metallic pad structure, which may be used as an external bonding pad. Each through-substrate via structure 714 may include a metallic barrier liner 714L and a metallic fill material portion 714C.

Referring to FIGS. 1-9 and according to various embodiments of the present disclosure, a bonded assembly is provided, which comprises: a first semiconductor die 900 comprising a first substrate 908, first semiconductor devices 920, and first bonding pads 988 that are electrically connected to a respective node of the first semiconductor devices 920, and a second semiconductor die 700 comprising a second substrate 708, second semiconductor devices 720, and second bonding pads 788 that are electrically connected to a respective node of the second semiconductor devices. Each of the second bonding pads 788 is bonded to a respective one of the first bonding pads 988. Each bonded pair of a first bonding pad 988 and a second bonding pad 788 includes an interfacial region 994 and/or 794 that includes volumes that are within 10 nm from an interface between the first bonding pad 988 and the second bonding pad 788. Each interfacial region has an average volume carbon density that is greater than $1.0 \times 10^{16}/cm^3$.

In one embodiment, the first bonding pads 988 are located within a first bonding dielectric layer 970, the second bonding pads 788 are located within a second bonding dielectric layer 770, the first bonding dielectric layer 970 and the second bonding dielectric layer 770 comprise silicon oxide, and the second bonding dielectric layer 770 is bonded to the first bonding dielectric layer 970 via oxide-to-oxide bonding.

In one embodiment, if the first carbon-based oxidation barrier layer 992 and/or for the second carbon-based oxidation barrier layer 792 remain intact and do not entirely diffuse into the first and/or second bonding pads, then each interfacial region 994 and/or 794 contains a carbon containing layer 992 and/or 792.

In one embodiment, each interfacial region 994 and/or 794 may contain graphene or carbon nanotubes. In one embodiment, in case graphene or carbon nanotubes are provided in the first carbon-based oxidation barrier layer 992 and/or in the second carbon-based oxidation barrier layer 792, then the layers 992 and/or 792 may be disrupted during bonding to leave clusters of carbon atoms within the interfacial regions (994, 794). In one embodiment, at least 50% of all carbon atoms in each interfacial region (994, 794) is within a respective two-dimensional cluster of carbon atoms in which carbon atoms are bonded to each other in a hexagonal lattice structure (e.g., residual portion of graphene or clusters of carbon nanotubes).

In another embodiment, if the self-assembly material is provided in the first carbon-based oxidation barrier layer 992 and/or in the second carbon-based oxidation barrier layer 792, then each interfacial region may contain a least one of an alkane compound and/or a thiol compound if the SAM layers decompose during bonding. Hydrogen atoms and other atoms derived from the self-assembly material may be present in the interfacial regions (994, 794). In one embodiment, each interfacial region (994, 794) may have an average volume hydrogen density that is greater than $1.0 \times 10^{16}/cm^3$.

In one embodiment, the first semiconductor die 900 comprises first dielectric material layers (290, 860, 970) located on the first semiconductor devices and embedding first metal interconnect structures 980, the first bonding pads 988 are electrically connected to a respective one of the first metal interconnect structures 980, the second semiconductor die 700 comprises second dielectric material layers (740, 760, 770) located on the second semiconductor devices and embedding second metal interconnect structures 780, and the second bonding pads 788 are electrically connected to a respective one of the second metal interconnect structures 780.

In one embodiment, one of the first semiconductor die 900 and the second semiconductor die 700 comprises a memory die including a three-dimensional array of memory elements, and another one of the first semiconductor die and the second semiconductor die comprises a logic die including a peripheral circuitry configured to operate the three-dimensional array of memory elements.

The first carbon-based oxidation barrier layer 992 and/or for the second carbon-based oxidation barrier layer 792 may reduce oxidation of the first bonding pads 988 and/or the second bonding pads 788, thereby enhancing the bonding strength between the first bonding pads 988 and the second bonding pads 788. Further, reduction of oxygen density in the interfacial regions (994, 794) may reduce the interfacial resistance of the bonded pairs of a first bonding pad 988 and a second bonding pad 788, thereby improving current flow between the first semiconductor die 900 and the second semiconductor die 700.

Figure 10:
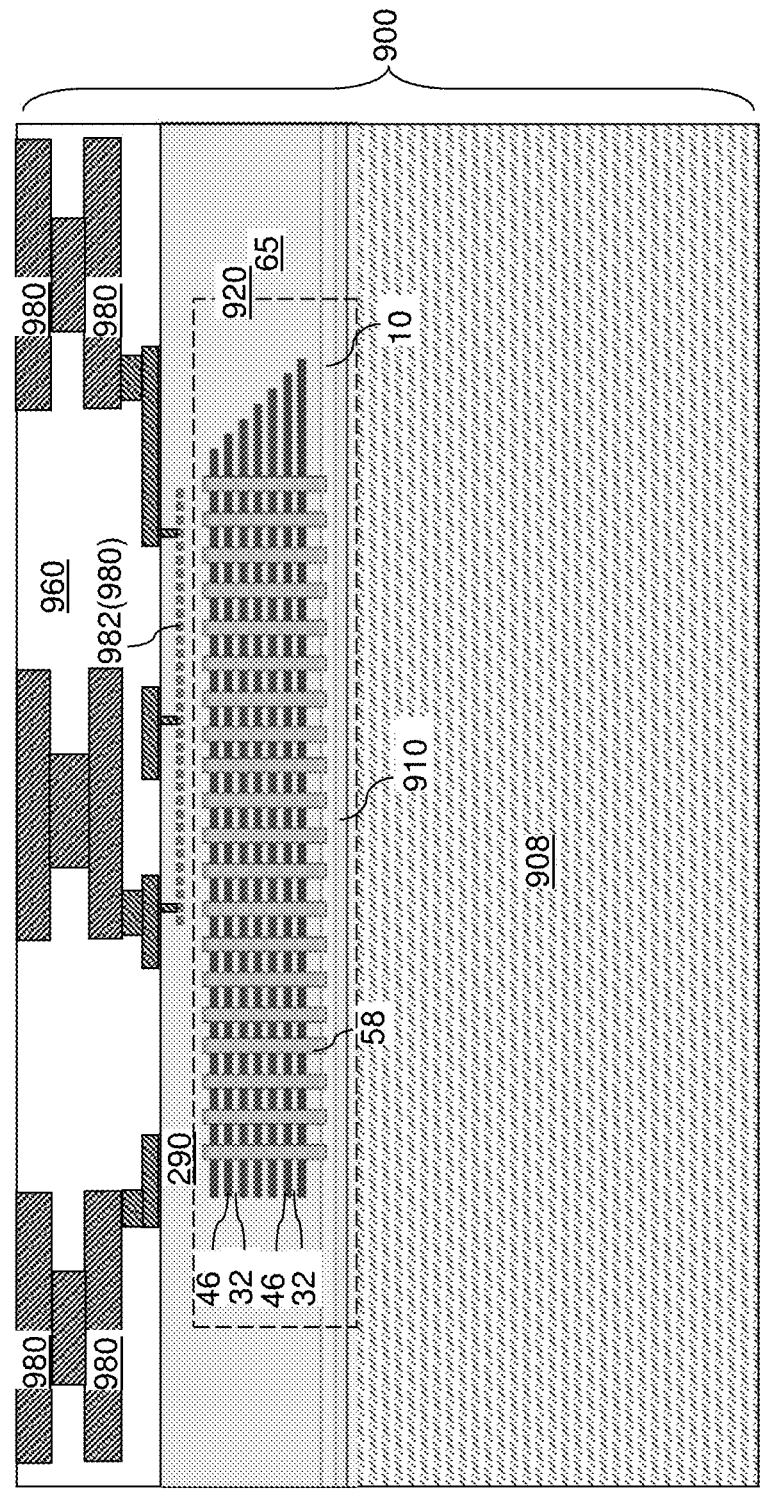
FIG. 10 is a schematic vertical cross-sectional view of a first semiconductor die after formation of first interconnect-level dielectric layers and first metal interconnect structures according to a second embodiment of the present disclosure.

Referring to FIG. 10, a first semiconductor die 900 according to a second embodiment of the present disclosure can be derived from the first semiconductor die 900 of FIG. 1 by omitting the processing steps for formation of the first bonding dielectric layer 970 and the first bonding pads 988. The top surface of the topmost layer of the first interconnect-level dielectric layers 960 and top surfaces of the topmost ones of the first metal interconnect structures 980 can be physically exposed.

Figure 11:
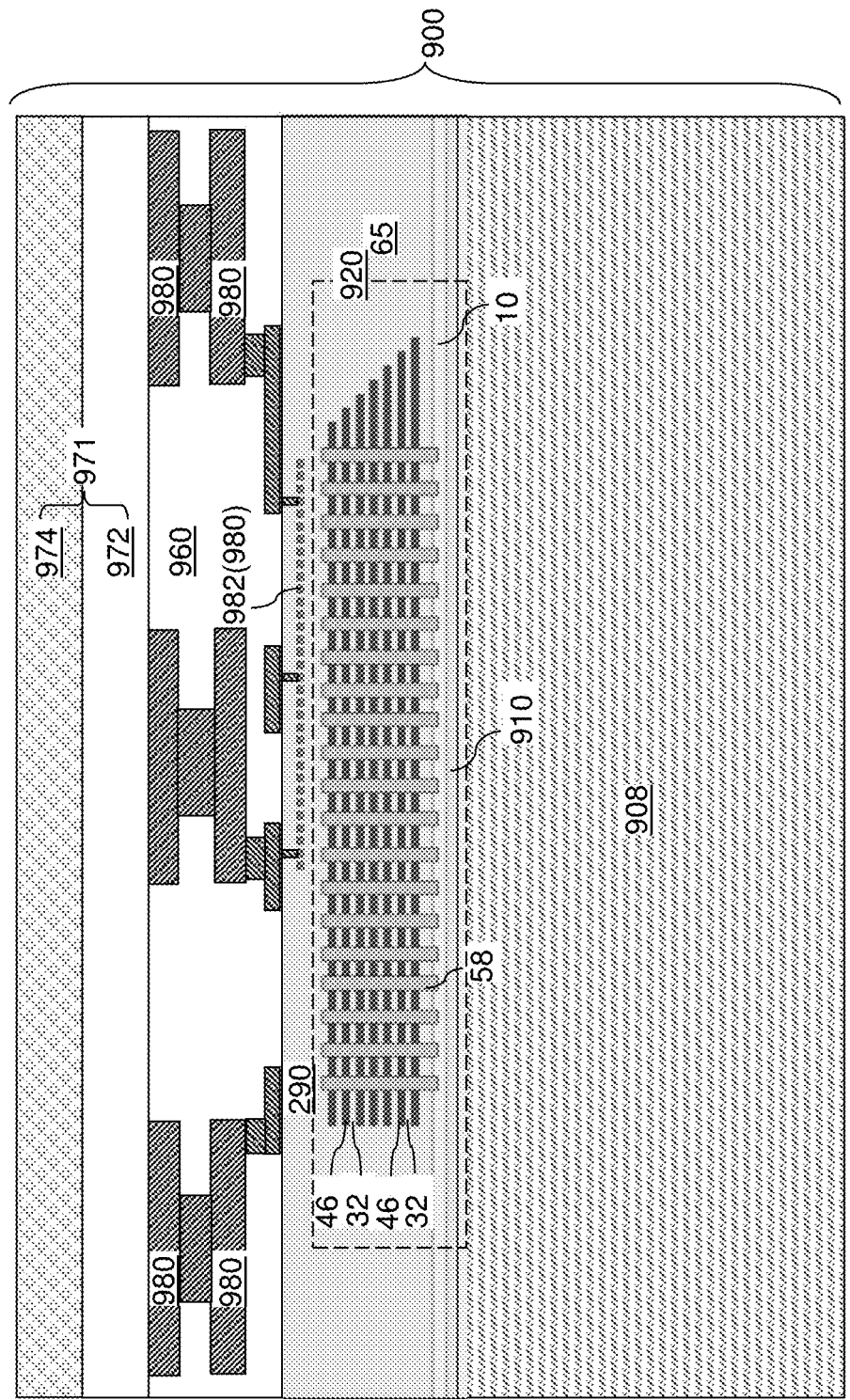
FIG. 11 is a schematic vertical cross-sectional view of the first semiconductor die after formation of a first pad-level silicon-containing dielectric layer and a first polymer material layer according to the second embodiment of the present disclosure.

Referring to FIG. 11, a first pad-level silicon-containing dielectric layer 972 and a first polymer material layer 974 can be sequentially deposited over the first interconnect-level dielectric layers 960 and the first metal interconnect structures 980. The first pad-level silicon-containing dielectric layer 972 and the first polymer material layer 974 are subsequently employed to embed first bonding pads, and as such, are collectively referred to as a first pad-level dielectric layer 971.

The first pad-level silicon-containing dielectric layer 972 includes a silicon-containing dielectric material such as silicon oxide, silicon nitride, silicon carbon nitride, silicon oxynitride, or any other dielectric material that includes silicon atoms at an atomic percentage greater than 10%. The first pad-level silicon-containing dielectric layer 972 can be deposited by chemical vapor deposition, spin coating, and/or physical vapor deposition, and may have a thickness in a range from 50 nm to 6,000 nm, such as from 100 nm to 3,000 nm, although lesser and greater thicknesses can also be employed.

The first polymer material layer 974 includes a first polymer material, which may be an organic polymer material or an inorganic polymer material. The first polymer material includes polymerized assembly of monomer units. In one embodiment, the first polymer material can include polynorbornene, polycarbonate, polyimide, polyaldehyde, or any other polymer material that can provide high adhesion strength. The first polymer material layer 974 may be formed, for example, by spin coating and curing. The thickness of the first polymer material layer 974 can be in a range from 200 nm to 6,000 nm, such as from 500 nm to 2,500 nm, although lesser and greater thicknesses can also be employed. The thickness of the first pad-level dielectric layer 971 can be in a range from 1,000 nm to 10,000 nm, although lesser and greater thicknesses can also be employed.

Figure 12:
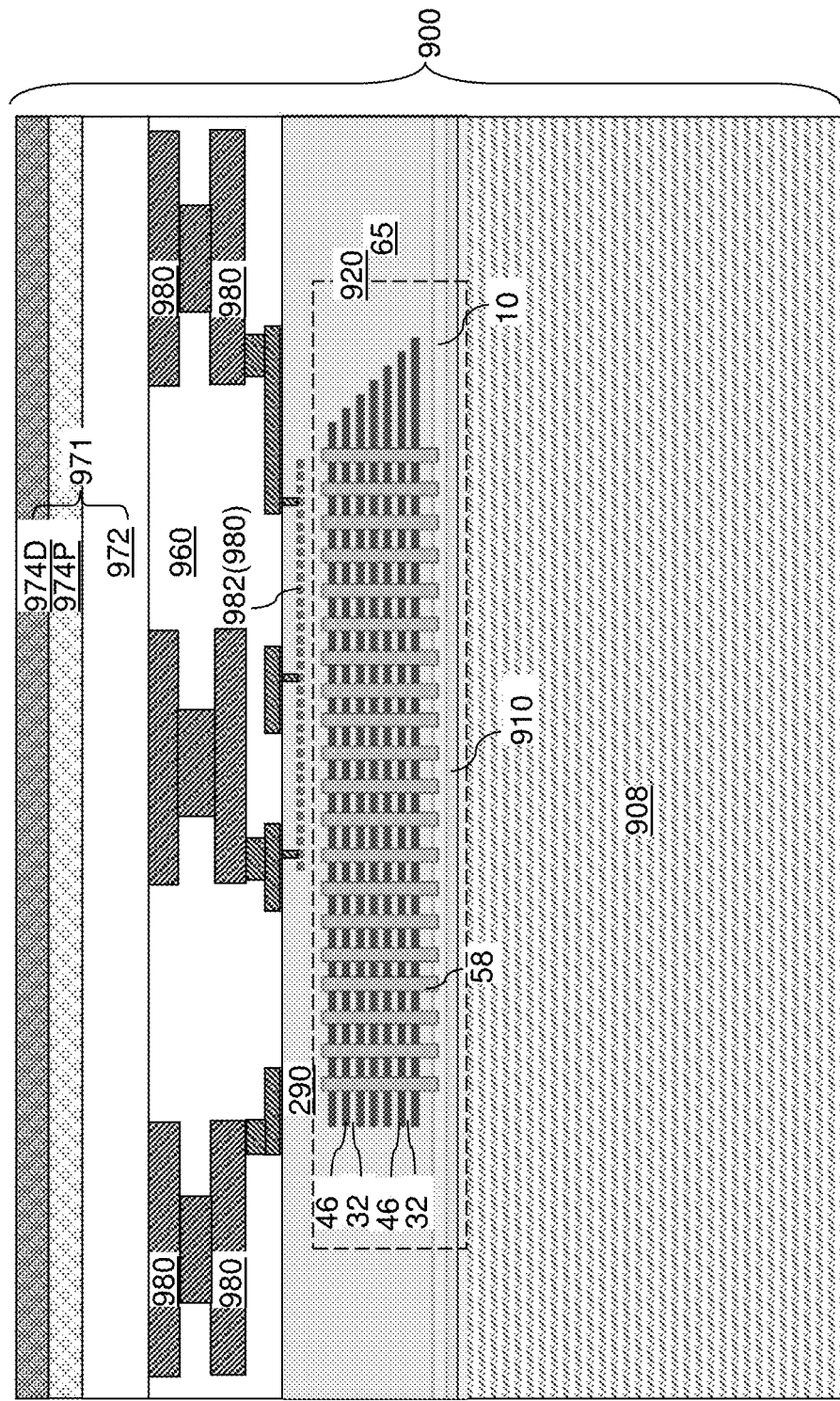
FIG. 12 is a schematic vertical cross-sectional view of the first semiconductor die after formation of a stack of a first proximal polymer material layer and a first distal polymer material layer by a first plasma treatment according to the second embodiment of the present disclosure.

Referring to FIG. 12, a first plasma treatment is performed on a surface portion of the first polymer material layer 974 with a first plasma. The first plasma treatment may be performed in a process chamber employing hydrogen plasma, helium plasma, neon plasma, argon plasma, nitrogen plasma, oxygen plasma, or a combination thereof. The type of plasma employed for the first plasma treatment process can be selected based on the type of the first polymer material such that the plasma-treated surface portion of the first polymer material layer 974 is converted into a plasma-modified polymer material. The plasma-treated portion of the first polymer material layer 974 is herein referred to as a first distal polymer material layer 974D, and the underlying untreated portion of the first polymer material layer 974 is herein referred to as a first proximal polymer material layer 974P. The first distal polymer material layer 974D is more distal from the first substrate 908 than the first proximal polymer material layer 974P is from the first substrate 908. The vertical stack of the first proximal polymer material layer 974P and the first distal polymer material layer 974D constitutes a first polymer material layer (974P, 974D). The thickness of the first distal polymer material layer 974D may be in a range from 1 nm to 200 nm, such as from 3 nm to 50 nm, although lesser and greater thicknesses can also be employed. The thickness of the first distal polymer material layer 974D can be optimized by adjusting the radio frequency (RF) power during the first plasma treatment process.

In one embodiment, the plasma-modified polymer material of the first distal polymer material layer 974D may have a greater hydrophilicity than the underlying portion of the first polymer material layer 974 (i.e., the first proximal polymer material layer 974P) that is not treated with the first plasma. In this embodiment, the increase in the hydrophilicity of the first distal polymer material layer 974D relative to the first proximal polymer material layer 974P causes the first distal polymer material layer 974D to have higher surface energy than the first proximal polymer material layer 974P. Further, the increase in the hydrophilicity of the first distal polymer material layer 974D relative to the first proximal polymer material layer 974P causes the first distal polymer material layer 974D to have a smaller contact angle than the first proximal polymer material layer 974P. In other words, the first plasma treatment causes the first distal polymer material layer 974D to be attached to a hydrophilic surface with greater adhesion strength in case such a hydrophilic surface contacts the first distal polymer material layer 974D. The structural modification by the first plasma within the first distal polymer material layer 974D may be vertically graded with a greater modification at the physically exposed surface of the first distal polymer material layer 974D than at the interface with the first proximal polymer material layer 974P. Thus, the increase in the hydrophilicity within the first distal polymer material layer 974D can be greater at the physically exposed surface of the first distal polymer material layer 974D than at the interface with the first proximal polymer material layer 974P.

In one embodiment, the first plasma increases bond scission on the polymer surface and formation of active sites. The active sites bond with other atoms or molecules in air (such as O and N) forming an increased density of the polar functional groups which increases the surface energy and hydrophilicity of the polymer. The increase in total surface energy is a result of an increase in the density of polar functional groups in the first polymer material in the first distal polymer material layer 974D. The first proximal polymer material layer 974P may be essentially free of the polar function groups, or may include the polar functional groups at a density that is lower than a density of the polar functional groups within the first distal polymer material layer 974D. In one embodiment, the polar function groups can comprise at least one of a carbonyl group, a carboxyl group, an amine group, an amide group, or a hydroxyl group. In one embodiment, the first distal polymer material layer 974D includes the polar functional groups at a distal functional group density, and the first proximal polymer material layer 974P can be essentially free of the polar function groups or can include the polar functional groups at a proximal functional group density that is lower than the distal functional group density.

In another embodiment, the first plasma increases a cross-linking density of the first polymer material in the first distal polymer material layer 974D, and the first distal polymer material layer 974D has a cross-linking density that is greater than a cross-linking density within the first proximal polymer material layer 974P.

Generally, the first distal polymer material layer 974D and the first proximal polymer material layer 974P can comprise polymers of a same monomer having different linking densities. The first proximal polymer material layer 974P has a first cross-linking density among monomer units therein, the first distal polymer material layer 974D has a second cross-linking density among monomer units therein, and the second cross-linking density is higher than the first cross-linking density. The increased cross-linking density leads to an increase in total surface energy, which is a result of an increase in its dispersive (non-polar) component.

Figure 13:
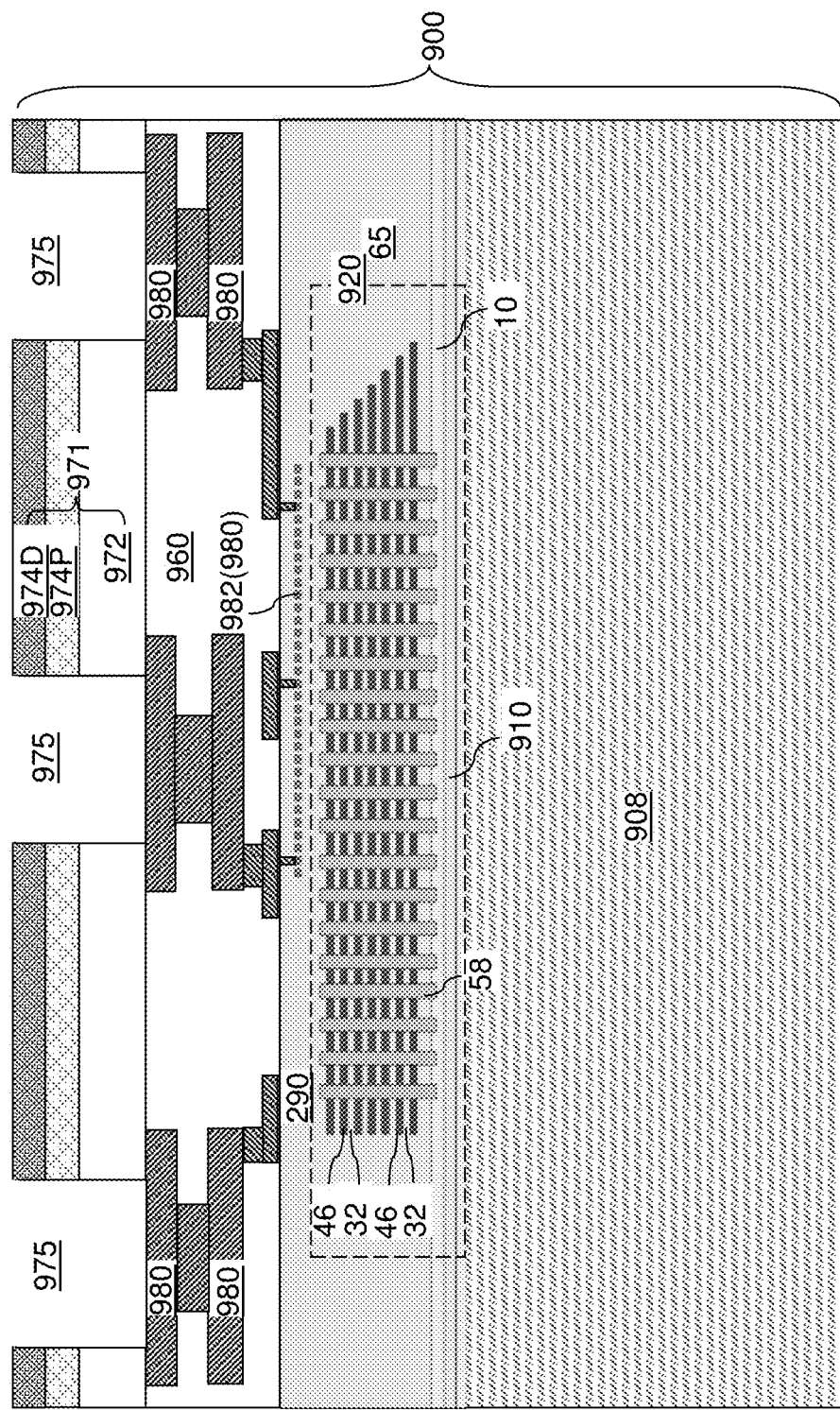
FIG. 13 is a schematic vertical cross-sectional view of the first semiconductor die after formation of first pad cavities according to the second embodiment of the present disclosure.

Referring to FIG. 13, a first photoresist layer (not shown) can be applied over the first distal polymer material layer 974D, and can be lithographically patterned to form an array of discrete openings in areas that overlie a respective one of the topmost ones of the first metal interconnect structures 980, i.e., a subset of the first metal interconnect structures 980 that is in contact with the bottom surface of the first pad-level silicon-containing dielectric layer 972. The openings in the photoresist layer can have the shapes of bonding pads to be subsequently formed. Each opening in the photoresist layer can have a horizontal cross-sectional shape of a polygon, a circle, an ellipse, or another two-dimensional curvilinear shape having a closed periphery. For example, the openings in the photoresist layer can have rectangular shapes. Each side of the rectangular shapes may have a lateral dimension in a range from 2 microns to 60 microns, such as from 5 micron to 30 microns, although lesser and greater lateral dimensions can also be employed. In case the first distal polymer material layer 974D and the first proximal polymer material layer 974P include a photosensitive material (such as polyimide), the first distal polymer material layer 974 can be directly lithographically patterned by lithographic exposure and patterning without use of the first photoresist layer.

An anisotropic etch process can be performed to transfer the pattern in the first photoresist layer through the first distal polymer material layer 974D, the first proximal polymer material layer 974P, and the first pad-level silicon-containing dielectric layer 972. First pad cavities 975 are formed through the first distal polymer material layer 974D, the first proximal polymer material layer 974P, and the first pad-level silicon-containing dielectric layer 972. A top surface of a respective topmost one of the first metal interconnect structures 980 is physically exposed at the bottom of each first pad cavity 975. The first photoresist layer can be subsequently removed, for example, by ashing. In case the first distal polymer material layer 974D and the first proximal polymer material layer 974P include a photosensitive material and are directly lithographically patterned, the anisotropic etch process can etch through the first pad-level silicon-containing dielectric layer 972 to form the first pad cavities 975.

Figure 14:
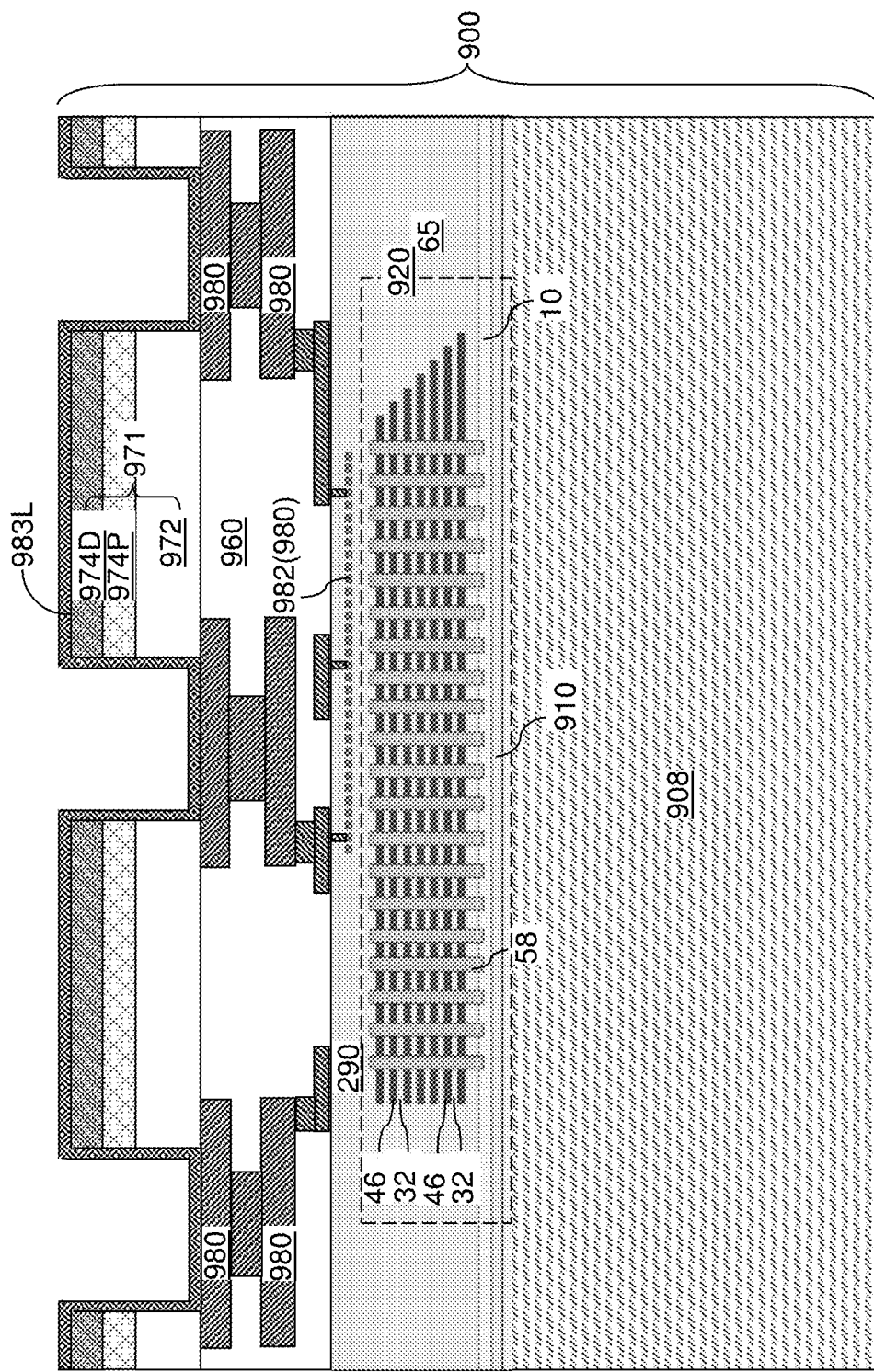
FIG. 14 is a schematic vertical cross-sectional view of the first semiconductor die after formation of a first metallic barrier liner layer according to the second embodiment of the present disclosure.

Referring to FIG. 14, a first metallic barrier liner layer 983L can be deposited by a conformal or a non-conformal deposition process. The first metallic barrier liner 983L includes a metallic barrier material that functions as a diffusion barrier material for metallic materials, moisture, and impurity atoms. For example, the first metallic barrier liner 983L can include TiN, TaN, WN, TiC, TaC, WC, or an alloy of a stack thereof. The first metallic barrier liner 983L may be deposited by physical vapor deposition and/or by chemical vapor deposition. The thickness of vertically-extending portions (or tapered portions) of the first metallic barrier liner layer 983L that are in contact with sidewalls of the first pad-level dielectric layer 971 can be in a range from 3 nm to 100 nm, such as from 6 nm to 50 nm, although lesser and greater thicknesses can also be employed.

Figure 15:
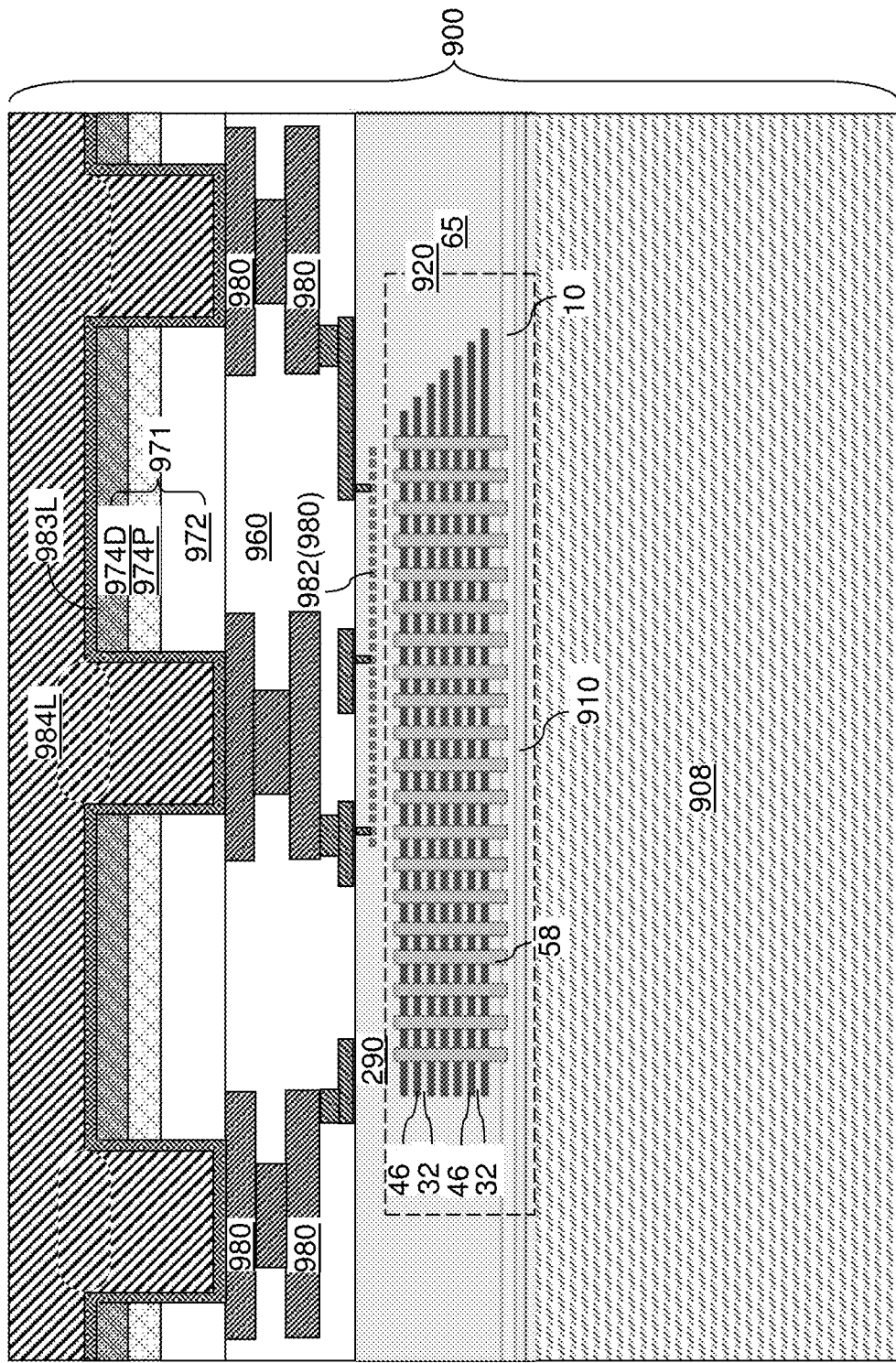
FIG. 15 is a schematic vertical cross-sectional view of the first semiconductor die after formation of a first metallic fill material layer according to the second embodiment of the present disclosure.

Referring to FIG. 15, a first metallic fill material layer 984L can be deposited on the first metallic barrier liner 983L. The first metallic fill material layer 984L includes a metallic material that can provide metal-to-metal bonding at an elevated temperature less than 500 degrees Celsius, such as less than 450 degrees Celsius. For example, the first metallic fill material layer 984L can include, and/or can consist essentially of, copper or a copper-containing metallic alloy material. The first metallic fill material layer 984L can be deposited by physical vapor deposition, chemical vapor deposition, electroplating, and/or electroless plating. For example, the first metallic fill material layer 984L can be formed by depositing a metal seed layer by physical vapor deposition, and electroplating an additional metal layer on the metal seed layer. The thickness of the first metallic fill material layer 984L can be selected such that all volumes of the first pad cavities 975 are filled with the metallic material(s) of the first metallic fill material layer 984L.

Figure 16:
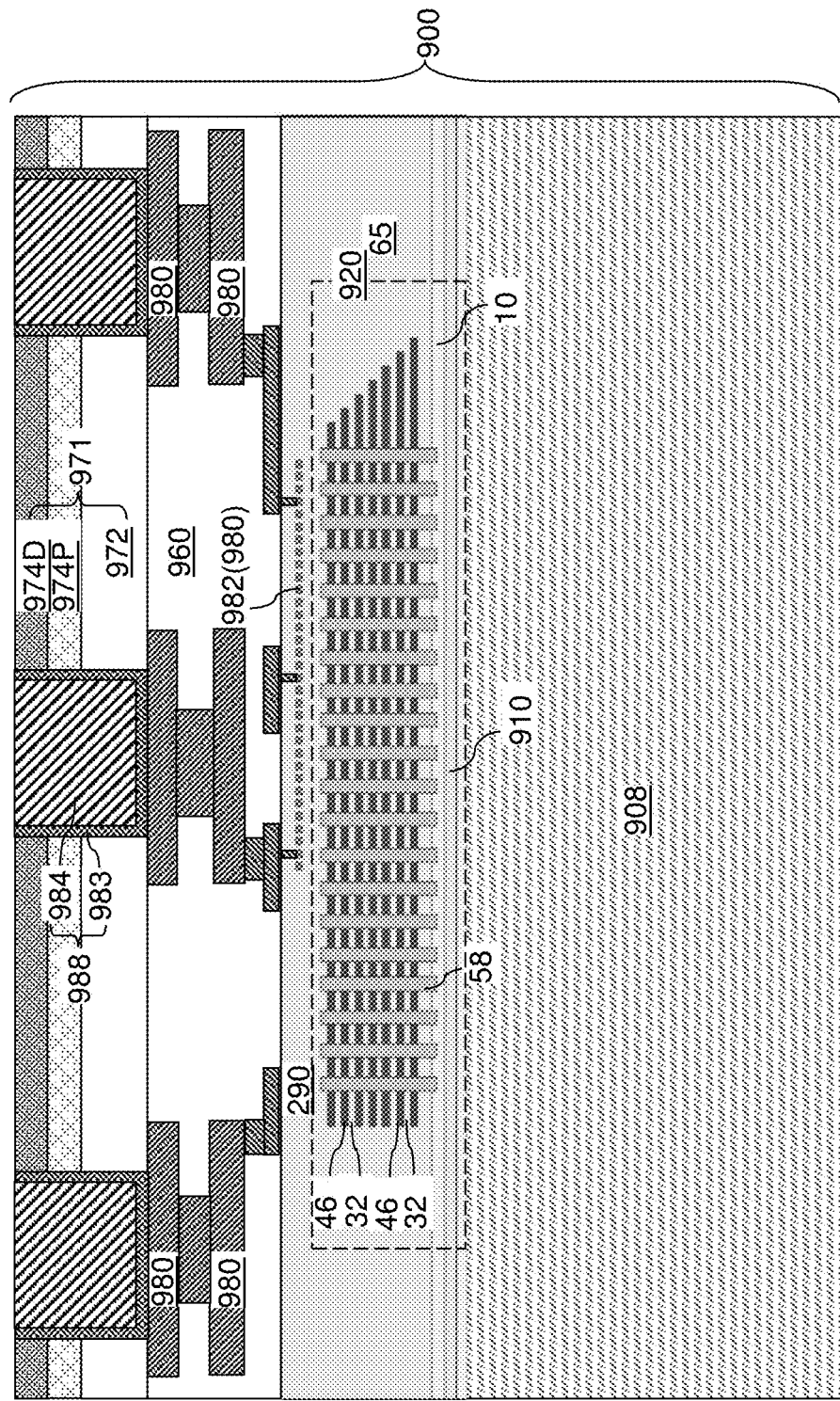
FIG. 16 is a schematic vertical cross-sectional view of the first semiconductor die after formation of first bonding pads according to the second embodiment of the present disclosure.

Referring to FIG. 16, a planarization process can be performed to remove portions of the first metallic fill material layer 984L and the first metallic barrier liner layer 983L from above the horizontal plane including the top surface of the first distal polymer material layer 974D. For example, a chemical mechanical planarization process can be performed to remove the portions of the first metallic fill material layer 984L and the first metallic barrier liner layer 983L that overlie the horizontal plane including the top surface of the first distal polymer material layer 974D. Each remaining portion of the first metallic fill material layer 984L in a respective first pad cavity 975 constitutes a first metallic fill material portion 984. Each remaining portion of the first metallic barrier liner layer 983L in a respective first pad cavity 975 constitutes a first metallic barrier liner 983. Each contiguous combination of a first metallic barrier liner 983 and a first metallic fill material portion 984 constitutes a first bonding pad 988, which fills a respective one of the first pad cavities 975.

Generally, the first semiconductor die 900 comprises a first substrate 908, first semiconductor devices 920, first bonding pads 988 that are electrically connected to a respective node of the first semiconductor devices 920 and laterally surrounded by a first pad-level dielectric layer 971. The first pad-level dielectric layer 971 can include a stack of a first pad-level silicon-containing dielectric layer 972, a first proximal polymer material layer 974P, and a first distal polymer material layer 974D.

Figure 17:
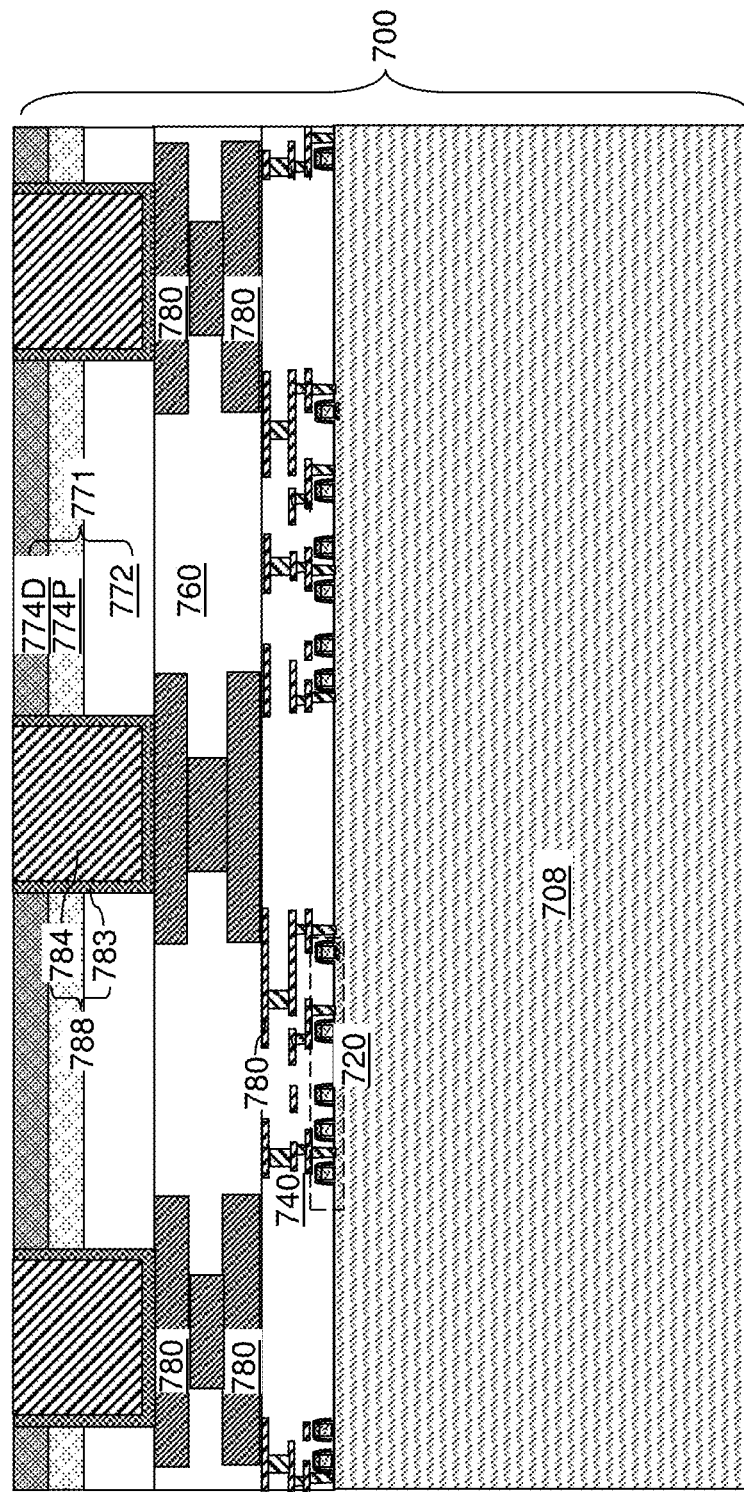
FIG. 17 is a schematic vertical cross-sectional view of a second semiconductor die according to the second embodiment of the present disclosure.

Referring to FIG. 17, a second semiconductor die 700 according to the second embodiment of the present disclosure can be derived from the second semiconductor die 700 of FIG. 3 by omitting the processing steps for formation of the second bonding dielectric layer 770 and the second bonding pads 788. The top surface of the topmost layer of the second interconnect-level dielectric layers 760 and top surfaces of the topmost ones of the second metal interconnect structures 780 can be physically exposed.

The processing steps of FIGS. 11-16 can be performed while making suitable modification to form the second semiconductor die 700 of FIG. 17. Specifically, a second pad-level silicon-containing dielectric layer 772 and a second polymer material layer can be sequentially deposited over the second interconnect-level dielectric layers 760 and the second metal interconnect structures 780. The second pad-level silicon-containing dielectric layer 772 and the second polymer material layer are subsequently employed to embed second bonding pads, and as such, are collectively referred to as a second pad-level dielectric layer 771.

The second pad-level silicon-containing dielectric layer 772 includes a silicon-containing dielectric material such as silicon oxide, silicon nitride, silicon carbon nitride, silicon oxynitride, or any other dielectric material that includes silicon atoms at an atomic percentage greater than 10%. The second pad-level silicon-containing dielectric layer 772 can be deposited by chemical vapor deposition, spin coating, and/or physical vapor deposition, and may have a thickness in a range from 50 nm to 6,000 nm, such as from 100 nm to 3,000 nm, although lesser and greater thicknesses can also be employed.

The second polymer material layer includes a second polymer material, which may be an organic polymer material or an inorganic polymer material. The second polymer material includes polymerized assembly of monomer units. In one embodiment, the second polymer material can include polynorbornene, polyimide, polyaldehyde, or any other polymer material that can provide high adhesion strength. The second polymer material may be the same as, or may be different from, the first polymer material. The second polymer material layer may be formed, for example, by spin coating and curing. The thickness of the second polymer material layer can be in a range from 200 nm to 6,000 nm, such as from 500 nm to 2,500 nm, although lesser and greater thicknesses can also be employed. The thickness of the second pad-level dielectric layer 771 can be in a range from 1,000 nm to 10,000 nm, although lesser and greater thicknesses can also be employed.

A second plasma treatment is performed on a surface portion of the second polymer material layer with a second plasma. The second plasma treatment may be performed in a process chamber employing hydrogen plasma, helium plasma, neon plasma, argon plasma, nitrogen plasma, oxygen plasma, or a combination thereof. The type of plasma employed for the second plasma treatment process can be selected based on the type of the second polymer material. The plasma-treated portion of the second polymer material layer is herein referred to as a second distal polymer material layer 774D, and the underlying untreated portion of the second polymer material layer is herein referred to as a second proximal polymer material layer 774P. The second distal polymer material layer 774D is more distal from the second substrate 708 than the second proximal polymer material layer 774P is from the second substrate 708. The vertical stack of the second proximal polymer material layer 774P and the second distal polymer material layer 774D constitutes a second polymer material layer (974P, 774D). The thickness of the second distal polymer material layer 774D may be in a range from 1 nm to 200 nm, such as from 3 nm to 50 nm, although lesser and greater thicknesses can also be employed. The thickness of the second distal polymer material layer 774D can be optimized by adjusting the radio frequency (RF) power during the second plasma treatment process.

In one embodiment, the plasma-modified polymer material of the second distal polymer material layer 774D may have a greater hydrophilicity than the underlying portion of the second polymer material layer 774 (i.e., the second proximal polymer material layer 774P) that is not treated with the second plasma. In another embodiment, the plasma treatment increases the cross-linking density of the second polymer material in the second distal polymer material layer 774D, and the second distal polymer material layer 774D has a cross-linking density that is greater than a cross-linking density within the second proximal polymer material layer 774P.

A second photoresist layer (not shown) can be applied over the second distal polymer material layer 774D, and can be lithographically patterned to form an array of discrete openings in areas that overlie a respective one of the topmost ones of the second metal interconnect structures 780, i.e., a subset of the second metal interconnect structures 780 that is in contact with the bottom surface of the second pad-level silicon-containing dielectric layer 772. The openings in the photoresist layer can have the shapes of bonding pads to be subsequently formed. Each opening in the photoresist layer can have a horizontal cross-sectional shape of a polygon, a circle, an ellipse, or another two-dimensional curvilinear shape having a closed periphery. For example, the openings in the photoresist layer can have rectangular shapes. Each side of the rectangular shapes may have a lateral dimension in a range from 2 microns to 60 microns, such as from 5 microns to 30 microns, although lesser and greater lateral dimensions can also be employed. In case the second distal polymer material layer 774D and the second proximal polymer material layer 774P include a photosensitive material (such as polyimide), the second distal polymer material layer can be directly lithographically patterned by lithographic exposure and patterning without use of the second photoresist layer.

An anisotropic etch process can be performed to transfer the pattern in the second photoresist layer through the second distal polymer material layer 774D, the second proximal polymer material layer 774P, and the second pad-level silicon-containing dielectric layer 772. Second pad cavities are formed through the second distal polymer material layer 774D, the second proximal polymer material layer 774P, and the second pad-level silicon-containing dielectric layer 772. A top surface of a respective topmost one of the second metal interconnect structures 780 is physically exposed at the bottom of each second pad cavity. The second photoresist layer can be subsequently removed, for example, by ashing. In case the second distal polymer material layer 774D and the second proximal polymer material layer 774P include a photosensitive material and are directly lithographically patterned, the anisotropic etch process can etch through the second pad-level silicon-containing dielectric layer 772 to form the second pad cavities.

A second metallic barrier liner layer can be deposited by a conformal or a non-conformal deposition process. The second metallic barrier liner includes a metallic barrier material that functions as a diffusion barrier material for metallic materials, moisture, and impurity atoms. For example, the second metallic barrier liner can include TiN, TaN, WN, TiC, TaC, WC, or an alloy of a stack thereof. The second metallic barrier liner may be deposited by physical vapor deposition and/or by chemical vapor deposition. The thickness of vertically-extending portions (or tapered portions) of the second metallic barrier liner layer that are in contact with sidewalls of the second pad-level dielectric layer 771 can be in a range from 3 nm to 100 nm, such as from 6 nm to 50 nm, although lesser and greater thicknesses can also be employed.

A second metallic fill material layer can be deposited on the second metallic barrier liner. The second metallic fill material layer includes a metallic material that can provide metal-to-metal bonding at an elevated temperature less than 500 degrees Celsius, such as less than 450 degrees Celsius, such as 300 to 400 degrees Celsius. For example, the second metallic fill material layer can include, and/or can consist essentially of, copper or a copper-containing metallic alloy material. The second metallic fill material layer can be deposited by physical vapor deposition, chemical vapor deposition, electroplating, and/or electroless plating. For example, the second metallic fill material layer can be formed by depositing a metal seed layer by physical vapor deposition, and electroplating an additional metal layer on the metal seed layer. The thickness of the second metallic fill material layer can be selected such that all volumes of the second pad cavities are filled with the metallic material(s) of the second metallic fill material layer.

A planarization process can be performed to remove portions of the second metallic fill material layer and the second metallic barrier liner layer from above the horizontal plane including the top surface of the second distal polymer material layer 774D. For example, a chemical mechanical planarization process can be performed to remove the portions of the second metallic fill material layer and the second metallic barrier liner layer that overlie the horizontal plane including the top surface of the second distal polymer material layer 774D. Each remaining portion of the second metallic fill material layer in a respective second pad cavity constitutes a second metallic fill material portion 784. Each remaining portion of the second metallic barrier liner layer in a respective second pad cavity constitutes a second metallic barrier liner 783. Each contiguous combination of a second metallic barrier liner 783 and a second metallic fill material portion 784 constitutes a second bonding pad 788, which fills a respective one of the second pad cavities.

Generally, the second semiconductor die 700 comprises a second substrate 708, second semiconductor devices 720, second bonding pads 788 that are electrically connected to a respective node of the second semiconductor devices 720 and laterally surrounded by a second pad-level dielectric layer 771. The second pad-level dielectric layer 771 can include a stack of a second pad-level silicon-containing dielectric layer 772, a second proximal polymer material layer 774P, and a second distal polymer material layer 774D.

Figure 18:
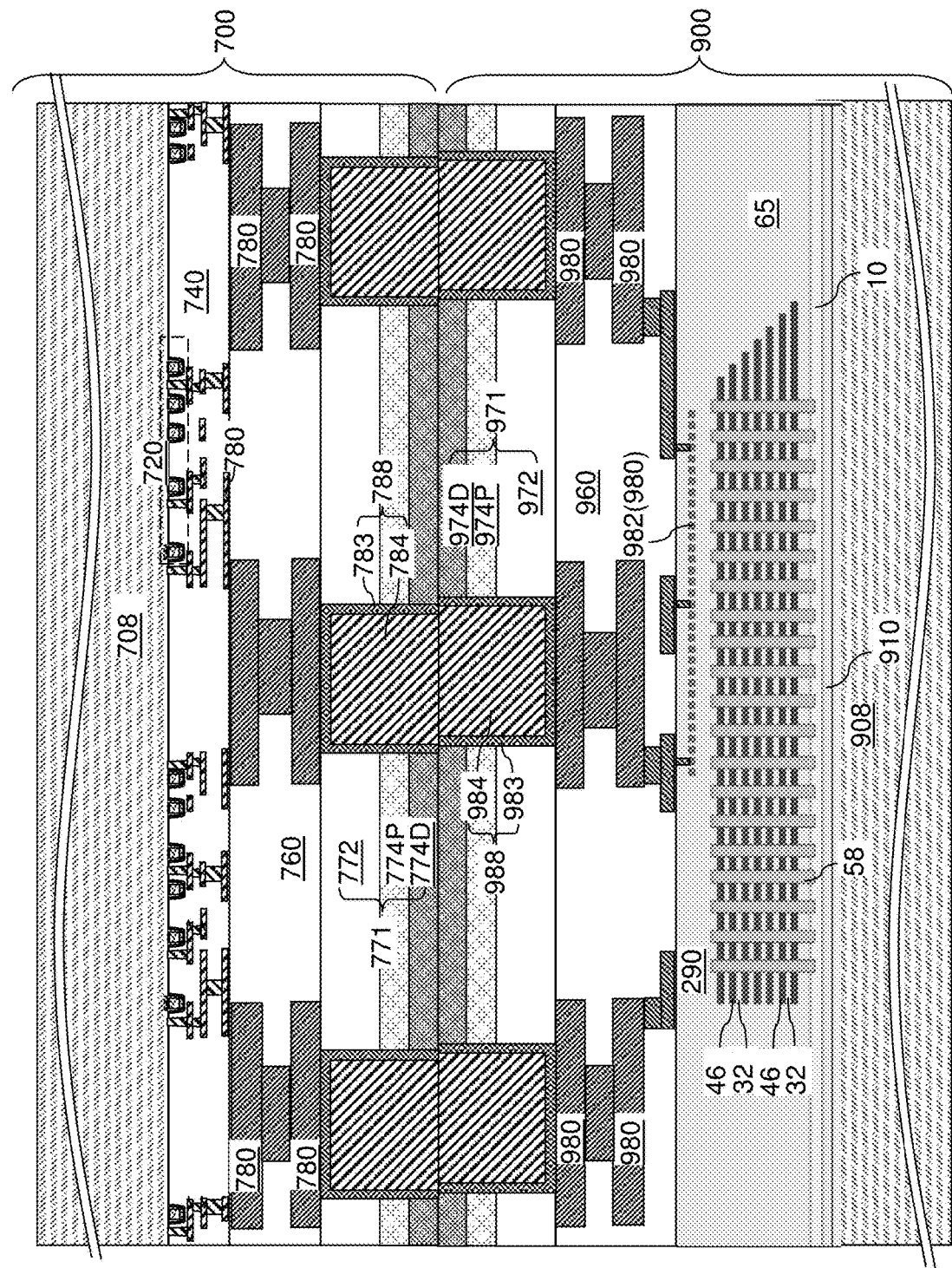
FIG. 18 is a schematic vertical cross-sectional view of a second exemplary structure including the first semiconductor die and the second semiconductor die after bonding the second bonding pads to the first bonding pads according to the second embodiment of the present disclosure.

Referring to FIG. 18, the first semiconductor die 900 and the second semiconductor die 700 are oriented such that each of the first bonding pads 988 faces a respective one of the second bonding pads 788. The second semiconductor die 700 and the first semiconductor die 900 are brought into contact such that the second pad-level dielectric layer 771 contacts the first pad-level dielectric layer 971. The first semiconductor die 900 and the second semiconductor die 700 may be laterally aligned such that each second bonding pad 788 contacts a respective one of the first bonding pads 988. In one embodiment, the pattern of the second bonding pads 788 may be a mirror image of the pattern of the first bonding pads 988 with optional differences in the size of bonding pads between the first semiconductor die 900 and the second semiconductor die 700. In one embodiment, the first bonding pads 988 and the corresponding second bonding pads 788 may have the same size (i.e., lateral width). In another embodiment, the first bonding pads 988 and the corresponding second bonding pads 788 may have different sizes. In one embodiment, areal overlap between each facing pair of a first bonding pad 988 and a second bonding pad 788 may be at least 80%, and/or at least 90%, such as 90 to 100%, of the area of the smaller one of the first bonding pad 988 and the second bonding pad 788.

Subsequently, the second bonding pads 788 may be bonded to the first bonding pads 988 by performing an anneal process that induces metal-to-metal bonding between the second bonding pads 788 and the first bonding pads 988 and between the second pad-level dielectric layer 771 contacts the first pad-level dielectric layer 971, i.e., between the second distal polymer material layer 774D and the first distal polymer material layer 974D. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 250 degrees Celsius to 400 degrees Celsius.

The first bonding pads 988 are bonded to the second bonding pads 788 while the first polymer material of the first distal polymer material layer 974D contacts the second pad-level dielectric layer 771. In one embodiment, the first polymer material of the first distal polymer material layer 974D can contact the second polymer material of the second distal polymer material layer 774D while the first bonding pads 988 are bonded to the second bonding pads 788. The first plasma treatment enhances adhesive strength between the first distal polymer material layer 974D and the second distal polymer material layer 774D. Further, the second plasma treatment also enhances adhesive strength between the first distal polymer material layer 974D and the second distal polymer material layer 774D Optionally, additional process steps of FIG. 9 may be performed to form through-substrate contact via structures 714 and/or additional bonding structures.

Figure 19:
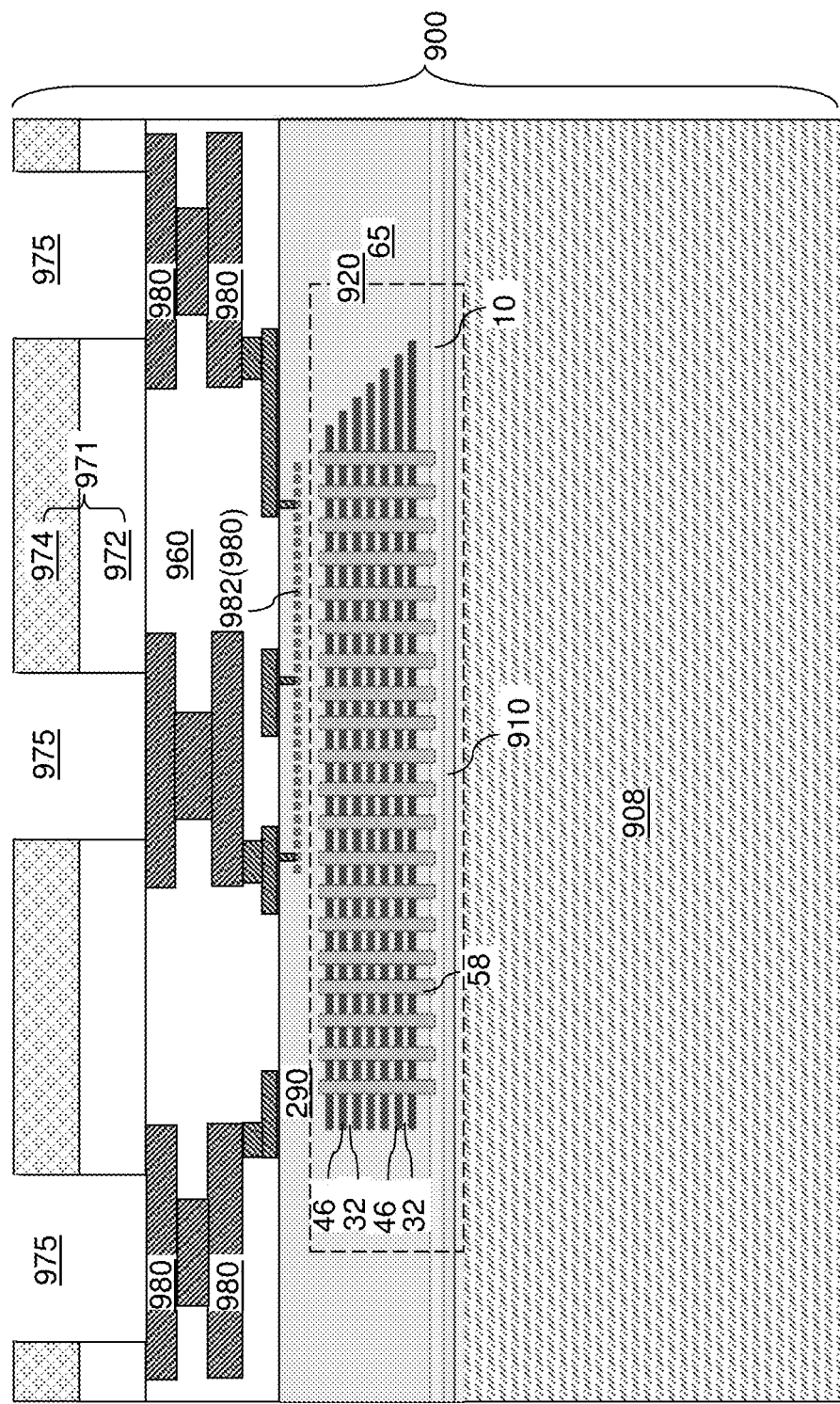
FIG. 19 is a schematic vertical cross-sectional view of an alternative configuration of the first semiconductor die after formation of first pad cavities according to a second embodiment of the present disclosure.

Referring to FIG. 19, an alternative configuration of the first semiconductor die 900 is illustrated, which may be derived from the first semiconductor die 900 of FIG. 11 by performed processing steps of FIG. 13 without performing the plasma treatment processing step of FIG. 12. In other words, the processing sequences of FIGS. 11-13 are modified to omit the processing steps of FIG. 12. The plasma treatment step is performed last in this alternative embodiment. First pad cavities 975 can be formed. Each first pad cavity 975 can extend through a vertical stack of a first pad-level silicon-containing dielectric layer 972 and a first polymer material layer 974.

Figure 20:
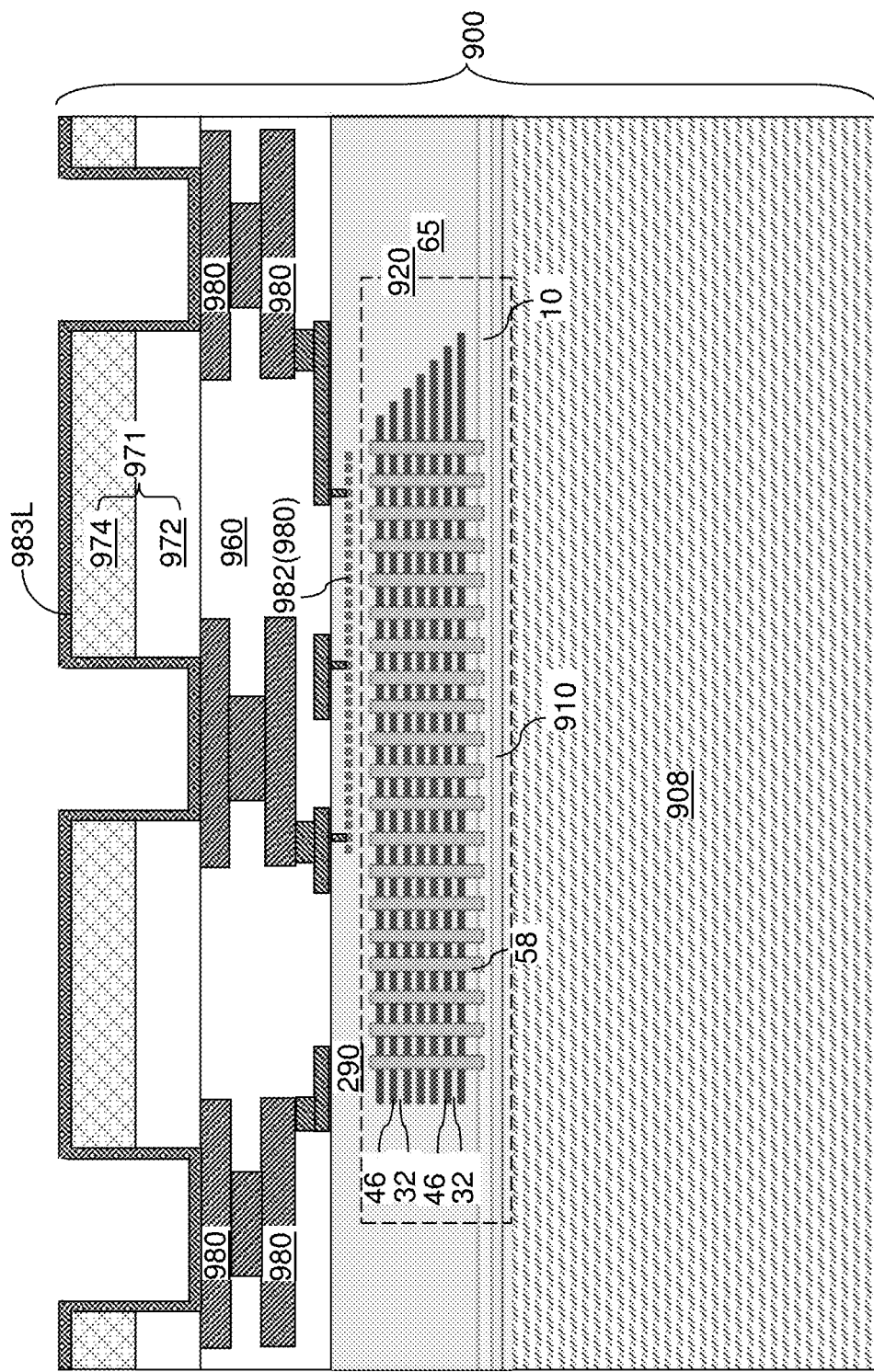
FIG. 20 is a schematic vertical cross-sectional view of the alternative configuration of the first semiconductor die after formation of a first metallic barrier liner layer according to the second embodiment of the present disclosure.

Referring to FIG. 20, the processing steps of FIG. 14 can be performed to form a first metallic barrier liner layer 983L.

Figure 21:
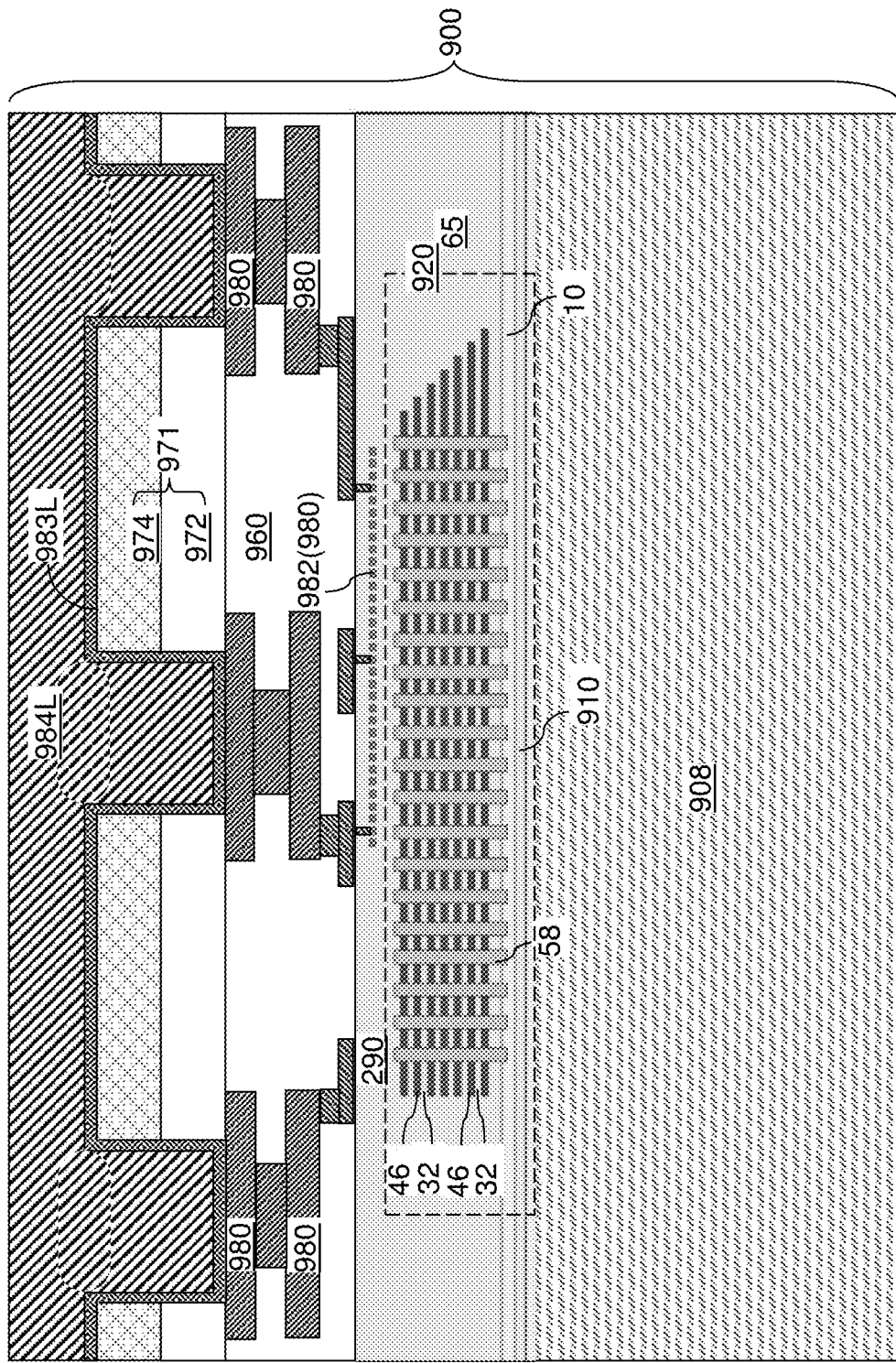
FIG. 21 is a schematic vertical cross-sectional view of the alternative configuration of the first semiconductor die after formation of a first metallic fill material layer according to the second embodiment of the present disclosure.

Referring to FIG. 21, the processing steps of FIG. 15 can be performed to form a first metallic fill material layer 984L.

Figure 22:
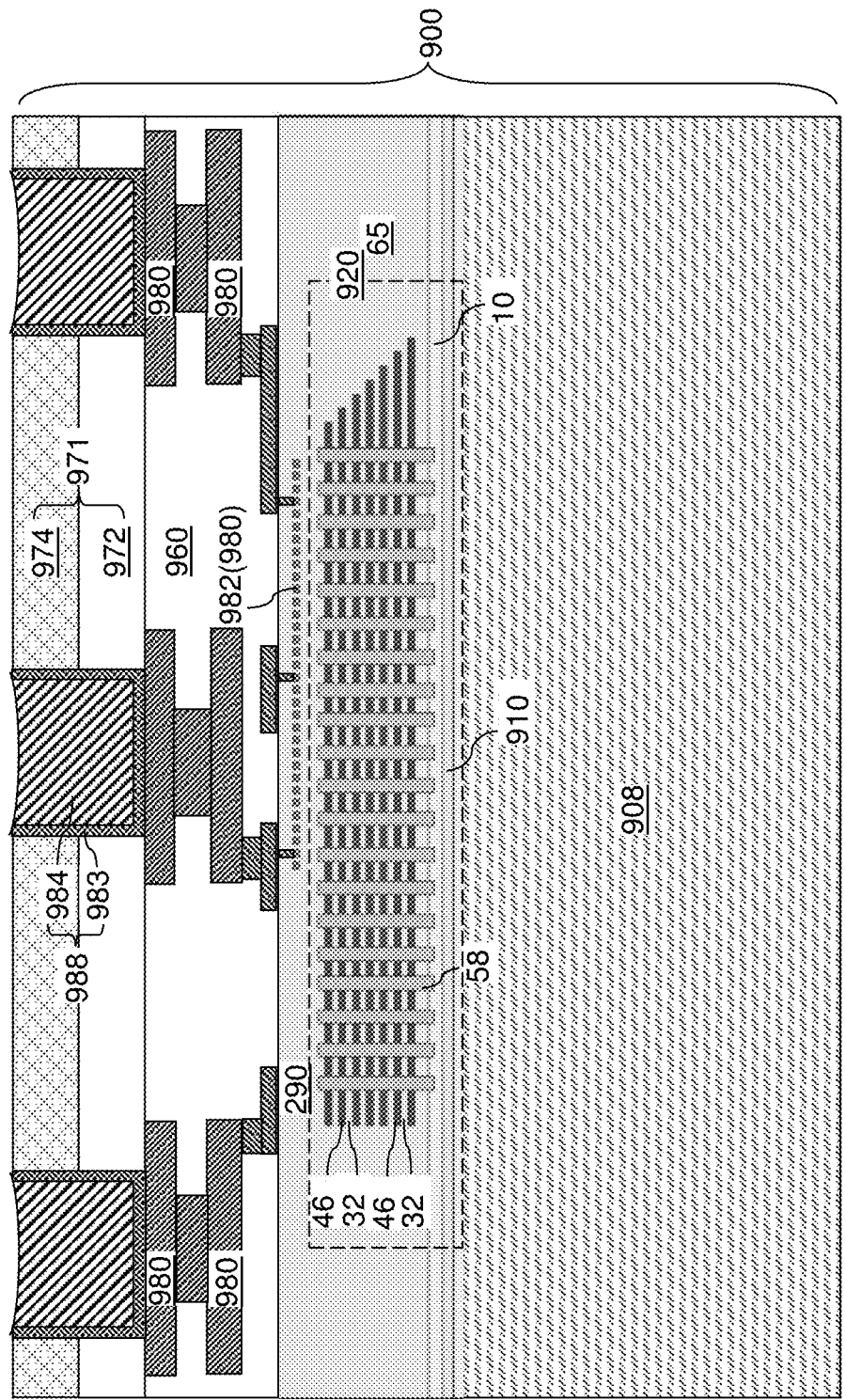
FIG. 22 is a schematic vertical cross-sectional view of the alternative configuration of the first semiconductor die after formation of first bonding pads according to the second embodiment of the present disclosure.

Referring to FIG. 22, the processing steps of FIG. 16 can be performed to form first bonding pads 988. In this case, the top surface of the first polymer material layer 974 can be employed as the stopping layer for the chemical mechanical planarization process. Each first bonding pad 988 can include a first metallic barrier liner 983 and a first metallic fill material portion 984, as in the prior embodiment.

Figure 23:
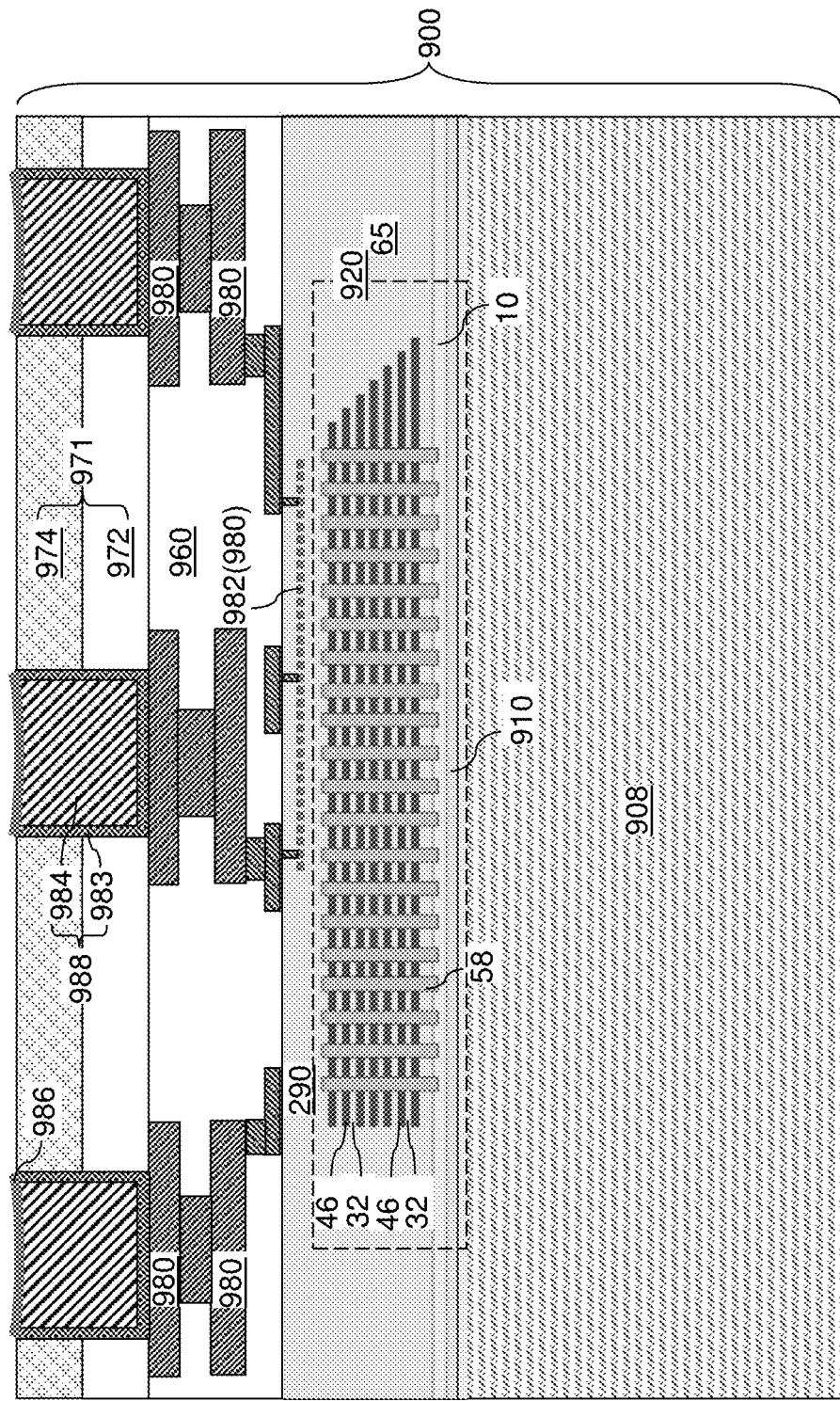
FIG. 23 is a schematic vertical cross-sectional view of the alternative configuration of the first semiconductor die after formation of a first self-assembly material (SAM) according to the second embodiment of the present disclosure.

Referring to FIG. 23, a first self-assembly material (SAM) layer 986 including a first SAM material can be selectively formed on each physically exposed surface of the first bonding pads 988 while suppressing deposition of the first SAM material on the first polymer material layer 974. The first SAM material may include any material that self-assembles on metallic surfaces without assembly on dielectric surfaces such as the surfaces of the first polymer material layer 974. In one embodiment, the first SAM material can be any material that may be employed for the first carbon-based oxidation barrier layer 992 described above. In one embodiment, the first SAM material may have a head group that is attached to the physically exposed surfaces of the first bonding pads 988 and a first tail group that is located on the opposite side of the head group and is physically exposed. The first SAM layer 986 can include a monolayer of the first SAM material. The first SAM material can include a material that can retard oxidation of the underlying metallic material(s) of the first bonding pads 988 during the subsequent bonding process.

Figure 24:
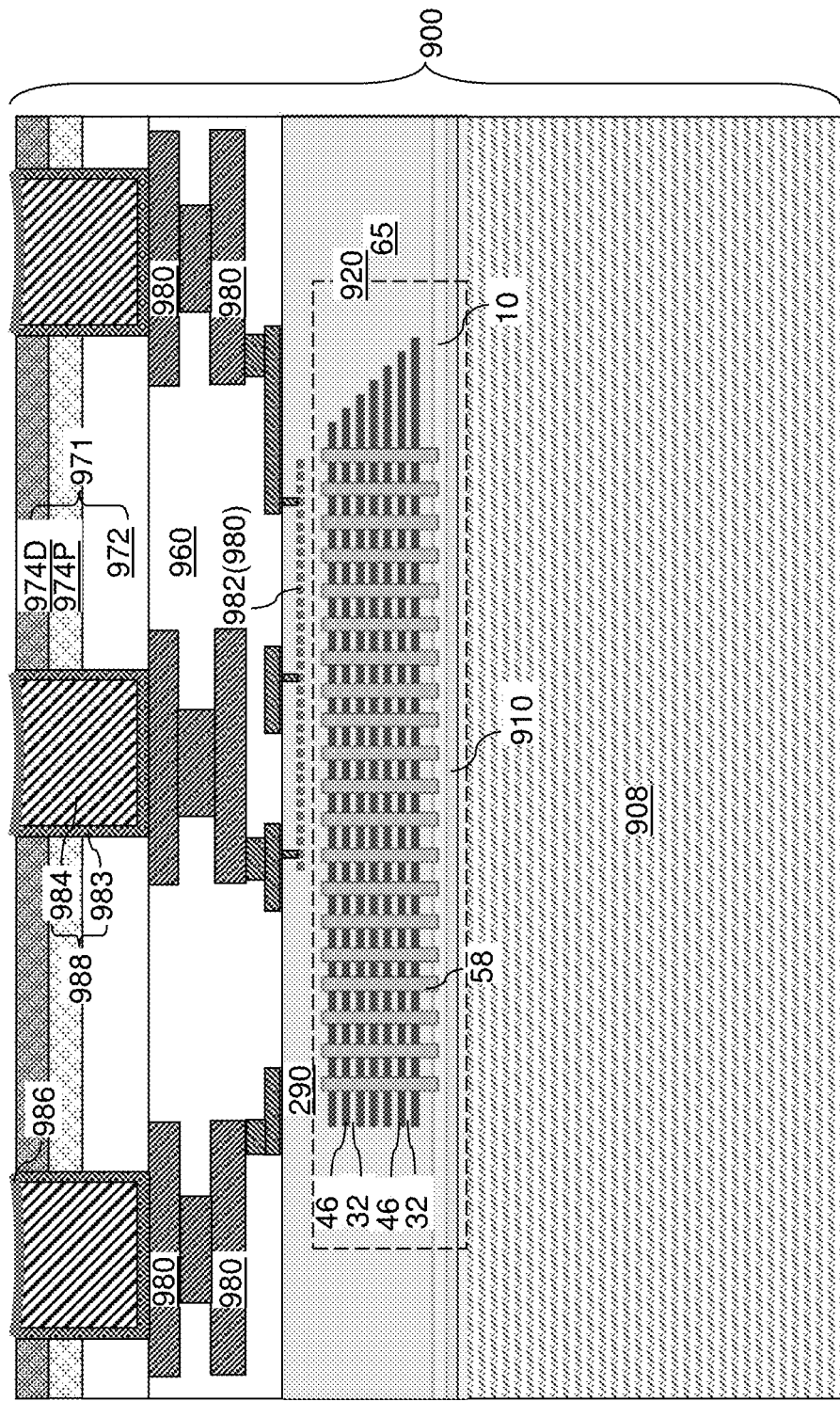
FIG. 24 is a schematic vertical cross-sectional view of the alternative configuration of the first semiconductor die after formation of a stack of a first proximal polymer material layer and a first distal polymer material layer by a first plasma treatment according to the second embodiment of the present disclosure.

Referring to FIG. 24, a first plasma treatment is performed on a surface portion of the first polymer material layer 974 with a first plasma. The first plasma treatment may be performed as described above with respect to FIG. 12 above. The first SAM layer 986 can protect the first bonding pads 988 from the first plasma, and can reduce structural damage, impurity incorporation, and/or chemical reaction that may be otherwise induced by the first plasma.

Figure 25:
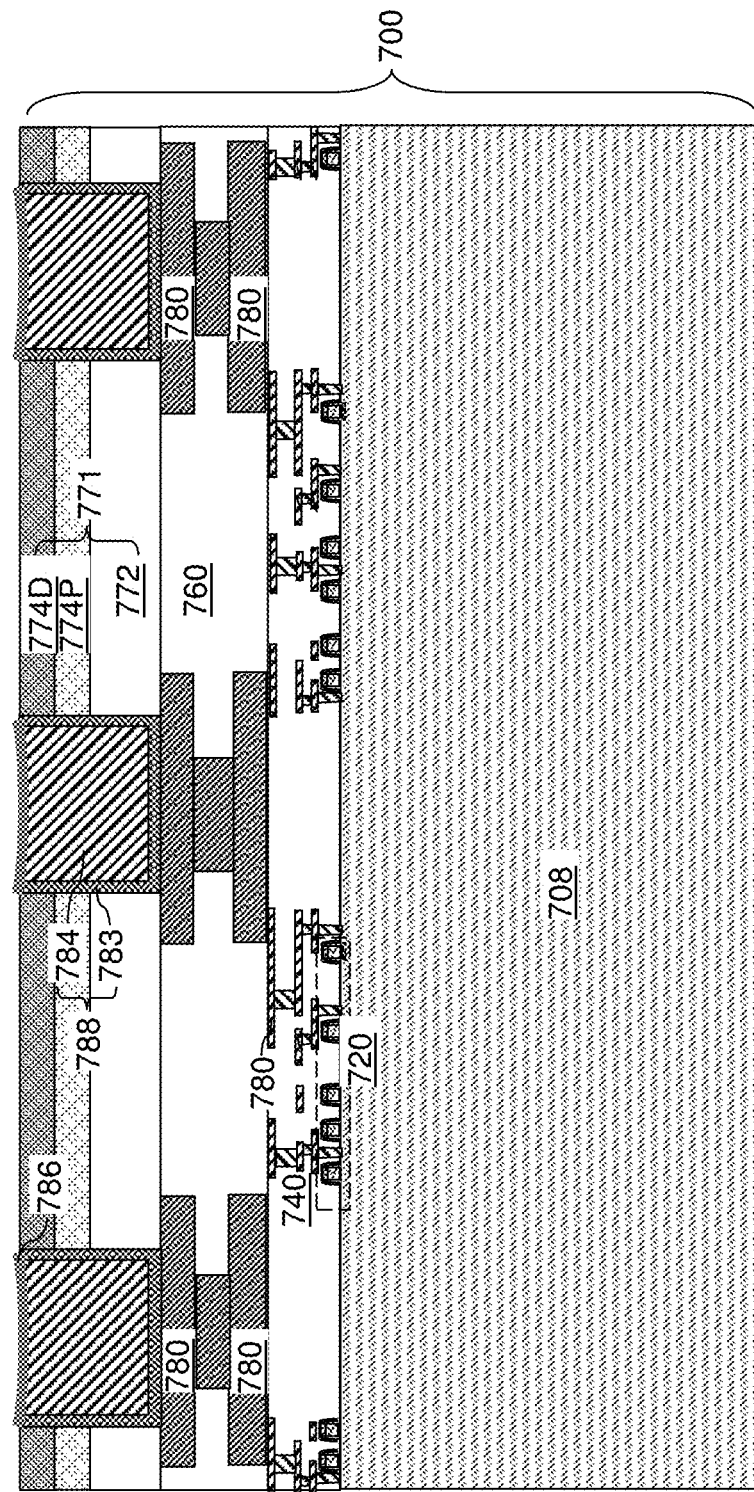
FIG. 25 is a schematic vertical cross-sectional view of an alternative configuration of a second semiconductor die according to the second embodiment of the present disclosure.

Referring to FIG. 25, an alternative configuration of a second semiconductor die 700 is illustrated, which can be derived from the second semiconductor die 700 of FIG. 3 by omitting the processing steps for formation of the second bonding dielectric layer 770 and the second bonding pads 788, and by performing the processing steps of FIGS. 19-24 while making suitable modifications. A second SAM material having a second tail group can be selectively formed on physically exposed surfaces of the second bonding pads 788 while suppressing deposition of the second SAM material on the second polymer material layer 774. In one embodiment, the second tail group has affinity to the first tail group, which facilitates alignment of the second bonding pads 788 to the first bonding pads 988 during a subsequent alignment step prior to bonding the second bonding pads 788 to the first bonding pads 988.

The second semiconductor die 700 can be treated with a second plasma by performing a second plasma treatment process, which can be substantially the same as the first plasma treatment process of FIG. 12.

Figure 26:
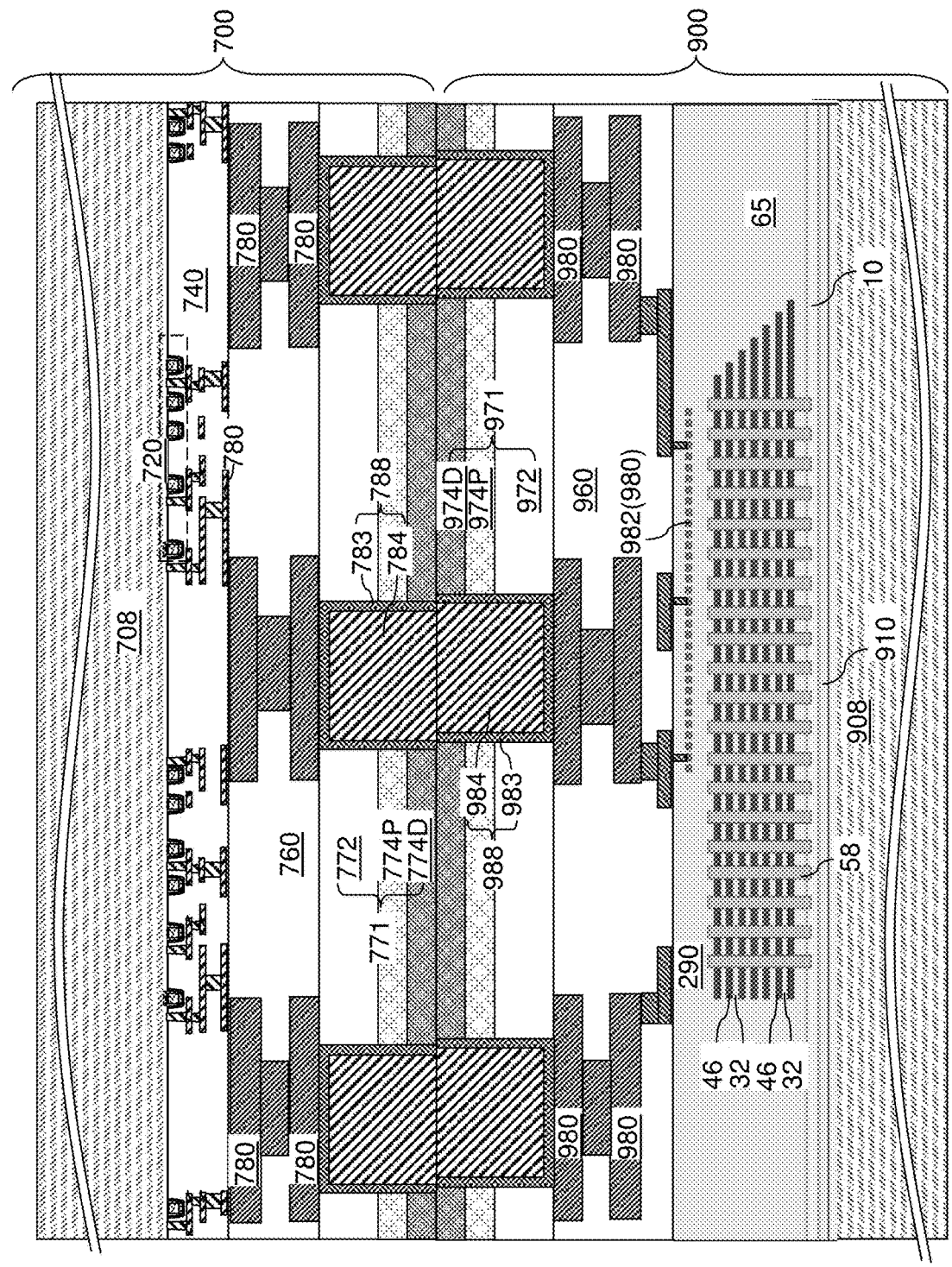
FIG. 26 is a schematic vertical cross-sectional view of a second exemplary structure including the first semiconductor die and the second semiconductor die after bonding the second bonding pads to the first bonding pads according to the second embodiment of the present disclosure.

Referring to FIG. 26, the first semiconductor die 900 of FIG. 24 and the second semiconductor die 700 of FIG. 25 can be bonded to each other by performing the processing steps of FIG. 18. The dishing features at the surfaces of the first bonding pads 988 and the second bonding pads 788 can be removed during the bonding process as the materials of the first bonding pads 988 and the second bonding pads 788 expand thermally during the anneal process and fills the voids caused by the dishing features. Thus, the bonding interfaces between the first bonding pads 988 and the second bonding pads 788 may be substantially planar, and may be substantially free of voids. The first SAM layer 986 and the second SAM layer 786 temporarily protect the first bonding pads 988 and the second bonding pads 788 from oxidation until the decomposition temperatures for the first SAM material and the second SAM material are reached, at which temperature the first SAM material and the second SAM material decompose.

The first bonding pads 988 are bonded to the second bonding pads 788 while the first polymer material of the first distal polymer material layer 974D contacts the second pad-level dielectric layer 771. In one embodiment, the first polymer material of the first distal polymer material layer 974D can contact the second polymer material of the second distal polymer material layer 774D while the first bonding pads 988 are bonded to the second bonding pads 788. The first plasma treatment enhances adhesive strength between the first distal polymer material layer 974D and the second distal polymer material layer 774D. Further, the second plasma treatment enhances adhesive strength between the first distal polymer material layer 974D and the second distal polymer material layer 774D

Optionally, additional process steps of FIG. 9 may be performed to form through-substrate contact via structures 714 and/or additional bonding structures.

Figure 27:
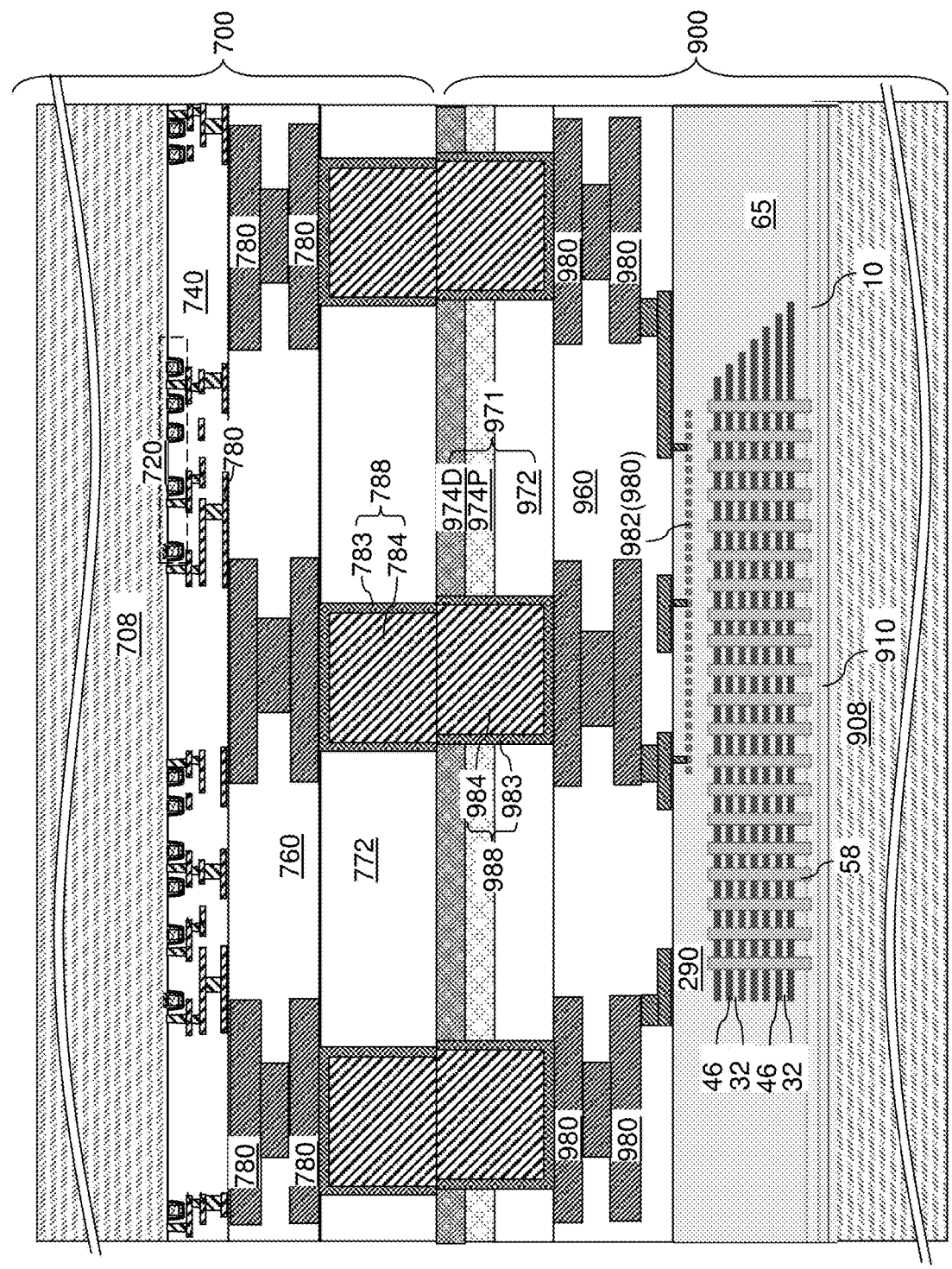
FIG. 27 is a schematic vertical cross-sectional view of an alternative embodiment of the second exemplary structure including the first semiconductor die and the second semiconductor die after bonding the second bonding pads to the first bonding pads according to the second embodiment of the present disclosure.

While embodiments described above employ plasma treatment on two polymer material layers (974, 774) provided on two different semiconductor dies (900, 700), the plasma treatment can be performed on only one polymer material layer provided on a semiconductor die. Referring to FIG. 27, an alternative embodiment of the second exemplary structure is illustrated, which can be formed employing the first semiconductor die 900 of FIG. 16 or the first semiconductor die 900 of FIG. 24, and by employing a second semiconductor die 700 in which a second pad-level dielectric layer consists of a second pad-level silicon-containing dielectric layer 772 (such as a silicon oxide layer).

In this case, the first bonding pads 988 are bonded to the second bonding pads 788 while the first polymer material of the first distal polymer material layer 974D contacts the second pad-level dielectric layer which comprises the second pad-level silicon-containing dielectric layer 772. Thus, the first polymer material of the first distal polymer material layer 974D can contact the material of the second pad-level silicon-containing dielectric layer 772 (such as silicon oxide) while the first bonding pads 988 are bonded to the second bonding pads 788. The first plasma treatment enhances adhesive strength between the first distal polymer material layer 974D and the second pad-level silicon-containing dielectric layer 772.

Optionally, additional process steps of FIG. 9 may be performed to form through-substrate contact via structures 714 and/or additional bonding structures.

Referring to FIGS. 10-27 and according to various embodiments of the present disclosure, a bonded assembly (900, 700) is provided, which comprises: a first semiconductor die 900 comprising a first substrate 908, first semiconductor devices 920, first bonding pads 988 that are electrically connected to a respective node of the first semiconductor devices 920 and laterally surrounded by a first pad-level dielectric layer 971, wherein the first pad-level dielectric layer 971 comprises a stack of a first proximal polymer material layer 974P and a first distal polymer material layer 974D having at least one of greater hydrophilicity or greater cross-linking density than first proximal polymer material layer 974P; and a second semiconductor die 700 comprising a second substrate 708, second semiconductor devices 720, and second bonding pads 788 that are electrically connected to a respective node of the second semiconductor devices 720 and laterally surrounded by a second pad-level dielectric layer (771 or 772), wherein each of the second bonding pads 788 is bonded to a respective one of the first bonding pads 988, and the first distal polymer material layer 974D contacts the second pad-level dielectric layer (771 or 772).

In one embodiment, the first distal polymer material layer 974D has a higher hydrophilicity and a higher surface energy than the first proximal polymer material layer 974P; and the first distal polymer material layer 974D has a smaller contact angle than the first proximal polymer material layer 974P. In one embodiment, the first distal polymer material layer 974D and the first proximal polymer material layer 974P comprise polymers of a same monomer. In one embodiment, the first proximal polymer material layer 974P has a first cross-linking density among monomer units therein; the first distal polymer material layer 974D has a second cross-linking density among monomer units therein; and the second cross-linking density is higher than the first cross-linking density.

In one embodiment, the first distal polymer material layer 974D comprises polar functional groups. In one embodiment, the polar functional groups comprise at least one of a carbonyl group, a carboxyl group, an amine group, an amide group, or a hydroxyl group. In one embodiment, the first distal polymer material layer 974D includes the polar functional groups at a distal functional group density; and the first proximal polymer material layer 974P is essentially free of the polar functional groups or includes the polar functional groups at a proximal functional group density that is lower than the distal functional group density.

In one embodiment, the first proximal polymer material layer 974P has a first cross-linking density among monomer units therein; the first distal polymer material layer 974D has a second cross-linking density among monomer units therein; and the second cross-linking density is higher than the first cross-linking density.

In one embodiment, the second pad-level dielectric layer 771 comprises a stack of a second proximal polymer material layer 774P and a second distal polymer material layer 774D having greater hydrophilicity than second proximal polymer material layer 774P and contacting the second proximal polymer material layer 774P. In another embodiment, the second pad-level dielectric layer 771 comprises a stack of a second proximal polymer material layer 774P and a second distal polymer material layer 774D having greater cross-linking density than the second proximal polymer material layer and contacting the second proximal polymer material layer 774P.

Alternatively, the second pad-level dielectric layer comprises the second pad-level silicon-containing dielectric layer 772 which comprises a silicon-containing dielectric material (such as silicon oxide, silicon nitride, silicon carbon nitride, or silicon oxynitride) in contact with the first distal polymer material layer 974D.

Figure 28:
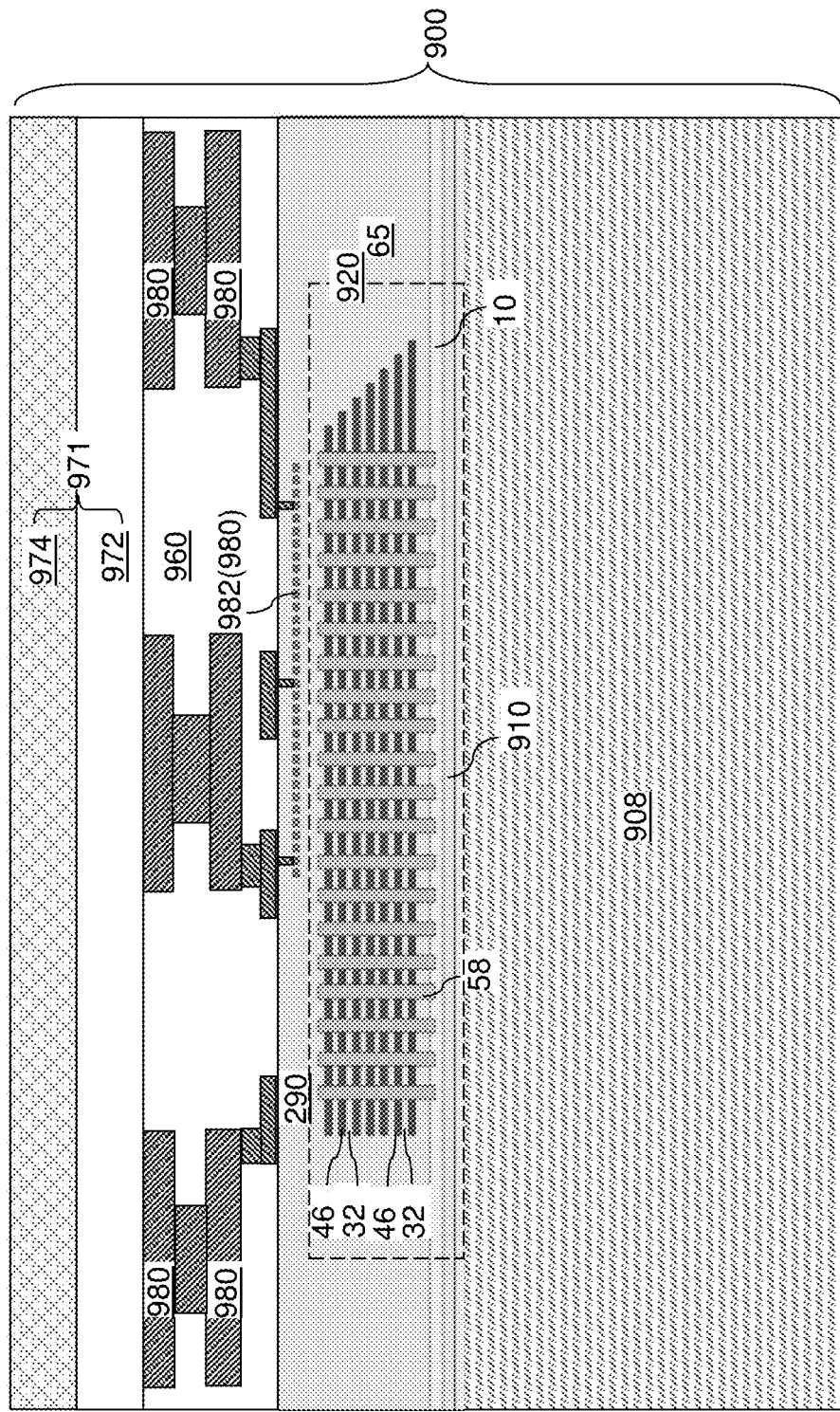
FIG. 28 is a schematic vertical cross-sectional view of a first semiconductor die after formation of a first pad-level silicon-containing dielectric layer and a first polymer material layer according to a third embodiment of the present disclosure.

Referring to FIG. 28, a first semiconductor die 900 according to a third embodiment of the present disclosure is illustrated. The first semiconductor die 900 of the third embodiment can be derived from the first semiconductor die 900 of the second embodiment illustrated in FIG. 11 by employing a polymer material that is miscible with another polymer material as the first polymer material of the first polymer material layer 974. In other words, a pair of miscible polymer materials including a first polymer material and a second polymer material is employed in the third embodiment of the present disclosure, and the first polymer material layer 974 includes the first miscible polymer material of the pair of miscible polymer materials.

In one embodiment, a combination of the two miscible polymer materials may be selected from a combination of styrene maleic anhydride (SMA) and tetra-glycidyl ether of diphenyl diamino methane (TGDDM), a combination of maleic anhydride grafted polypropylene (PP-g-MA) and tetra-glycidyl ether of diphenyl diamino methane (TGDDM), or a combination of poly(methyl methacrylate) (PMMA) and polyvinylidene fluoride (PVDF). The first polymer material may be selected from SMA, TGDDM, PP-g-MA, PMMA or PVDF.

The first pad-level silicon-containing dielectric layer 972 can be deposited by chemical vapor deposition, spin coating, and/or physical vapor deposition, and may have a thickness in a range from 50 nm to 6,000 nm, such as from 100 nm to 3,000 nm, although lesser and greater thicknesses can also be employed. The first polymer material layer 974 may be formed, for example, by spin coating and curing. The thickness of the first polymer material layer 974 can be in a range from 200 nm to 6,000 nm, such as from 500 nm to 2,500 nm, although lesser and greater thicknesses can also be employed. The thickness of the first pad-level dielectric layer 971 can be in a range from 1,000 nm to 10,000 nm, although lesser and greater thicknesses can also be employed.

Figure 29:
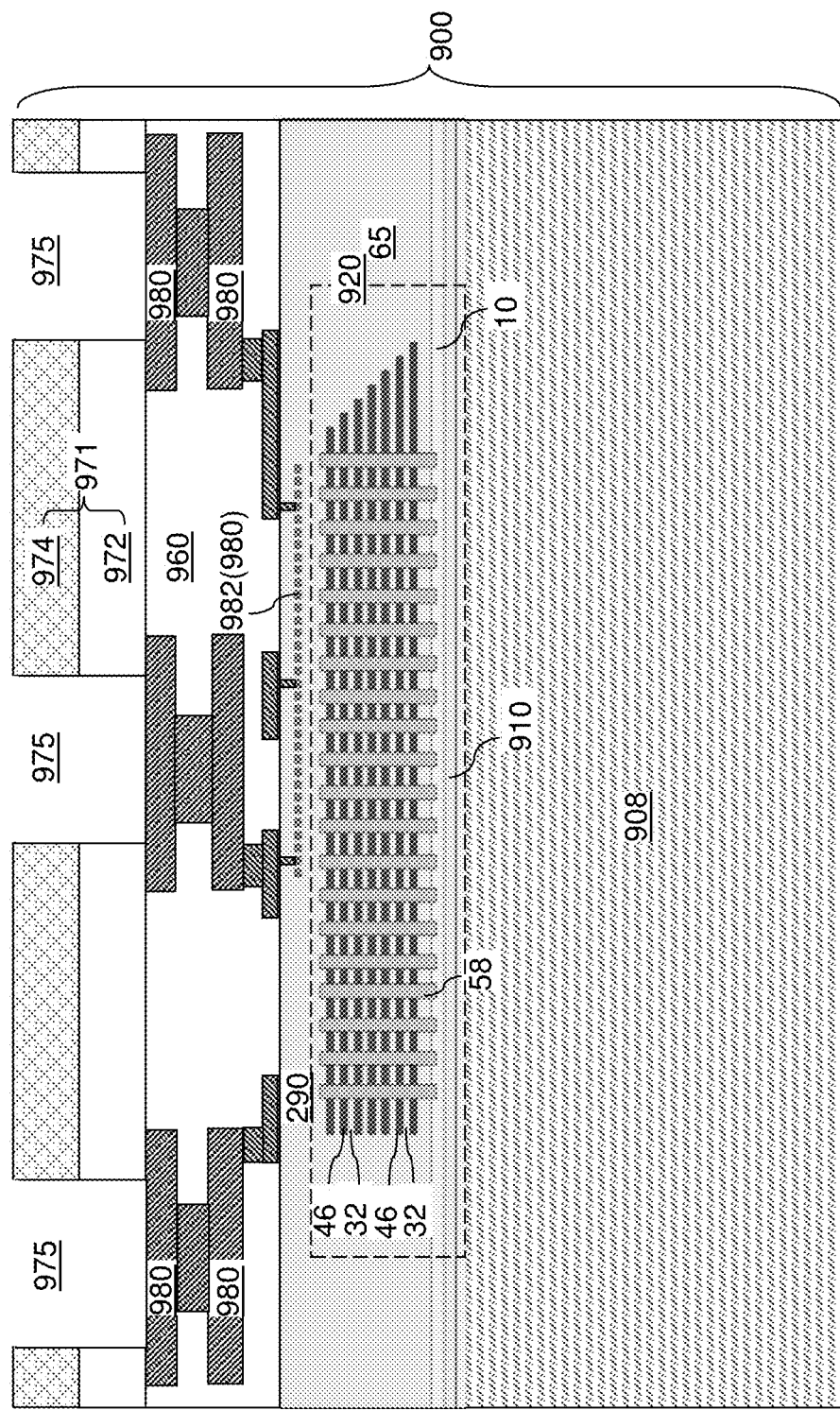
FIG. 29 is a schematic vertical cross-sectional view of the first semiconductor die after formation of first pad cavities according to the third embodiment of the present disclosure.

Referring to FIG. 29, the processing steps of FIG. 19 can be performed to form an array of first pad cavities 975. A top surface of a respective one of the first metal interconnect structures 980 can be physically exposed at the bottom of each first pad cavity 975.

Figure 30:
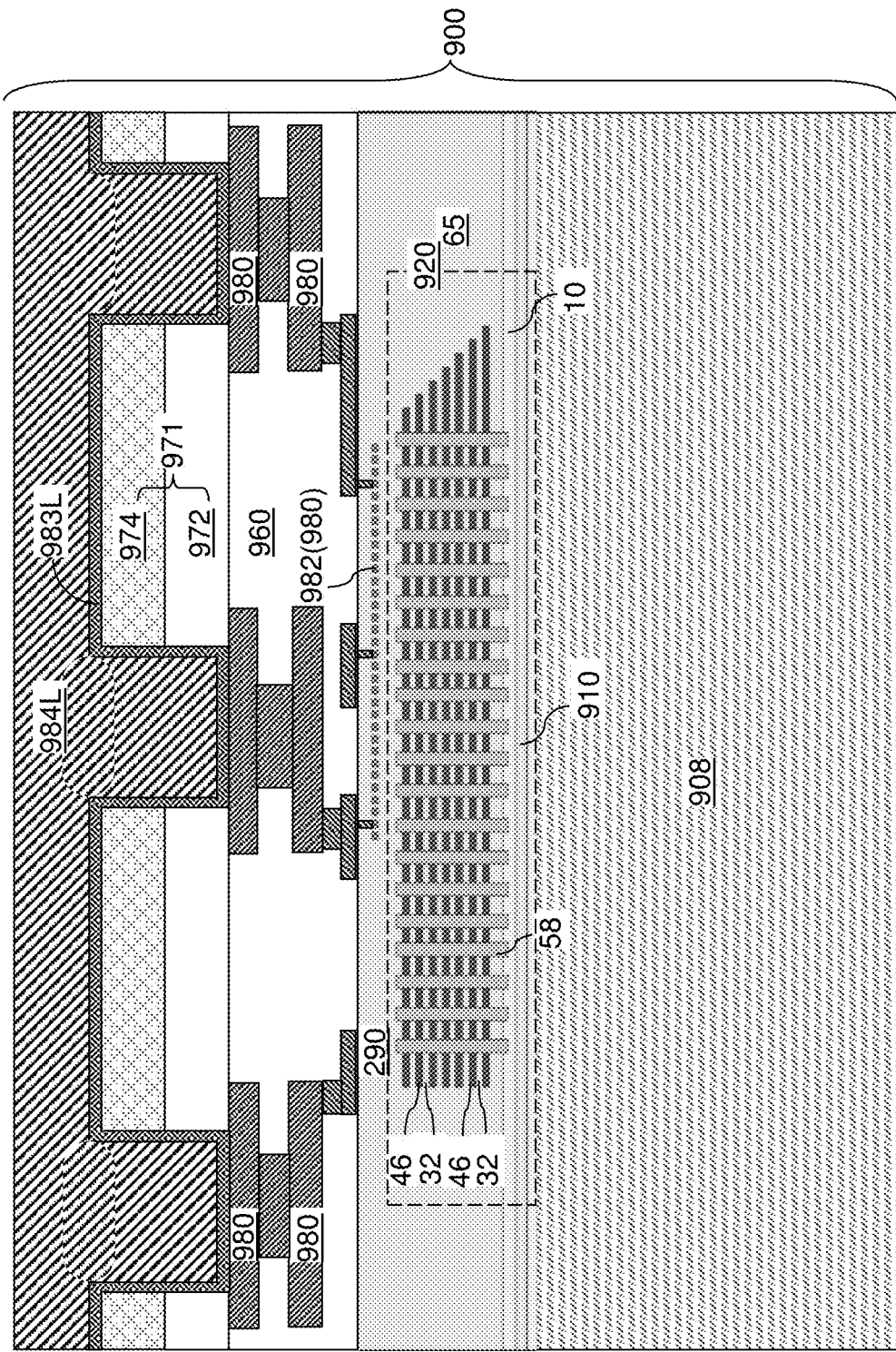
FIG. 30 is a schematic vertical cross-sectional view of the first semiconductor die after formation of a first metallic barrier liner layer and a first metallic fill material layer according to the third embodiment of the present disclosure.

Referring to FIG. 30, the processing steps of FIGS. 14 and 15 can be performed to form a first metallic barrier liner layer 983L and a first metallic fill material layer 984L.

Figure 31:
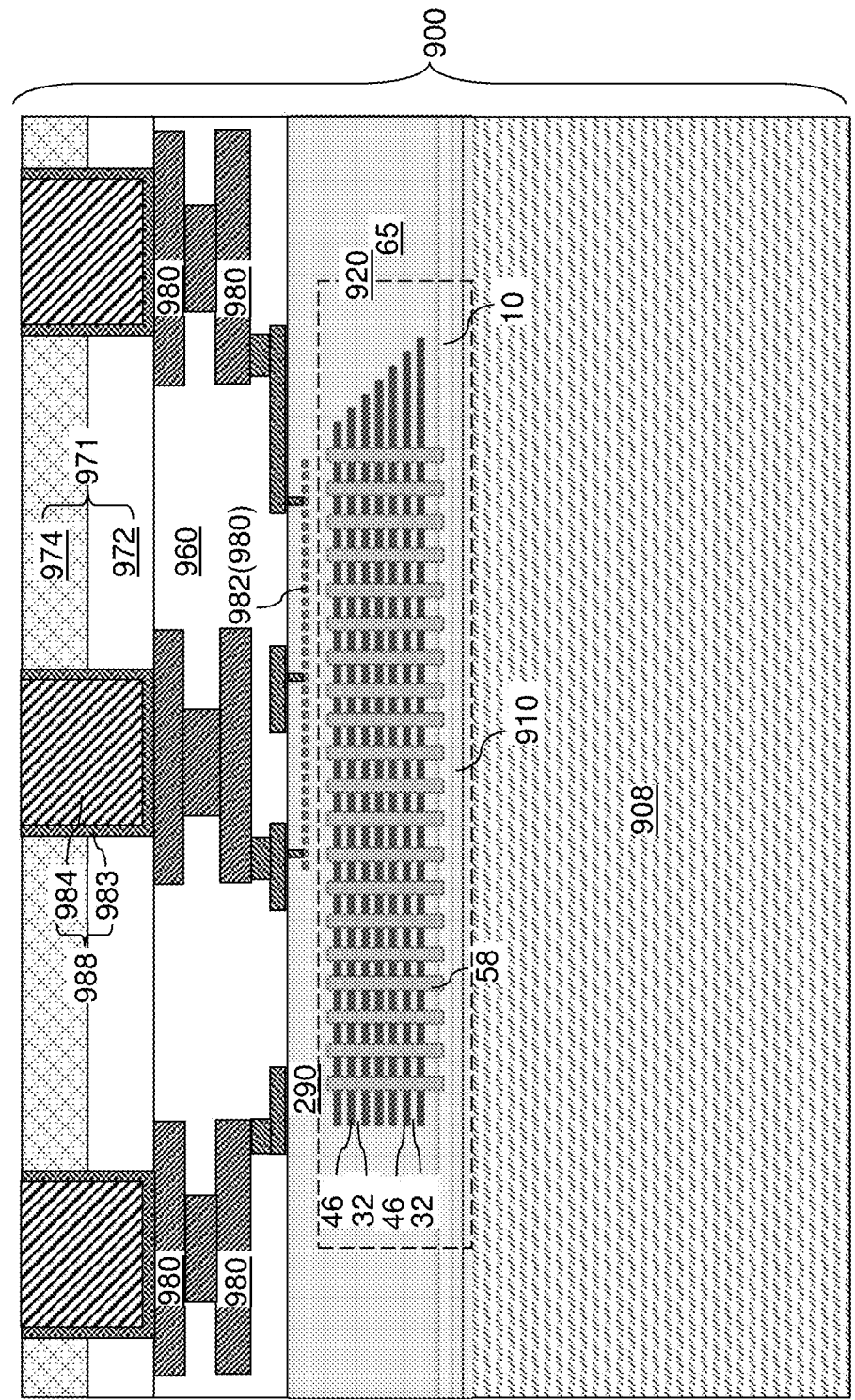
FIG. 31 is a schematic vertical cross-sectional view of the first semiconductor die after formation of first bonding pads according to the third embodiment of the present disclosure.

Referring to FIG. 31, the processing steps of FIG. 16 can be performed to form first bonding pads 988. In this case, the top surface of the first polymer material layer 974 can be employed as the stopping layer for the chemical mechanical planarization process. Each first bonding pad 988 can include a first metallic barrier liner 983 and a first metallic fill material portion 984. Generally, the first semiconductor die 900 comprises a first substrate 908, first semiconductor devices 920, first bonding pads 988 that are electrically connected to a respective node of the first semiconductor devices 920 and laterally surrounded by a first polymer material layer 974 including a first polymer material.

Figure 32:
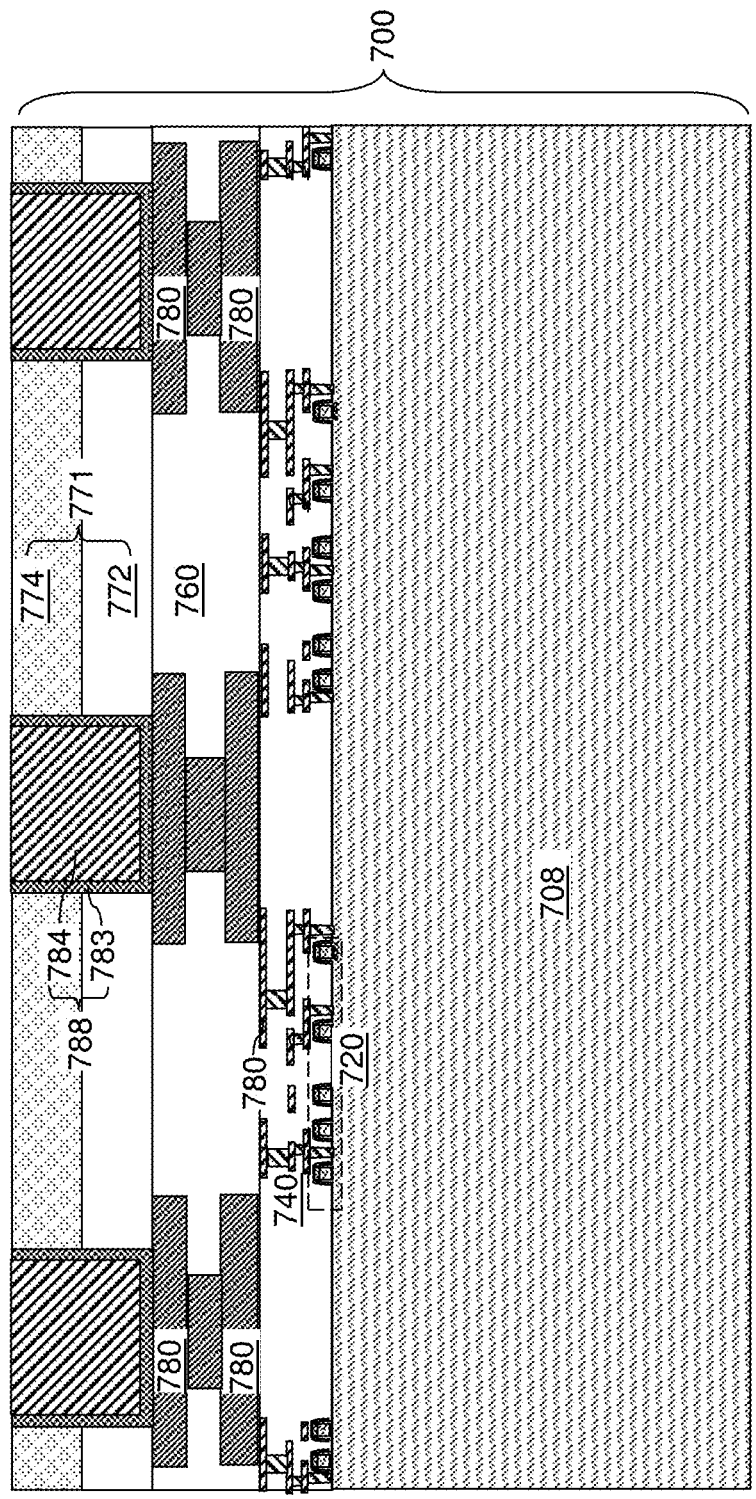
FIG. 32 is a schematic vertical cross-sectional view of a second semiconductor die according to the third embodiment of the present disclosure.

Referring to FIG. 32, a second semiconductor die 700 according to the third embodiment of the present disclosure derived from the second semiconductor die 700 of FIG. 3 by omitting the processing steps for formation of the second bonding dielectric layer 770 and the second bonding pads 788, and by performing the processing steps of FIGS. 28-31 while making suitable modifications. Particularly, the second polymer material layer 774 of the third embodiment of the present disclosure includes a second polymer material that is miscible with the first polymer material of the first polymer material layer 974. The first polymer material and the second polymer material comprise a combination of the two miscible polymer materials, which may be selected from a combination of SMA and TGDDM, a combination of PP-g-MA and TGDDM, or a combination of PMMA and PVDF. If the first polymer material comprises SMA or PP-g-MA, then the second polymer material may comprise TGDDM. If the first polymer material comprises TGDDM, then the second polymer material may comprise SMA or PP-g-MA. If the first polymer material comprises PMMA, then the second polymer material may comprise PVDF. If the first polymer material comprises PVDF, then the second polymer material may comprise PMMA. Any miscible combination of two polymer materials may be employed for the first polymer material and the second polymer material.

The second pad-level silicon-containing dielectric layer 772 can be deposited by chemical vapor deposition, spin coating, and/or physical vapor deposition, and may have a thickness in a range from 50 nm to 6,000 nm, such as from 100 nm to 3,000 nm, although lesser and greater thicknesses can also be employed. The second polymer material layer 774 may be formed, for example, by spin coating and curing. The thickness of the second polymer material layer 774 can be in a range from 200 nm to 6,000 nm, such as from 500 nm to 2,500 nm, although lesser and greater thicknesses can also be employed. The thickness of the second pad-level dielectric layer 771 can be in a range from 1,000 nm to 10,000 nm, although lesser and greater thicknesses can also be employed.

Generally, the second semiconductor die 700 comprises a second substrate 708, second semiconductor devices 720, and second bonding pads 788 that are electrically connected to a respective node of the second semiconductor devices 720 and laterally surrounded by a second polymer material layer 774 including a second polymer material which is miscible with the first polymer material.

Figure 33:
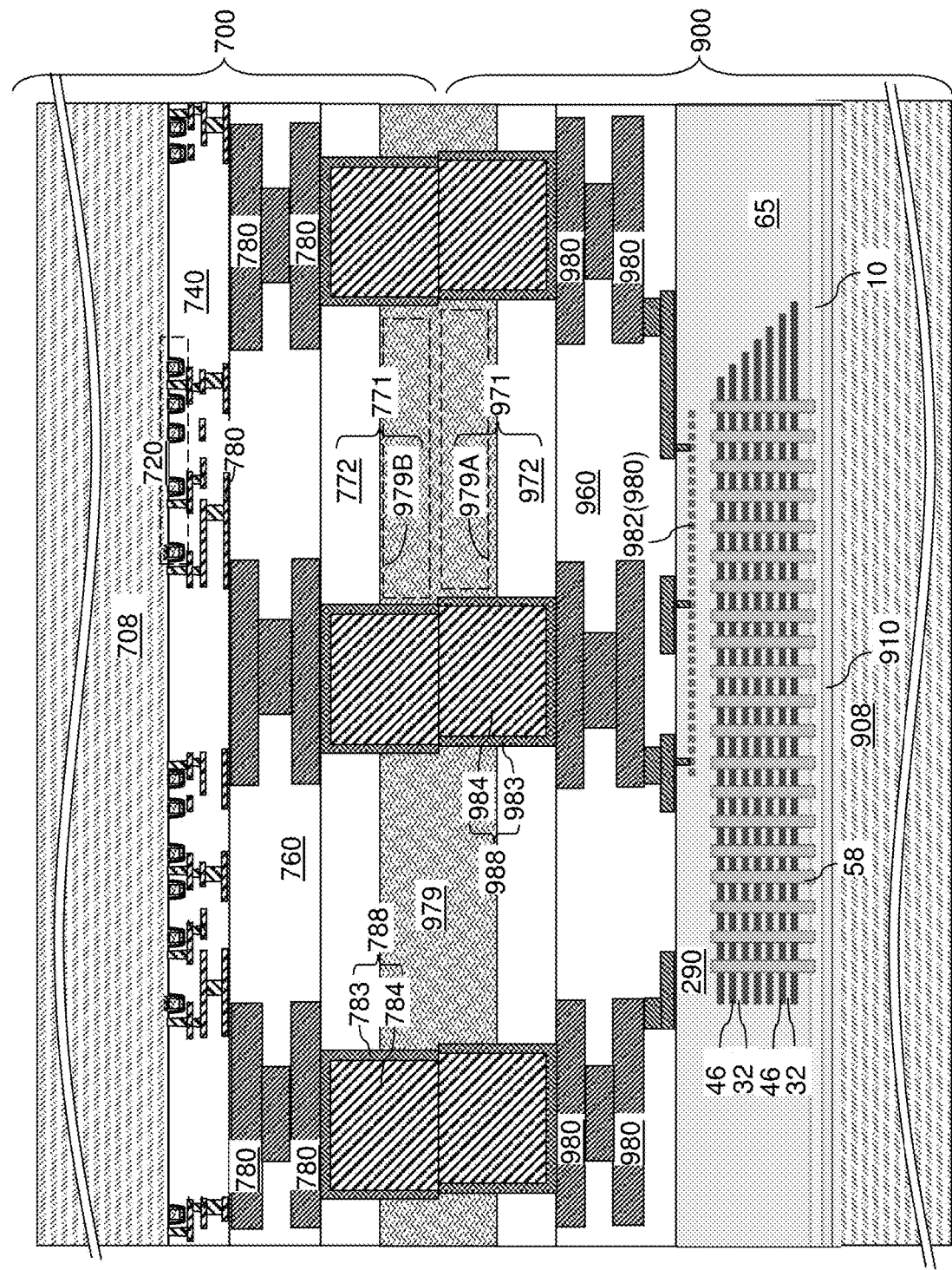
FIG. 33 is a schematic vertical cross-sectional view of a third exemplary structure including the first semiconductor die and the second semiconductor die after bonding the second bonding pads to the first bonding pads and after formation of a pad-level polymer material layer according to the third embodiment of the present disclosure.

Referring to FIG. 33, the first semiconductor die 900 and the second semiconductor die 700 are oriented such that each of the first bonding pads 988 faces a respective one of the second bonding pads 788. The second semiconductor die 700 and the first semiconductor die 900 are brought into contact such that the second polymer material layer 774 contacts the first polymer material layer 974. The first semiconductor die 900 and the second semiconductor die 700 may be laterally aligned such that each second bonding pad 788 contacts a respective one of the first bonding pads 988. In one embodiment, the pattern of the second bonding pads 788 may be a mirror image of the pattern of the first bonding pads 988 with optional differences in the size of bonding pads between the first semiconductor die 900 and the second semiconductor die 700. In one embodiment, the first bonding pads 988 and the corresponding second bonding pads 788 may have the same size (i.e., lateral width). In another embodiment, the first bonding pads 988 and the corresponding second bonding pads 788 may have different sizes. In one embodiment, areal overlap between each facing pair of a first bonding pad 988 and a second bonding pad 788 may be at least 80%, and/or at least 90%, such as 90 to 100%, of the area of the smaller one of the first bonding pad 988 and the second bonding pad 788.

Subsequently, the second bonding pads 788 may be bonded to the first bonding pads 988 by performing an anneal process that induces metal-to-metal bonding between the second bonding pads 788 and the first bonding pads 988 while inducing intermixing of the first polymer material and the second polymer material. The anneal temperature may be selected based on the composition of the second bonding pads 788 and the first bonding pads 988, and based on the compositions of the first polymer material and the second polymer material. For example, if the second bonding pads 788 and the first bonding pads 988 include metal fill portions that consist essentially of copper, the anneal temperature may be in a range from 200 degrees Celsius to 400 degrees Celsius.

Mixing the first polymer material and the second polymer material induces formation of a pad-level polymer material layer 979 including a blend of first polymer material and the second polymer material having a single phase structure. Generally, the blend of the first polymer material and the second polymer material can be formed by annealing the first polymer material layer 974 and the second polymer material layer 774 at an elevated temperature in a range from 200 degrees Celsius to 400 degrees Celsius, such as from 200 degrees Celsius to 250 degrees Celsius. The blend may be formed during the same anneal as the bonding pad anneal and/or during a separate lower temperature anneal prior to the higher temperature bonding pad anneal.

Each first bonding pad 988 can be laterally surrounded by a first pad-level dielectric layer 971, which includes a combination of the first pad-level silicon-containing dielectric layer 972 and a first portion 979A of the pad-level polymer material layer 979 located on the first-semiconductor-die side of the horizontal plane including the bonding interfaces between the first bonding pads 988 and the second bonding pads 788. Each second bonding pad 788 can be laterally surrounded by a second pad-level dielectric layer 771, which includes a combination of the second pad-level silicon-containing dielectric layer 772 and a second portion 979B of the pad-level polymer material layer 979 located on the second-semiconductor-die side of the horizontal plane including the bonding interfaces between the first bonding pads 988 and the second bonding pads 788. Depending on the degree of intermixing of the first polymer material and the second polymer material in the pad-level polymer material layer 979, the pad-level polymer material layer 979 may have a homogeneous composition throughout, or may have a vertically-graded composition in which the molecular percentage of the first polymer material decreases with a vertical distance from the first substrate 908, and the molecular percentage of the second polymer material decreases with a vertical distance from the second substrate 708.

Optionally, additional process steps of FIG. 9 may be performed to form through-substrate contact via structures 714 and/or additional bonding structures.

Figure 34:
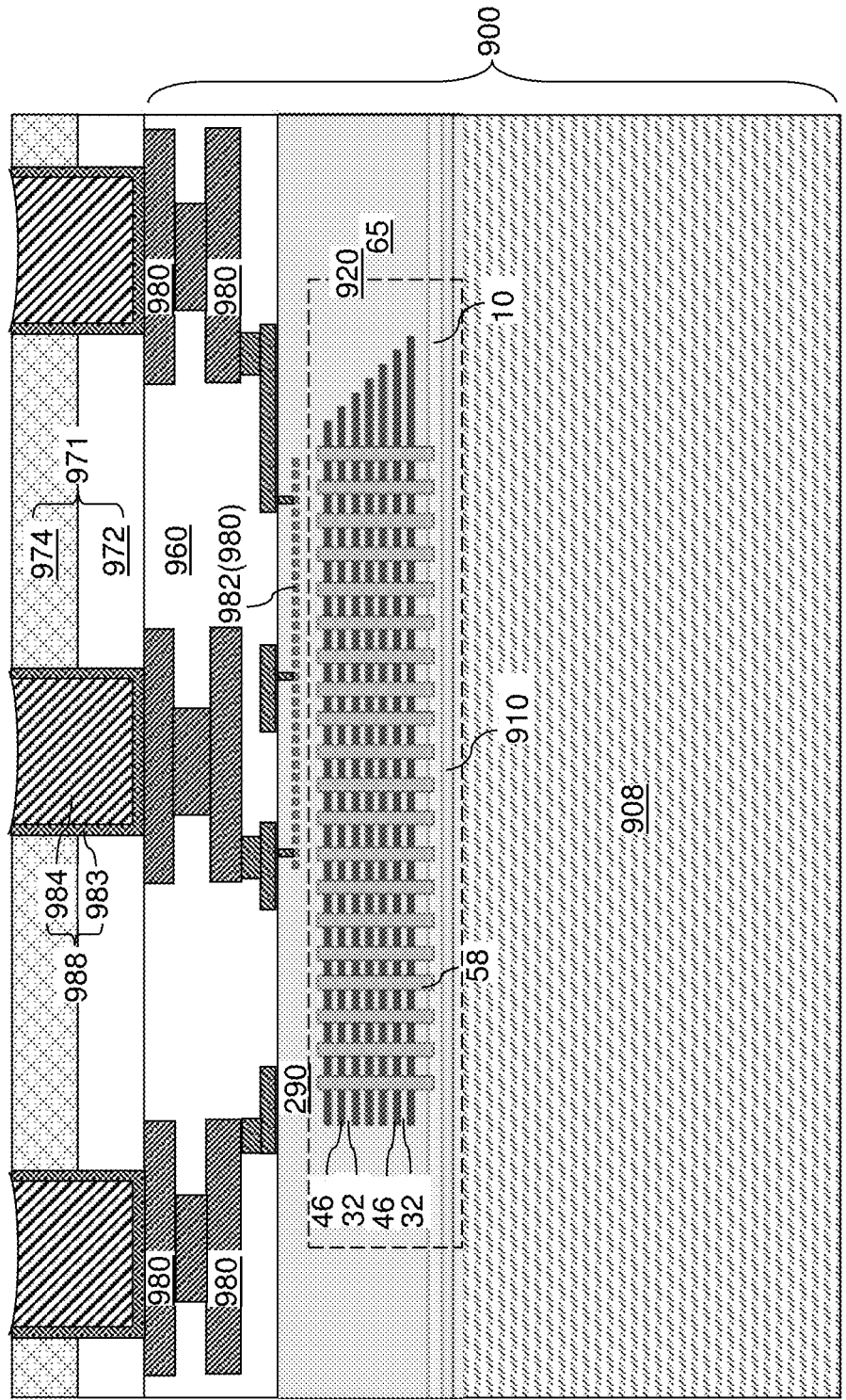
FIG. 34 is a schematic vertical cross-sectional view of an alternative configuration of the first semiconductor die after formation of first bonding pads according to the third embodiment of the present disclosure.

Referring to FIG. 34, an alternative embodiment of the first semiconductor die 900 according to the third embodiment of the present disclosure may be the same as the first semiconductor die 900 illustrated in FIG. 32. In one embodiment, the physically exposed surfaces of the first bonding pads 988 may have a dishing feature, i.e., a feature in which a center portion of a top surface of a first bonding pad 988 is more recessed relative to a peripheral portion of the top surface of the first bonding pad 988 such that the top surface of the first bonding pad 988 has a concave shape. The vertical recess distance of the center portion of a first bonding pad 988 relative to the peripheral portion of the first bonding pad 988 depends on the lateral dimension of the first bonding pad 988 and the process parameters of the chemical mechanical planarization process. For example, the vertical recess distance of the center portion of a first bonding pad 988 relative to the peripheral portion of the first bonding pad 988 may be in a range from 1 nm to 100 nm, such as from 3 nm to 30 nm, although lesser and greater vertical recess distances may be employed.

Figure 35:
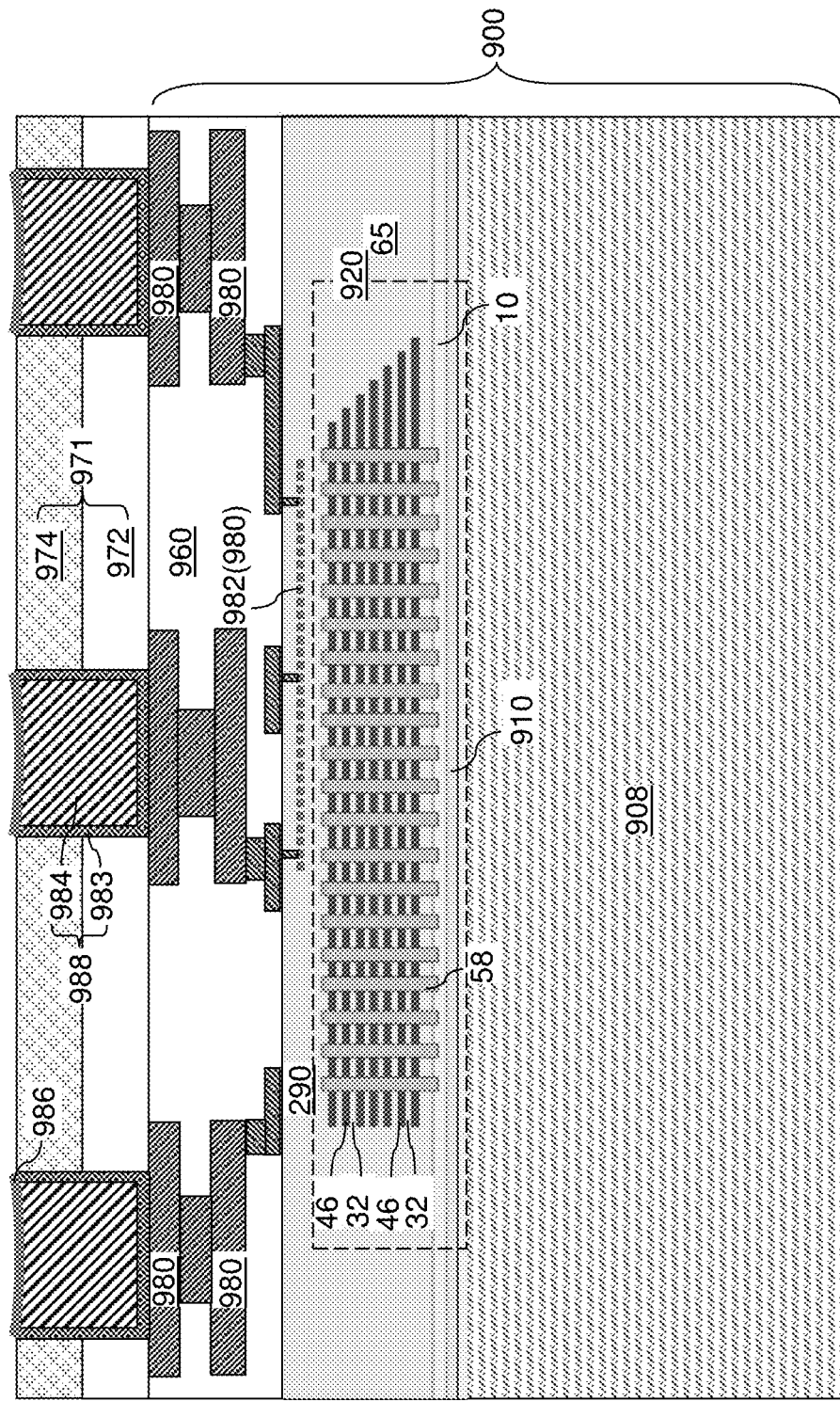
FIG. 35 is a schematic vertical cross-sectional view of the alternative configuration of the first semiconductor die after formation of a first self-assembly material (SAM) according to the third embodiment of the present disclosure.

Referring to FIG. 35, a first self-assembly material (SAM) layer 986 including a first SAM material can be selectively formed on each physically exposed surface of the first bonding pads 988 while suppressing deposition of the first SAM material on the first polymer material layer 974. The first SAM material may include any material that self-assembles on metallic surfaces without assembly on dielectric surfaces such as the surfaces of the first polymer material layer 974. In one embodiment, the first SAM material can be any material that may be employed for the first carbon-based oxidation barrier layer 992 described above. In one embodiment, the first SAM material may have a head group that is attached to the physically exposed surfaces of the first bonding pads 988 and a first tail group that is located on the opposite side of the head group and is physically exposed. The first SAM layer 986 can include a monolayer of the first SAM material. The first SAM material can include a material that can retard oxidation of the underlying metallic material(s) of the first bonding pads 988 during the subsequent bonding process.

Figure 36:
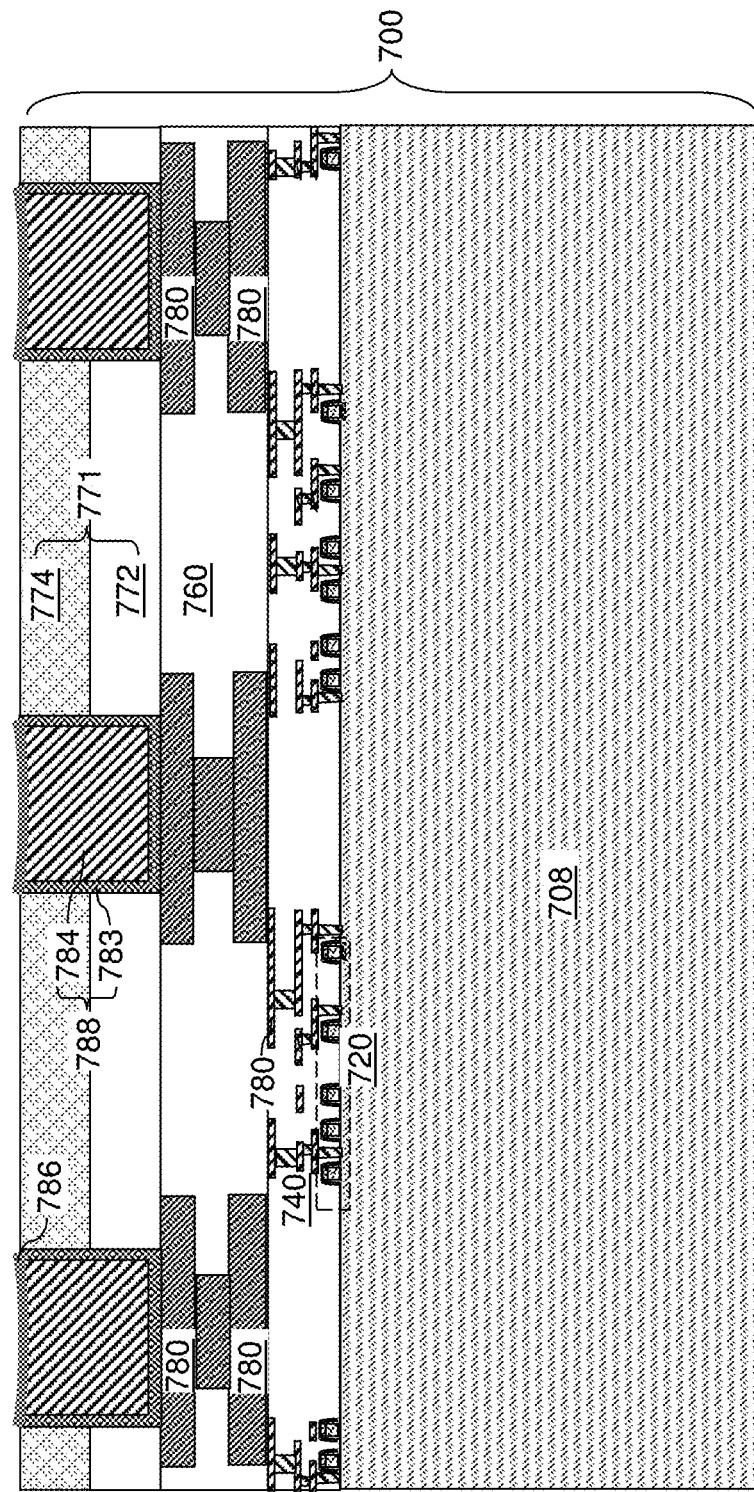
FIG. 36 is a schematic vertical cross-sectional view of an alternative embodiment of the second semiconductor die according to the third embodiment of the present disclosure.

Referring to FIG. 36, an alternative configuration of a second semiconductor die 700 is illustrated, which can be derived from the second semiconductor die 700 of FIG. 3 by omitting the processing steps for formation of the second bonding dielectric layer 770 and the second bonding pads 788, and by performing the processing steps of FIGS. 34 and 35 while making suitable modifications. Particularly, the second polymer material layer 774 of the third embodiment of the present disclosure includes a second polymer material that is miscible with the first polymer material of the first polymer material layer 974. The first polymer material and the second polymer material comprise a combination of the two miscible polymer materials, which may be selected from a combination of SMA and TGDDM, a combination of PP-g-MA and TGDDM, or a combination of PMMA and PVDF. If the first polymer material comprises SMA or PP-g-MA, then the second polymer material may comprise TGDDM. If the first polymer material comprises TGDDM, then the second polymer material may comprise SMA or PP-g-MA. If the first polymer material comprises PMMA, then the second polymer material may comprise PVDF. If the first polymer material comprises PVDF, then the second polymer material may comprise PMMA. Any miscible combination of two polymer materials may be employed for the first polymer material and the second polymer material.

The second pad-level silicon-containing dielectric layer 772 can be deposited by chemical vapor deposition, spin coating, and/or physical vapor deposition, and may have a thickness in a range from 50 nm to 6,000 nm, such as from 100 nm to 3,000 nm, although lesser and greater thicknesses can also be employed. The second polymer material layer 774 may be formed, for example, by spin coating and curing. The thickness of the second polymer material layer 774 can be in a range from 200 nm to 6,000 nm, such as from 500 nm to 2,500 nm, although lesser and greater thicknesses can also be employed. The thickness of the second pad-level dielectric layer 771 can be in a range from 1,000 nm to 10,000 nm, although lesser and greater thicknesses can also be employed.

Generally, the second semiconductor die 700 comprises a second substrate 708, second semiconductor devices 720, and second bonding pads 788 that are electrically connected to a respective node of the second semiconductor devices 720 and laterally surrounded by a second polymer material layer 774 including a second polymer material which is miscible with the first polymer material.

A second SAM material having a second tail group can be selectively formed on physically exposed surfaces of the second bonding pads 788 while suppressing deposition of the second SAM material on the second polymer material layer 774. In one embodiment, the second tail group has affinity to the first tail group, which facilitates alignment of the second bonding pads 788 to the first bonding pads 988 during a subsequent alignment step prior to bonding the second bonding pads 788 to the first bonding pads 988.

Figure 37:
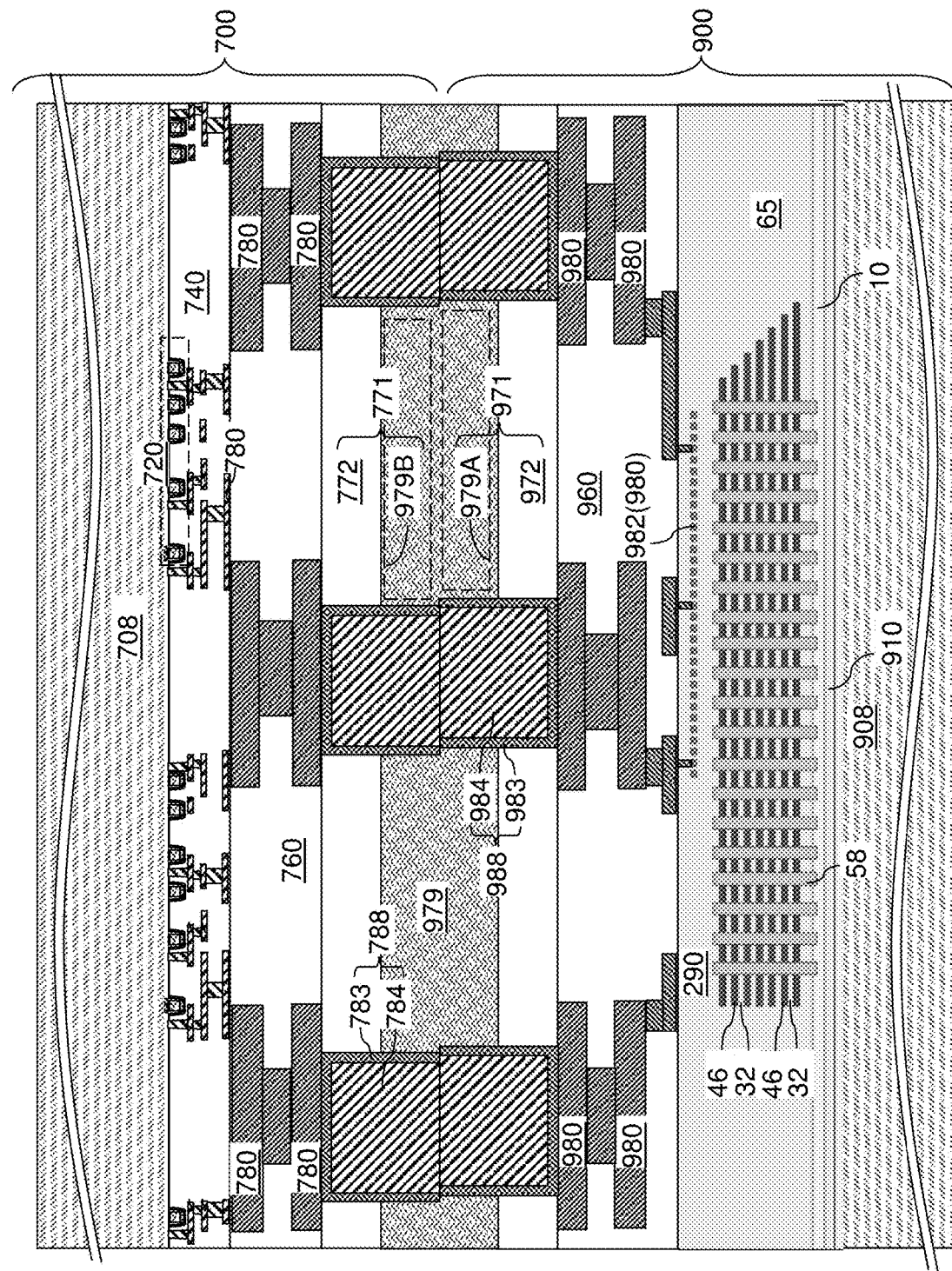
FIG. 37 is a schematic vertical cross-sectional view of an alternative embodiment of the third exemplary structure including the first semiconductor die and the second semiconductor die after bonding the second bonding pads to the first bonding pads and after formation of a pad-level polymer material layer according to the third embodiment of the present disclosure.

Referring to FIG. 37, the processing steps of FIG. 33 can be performed to bond the second bonding pads 788 to the first bonding pads 988, and to induce intermixing of the first polymer material and the second polymer material. The anneal temperature may be selected based on the composition of the second bonding pads 788 and the first bonding pads 988, and based on the compositions of the first polymer material and the second polymer material. For example, if the second bonding pads 788 and the first bonding pads 988 include metal fill portions that consist essentially of copper, the anneal temperature may be in a range from 200 degrees Celsius to 400 degrees Celsius. The first SAM layers 986 and the second SAM layers 786 retard oxidation of the metallic materials of the first bonding pads 988 and the second bonding pads 788 up to the respective thermal decomposition temperature, which is lower than the anneal temperature. The first SAM layers 986 and the second SAM layers 786 are decomposed during the anneal temperature as the temperature rises above the decomposition temperatures.

Mixing the first polymer material and the second polymer material induces formation of a pad-level polymer material layer 979 including a blend of first polymer material and the second polymer material. Generally, the blend of the first polymer material and the second polymer material can be formed by annealing the first polymer material layer 974 and the second polymer material layer 774 at an elevated temperature in a range from 200 degrees Celsius to 400 degrees Celsius, such as from 200 degrees Celsius to 250 degrees Celsius.

Each first bonding pad 988 can be laterally surrounded by a first pad-level dielectric layer 971, which includes a combination of the first pad-level silicon-containing dielectric layer 972 and a first portion 979A of the pad-level polymer material layer 979 located on the first-semiconductor-die side of the horizontal plane including the bonding interfaces between the first bonding pads 988 and the second bonding pads 788. Each second bonding pad 788 can be laterally surrounded by a second pad-level dielectric layer 771, which includes a combination of the second pad-level silicon-containing dielectric layer 772 and a second portion 979B of the pad-level polymer material layer 979 located on the second-semiconductor-die side of the horizontal plane including the bonding interfaces between the first bonding pads 988 and the second bonding pads 788. Depending on the degree of intermixing of the first polymer material and the second polymer material in the pad-level polymer material layer 979, the pad-level polymer material layer 979 may have a homogeneous composition throughout, or may have a vertically-graded composition in which the molecular percentage of the first polymer material decreases with a vertical distance from the first substrate 908, and the molecular percentage of the second polymer material decreases with a vertical distance from the second substrate 708.

Optionally, additional process steps of FIG. 9 may be performed to form through-substrate contact via structures 714 and/or additional bonding structures.

Referring to FIGS. 28-37 and according to various embodiments of the present disclosure, a bonded assembly (900, 700) is provided, which comprises: a first semiconductor die 900 comprising a first substrate 908, first semiconductor devices 920, and first bonding pads 988 that are electrically connected to a respective node of the first semiconductor devices 920; a second semiconductor die 700 comprising a second substrate 708, second semiconductor devices 720, and second bonding pads 788 that are electrically connected to a respective node of the second semiconductor devices 720; and a pad-level polymer material layer 979 including a blend of two miscible polymer materials laterally surrounding the first bonding pads 988 and the second bonding pads 788.

In one embodiment, the bonded assembly (900, 700) further comprises: a first pad-level silicon-containing dielectric layer 972 laterally surrounding portions of the first bonding pads 988 that are proximal to the first substrate 908; and a second pad-level silicon-containing dielectric layer 772 laterally surrounding portions of the second bonding pads 788 that are proximal to the second substrate 708. In one embodiment, the pad-level polymer material layer 979 contacts portions of sidewalls of the first bonding pads 988 that are distal from the first substrate 908, and contacts portions of sidewalls of the second bonding pads 788 that are distal from the second substrate 708. The pad-level polymer material layer 979 can contact horizontal surfaces of the first pad-level silicon-containing dielectric layer 972 and the second pad-level silicon-containing dielectric layer 772, and may have a homogeneous composition or a compositional gradient therein. In one embodiment, the pad-level polymer material layer 979 has a compositional gradient such that a concentration of a first polymer material of the two miscible polymer materials decreases with a distance from the first substrate 908.

In one embodiment, the two miscible polymer materials can be selected from: a combination of styrene maleic anhydride (SMA) and tetra-glycidyl ether of diphenyl diamino methane (TGDDM); a combination of maleic anhydride grafted polypropylene (PP-g-MA) and tetra-glycidyl ether of diphenyl diamino methane (TGDDM); or a combination of poly(methyl methacrylate) (PMMA) and polyvinylidene fluoride (PVDF).

Figure 38:
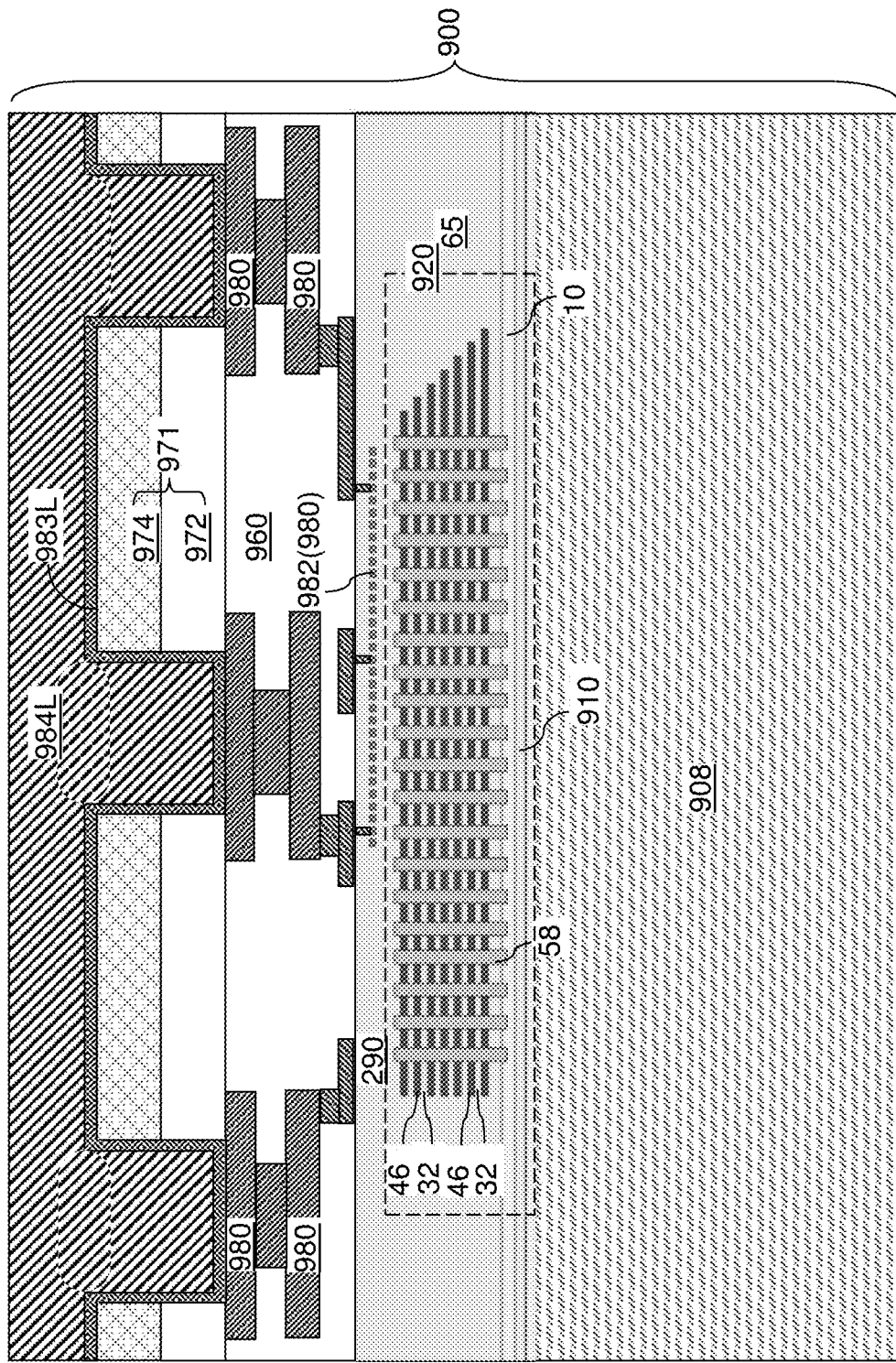
FIG. 38 is a schematic vertical cross-sectional view of a first semiconductor die after formation of a first pad-level silicon-containing dielectric layer, a first polymer material layer, a first metallic barrier liner layer, and a first metallic fill material layer according to a fourth embodiment of the present disclosure.

Referring to FIG. 38, first semiconductor die 900 according to a fourth embodiment of the present disclosure is illustrated, which may be the same as the first semiconductor die 900 of FIG. 21.

Figure 39:
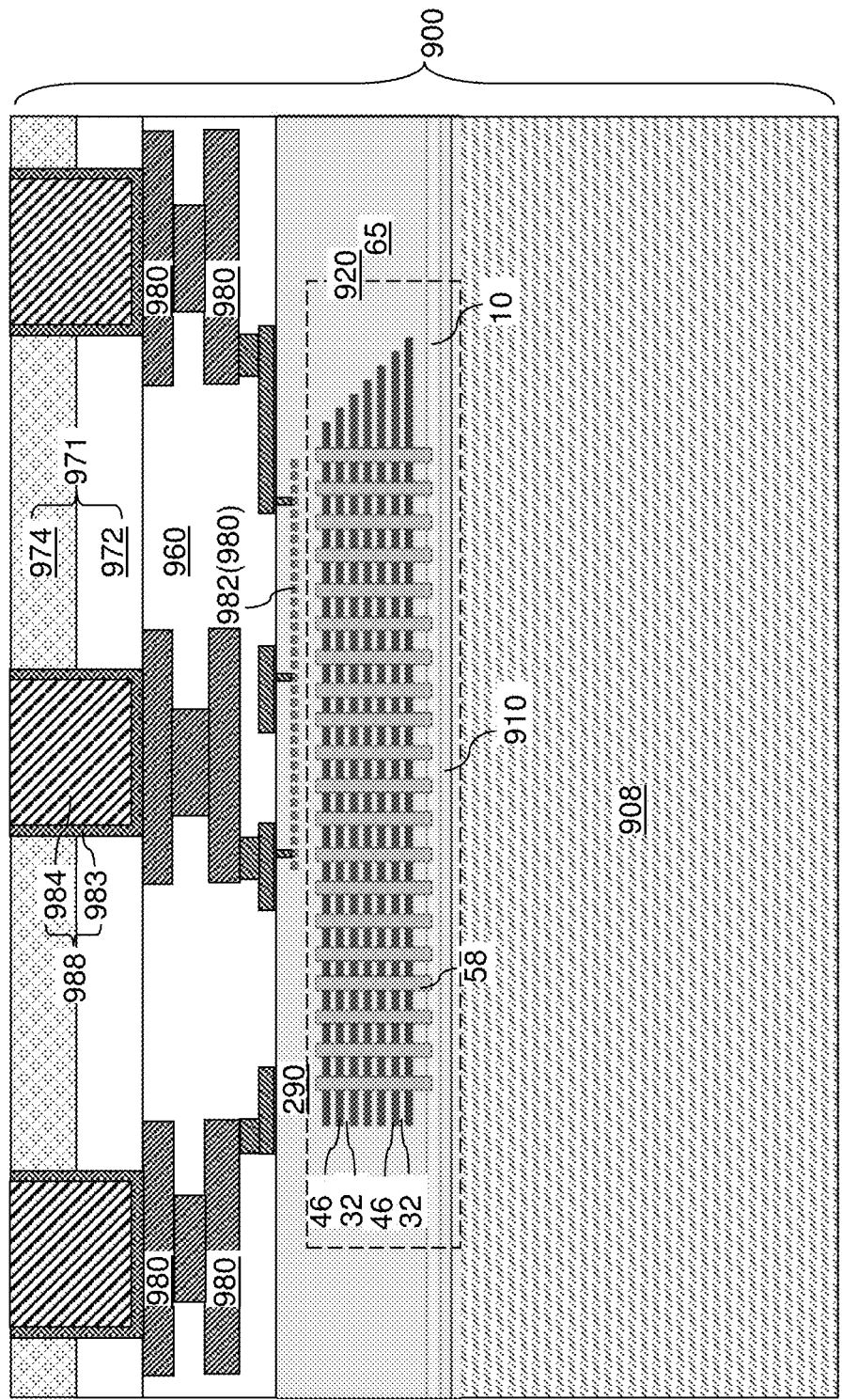
FIG. 39 is a schematic vertical cross-sectional view of the first semiconductor die after formation of first bonding pads according to the fourth embodiment of the present disclosure.

Referring to FIG. 39, the processing steps of FIG. 22 can be performed to form first bonding pads 988. Generally, a first semiconductor die 900 is provided, which comprises a first substrate 908, first semiconductor devices 920, and first bonding pads 988 that are electrically connected to a respective node of the first semiconductor devices 920 and laterally surrounded by a first pad-level dielectric layer 971. The pad-level dielectric layer 971 comprises a stack of a first pad-level silicon-containing dielectric layer 972 and a first polymer material layer 974 including a first polymer material, such as polyimide.

Figure 40:
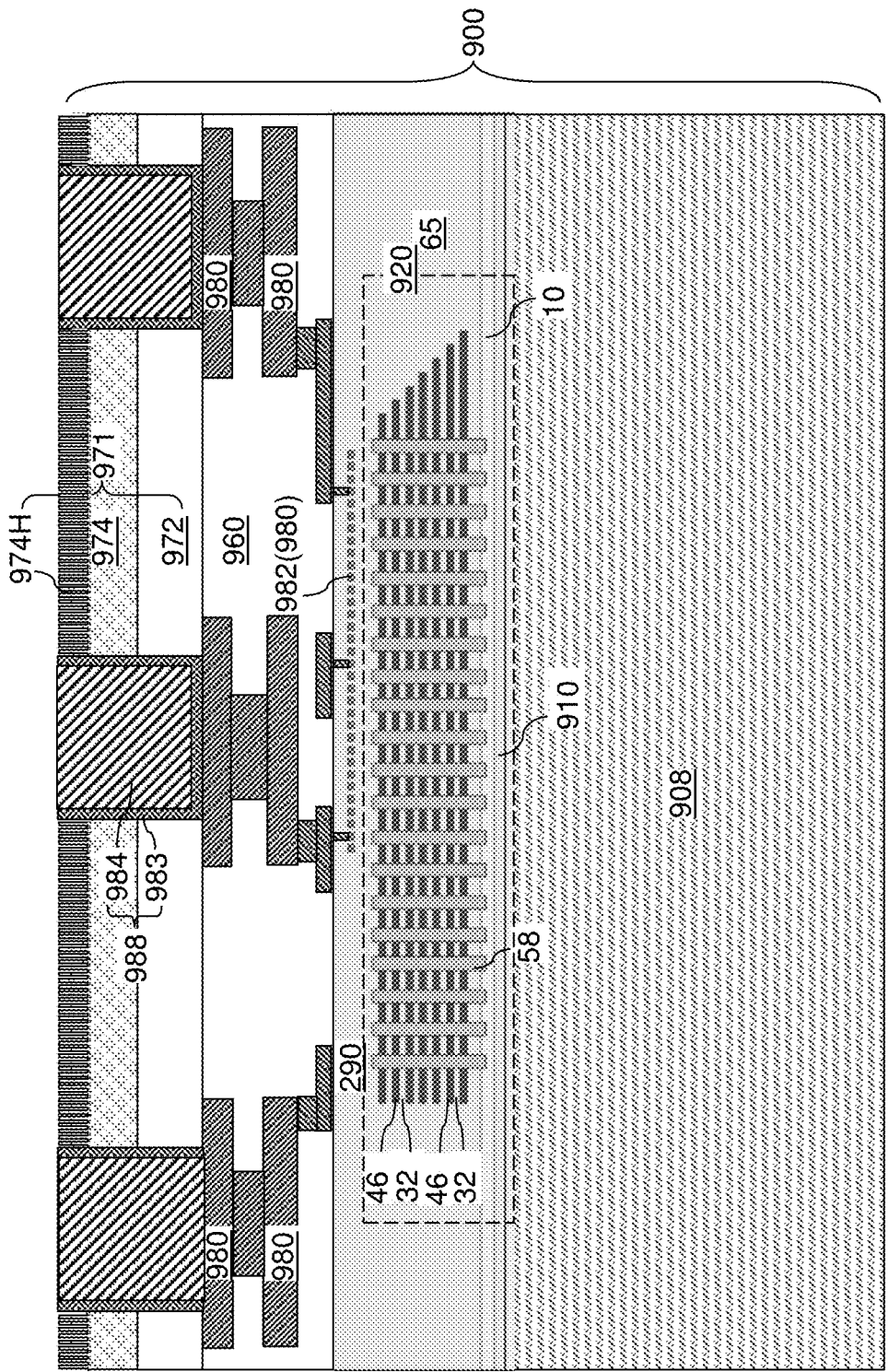
FIG. 40 is a schematic vertical cross-sectional view of the first semiconductor die after formation of first polymer hairs according to the fourth embodiment of the present disclosure.

Referring to FIG. 40, a surface portion of the first polymer material layer 974 can be patterned to form first polymer hairs (i.e., flexible, micron sized pillars) 974H. For example, the surface portion of the first polymer material layer 974 can be patterned by stamping employing a stamp that has a pattern in areas located outside the areas of the first bonding pads 988. The stamp can include vertical pillar cavities outside the areas of the first bonding pads 988, and can have recessed surfaces in the areas of the first bonding pads 988 to avoid contact with the first bonding pads 988. Alternatively, the first polymer hairs 947H may be formed by photolithography and etching.

In one embodiment, the first polymer hairs 974H extend from a horizontal surface of the first polymer material layer 974, and provides enhanced adhesion to a second pad-level dielectric layer of a second semiconductor die through Van der Waals force and/or through capillary interaction during a bonding process to be subsequently performed. If the first polymer hairs 974H are cylindrical (i.e., have a substantially circular horizontal cross-sectional shape), then they each may have a diameter from 0.1 microns to 10 microns, such as 0.2-4 microns, a height from 0.1 microns to 5 microns, such as 0.15-2 microns, and periodicity from 0.2 microns to 10 microns, such as 0.4-4.5 microns. If the hairs 974H are not cylindrical (e.g., have a polygonal, oval or irregular shape), then they may have a maximum width from 0.1 microns to 10 microns, such as 0.2-4 microns. In one embodiment, the first polymer hairs 974H have as an average center-to-center nearest neighbor distance in a range from 0.1 micron to 10 microns, and have an average width in a range from 0.01 times the average center-to-center nearest neighbor distance to 0.3 times the average center-to-center nearest neighbor distance. The first polymer hairs 974H may have an average length in a range from 3 times the average width to 1,000 times the average width, such as from 6 times the average width to 30 times the average width.

Figure 41:
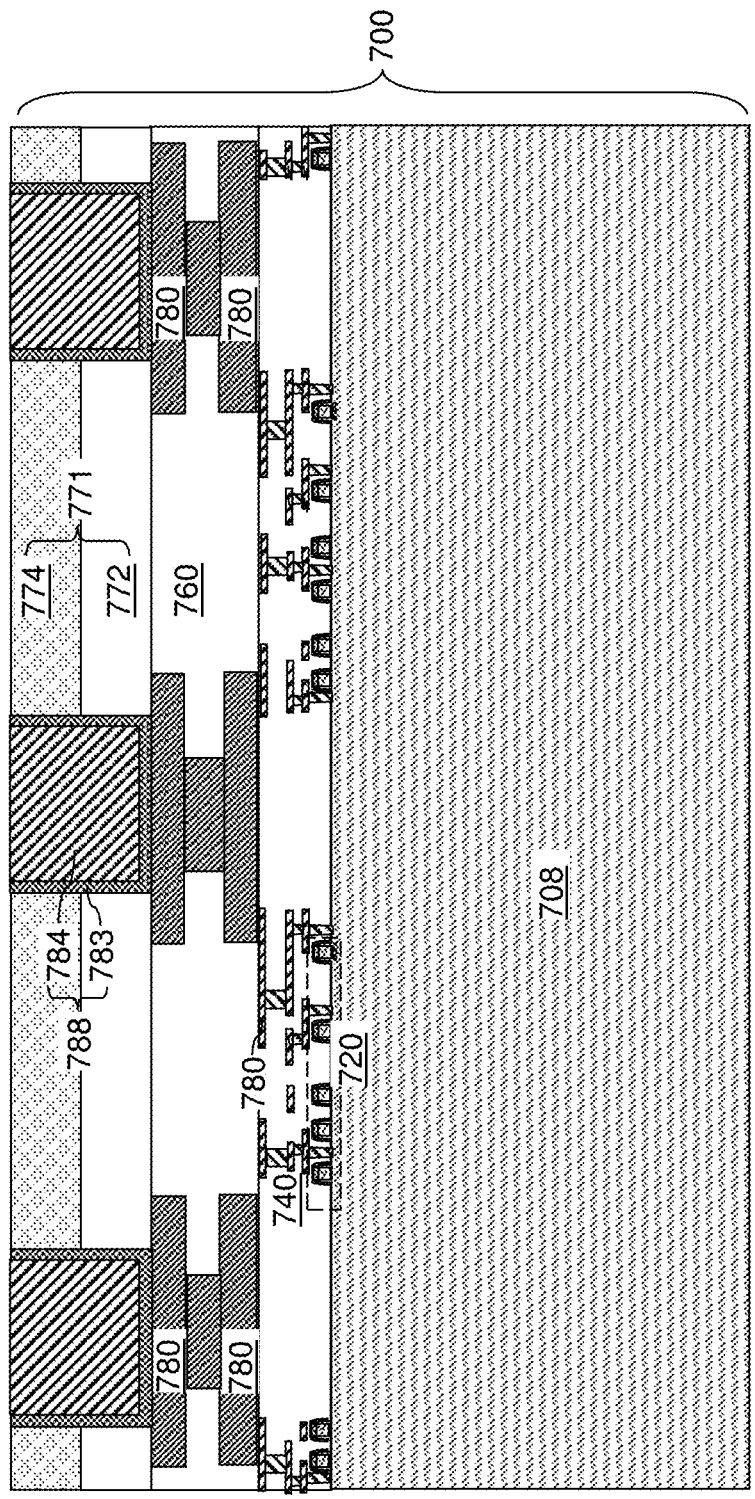
FIG. 41 is a schematic vertical cross-sectional view of a second semiconductor die after formation of second bonding pads according to the fourth embodiment of the present disclosure.

Referring to FIG. 41, a second semiconductor die 700 according to the fourth embodiment of the present disclosure is illustrated, which can be structurally the same as the second semiconductor die 700 of FIG. 32 except that the second polymer material of the second polymer material layer 774 can be any polymer material. In other words, the selection of the second semiconductor material in the second polymer material layer 774 is not limited by the material composition of the first polymer material in the first polymer material layer 974 or the first polymer hairs 974H.

Figure 42:
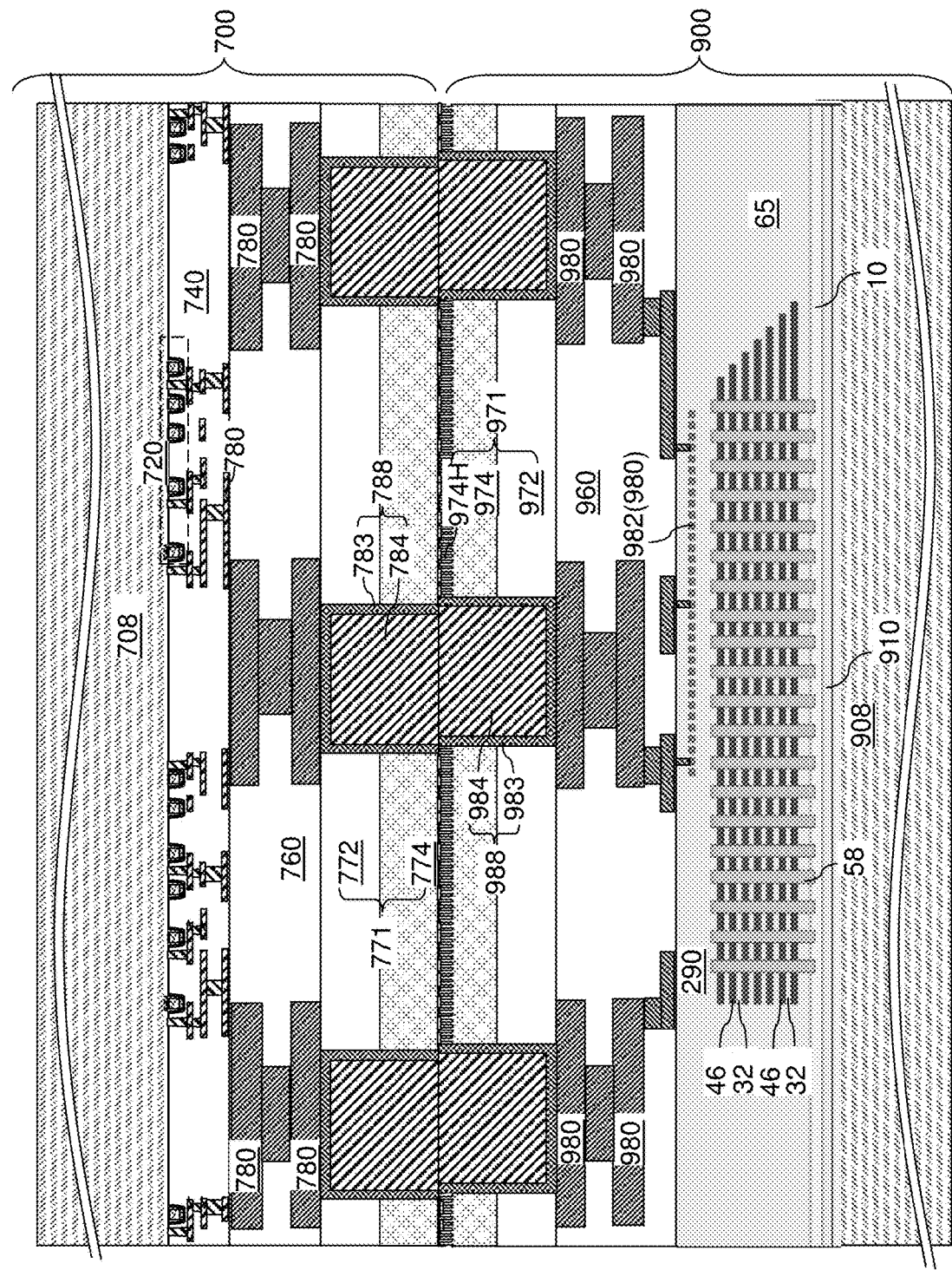
FIG. 42 is a schematic vertical cross-sectional view of a fourth exemplary structure including the first semiconductor die and the second semiconductor die after bonding the second bonding pads to the first bonding pads according to the fourth embodiment of the present disclosure.

Referring to FIG. 42, the first semiconductor die 900 of FIG. 40 and the second semiconductor die 700 of FIG. 41 are oriented such that each of the first bonding pads 988 faces a respective one of the second bonding pads 788. The second semiconductor die 700 and the first semiconductor die 900 are brought into contact such that the second pad-level dielectric layer 771 contacts the first polymer hairs 974H. The first semiconductor die 900 and the second semiconductor die 700 may be laterally aligned such that each second bonding pad 788 contacts a respective one of the first bonding pads 988. In one embodiment, the pattern of the second bonding pads 788 may be a mirror image of the pattern of the first bonding pads 988 with optional differences in the size of bonding pads between the first semiconductor die 900 and the second semiconductor die 700. In one embodiment, the first bonding pads 988 and the corresponding second bonding pads 788 may have the same size (i.e., lateral width). In another embodiment, the first bonding pads 988 and the corresponding second bonding pads 788 may have different sizes. In one embodiment, areal overlap between each facing pair of a first bonding pad 988 and a second bonding pad 788 may be at least 80%, and/or at least 90%, such as 90 to 100%, of the area of the smaller one of the first bonding pad 988 and the second bonding pad 788.

Subsequently, the second bonding pads 788 may be bonded to the first bonding pads 988 by performing an anneal process that induces metal-to-metal bonding between the second bonding pads 788 and the first bonding pads 988. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius. The first polymer hairs 974H adhere to the surface of the second polymer material layer 774 within the second pad-level dielectric layer 771 through Van der Waals force and/or through capillary interaction.

The first polymer hairs 974H can collectively provide significant adhesion to the second pad-level dielectric layer 771. While each first polymer hair 974H produces miniscule force on the order of $10^{-7}$ Newtons, the number of first polymer hairs 974H that can be packed within the area of 1 $cm^2$ can be in a range from $10^6$ to $10^{10}$. Thus, the adhesive force of the first polymer hair 974H can be in a range from 0.1 Newton per $cm^2$ to 1,000 Newtons per $cm^2$, such as 1 to 5 Newtons per $cm^2$, or 1,000 Pascal to $1.0 \times 10^7$ Pascal.

Optionally, additional process steps of FIG. 9 may be performed to form through-substrate contact via structures 714 and/or additional bonding structures.

Figure 43:
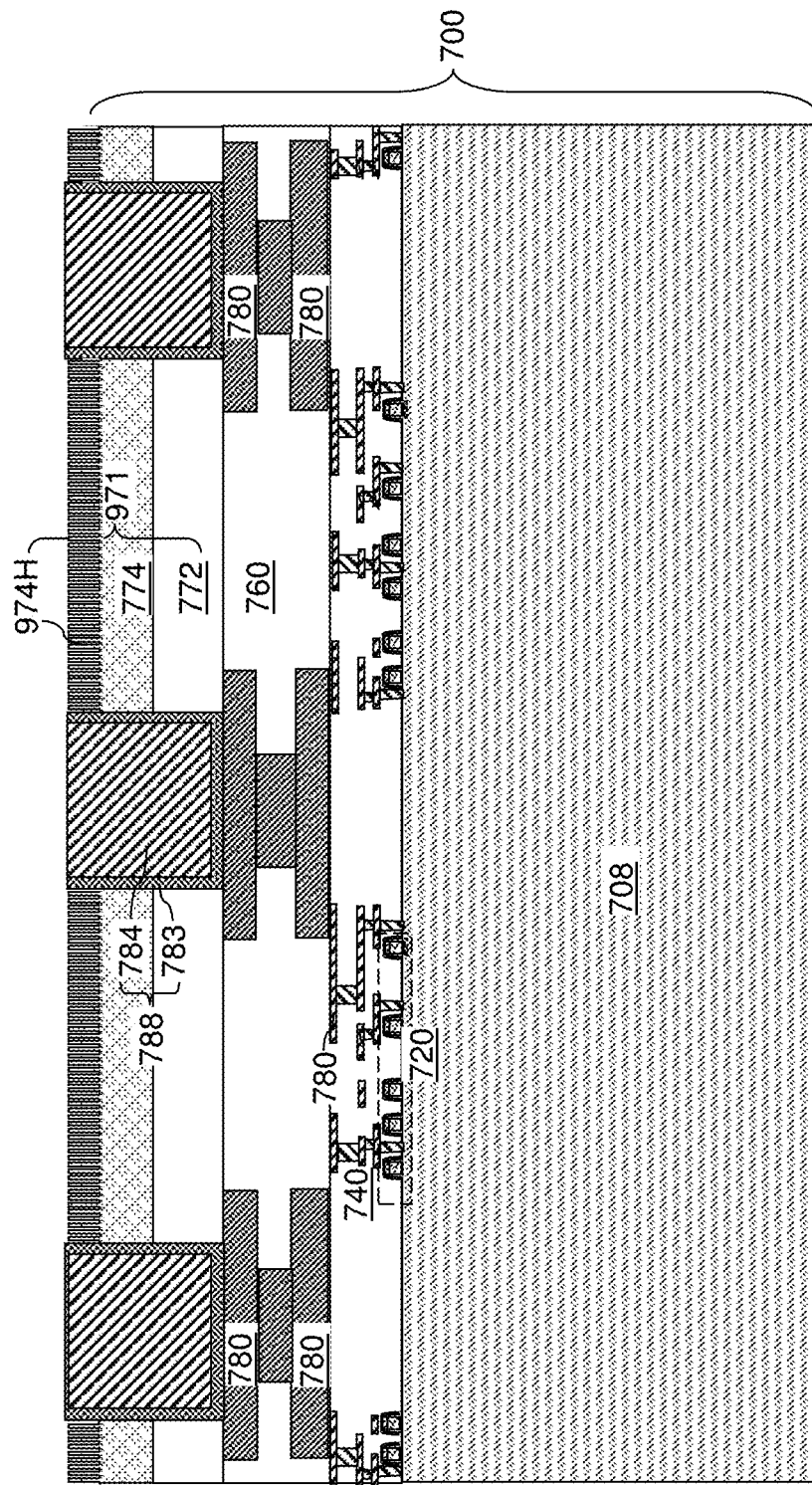
FIG. 43 is a schematic vertical cross-sectional view of an alternative configuration of the second semiconductor die after formation of second polymer hairs according to the fourth embodiment of the present disclosure.

Referring to FIG. 43, an alternate configuration of the second semiconductor die 700 according to the fourth embodiment of the present disclosure is illustrated. The alternate configuration of the second semiconductor die 700 can be derived from the second semiconductor die 700 of FIG. 41 by patterning the second polymer material layer 774, thereby forming the second polymer hairs 774H. The same stamping or photolithography and etching method can be employed as the method employed at the processing steps of FIG. 40. The second polymer hairs 774H can have the same range of dimensions for the average center-to-center nearest neighbor distance, the average width, and the average length as the first polymer hairs of 974H.

Figure 44:
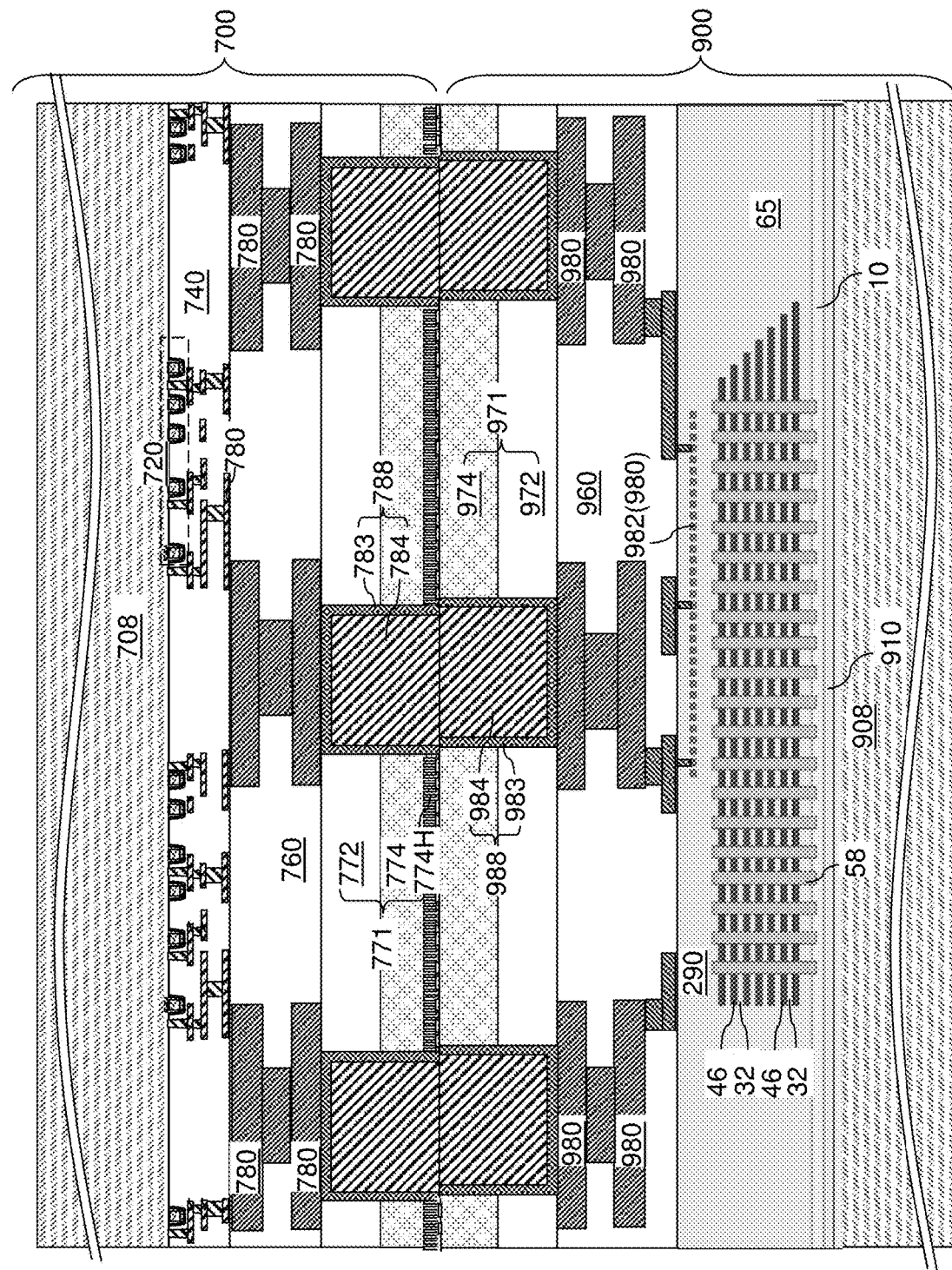
FIG. 44 is a schematic vertical cross-sectional view of a first alternative configuration of the fourth exemplary structure including the first semiconductor die and the second semiconductor die after bonding the second bonding pads to the first bonding pads according to the fourth embodiment of the present disclosure.

Referring to FIG. 44, a first alternative configuration of the fourth exemplary structure is illustrated. In this case, the first semiconductor die 900 of FIG. 39 and the second semiconductor die 700 of FIG. 43 including the second polymer hairs 774H can be bonded to each other by performing the processing steps of FIG. 42. The second polymer hairs 774H can collectively provide significant adhesion to the first pad-level dielectric layer 971 through Van der Waals force and/or through capillary interaction.

Figure 45:
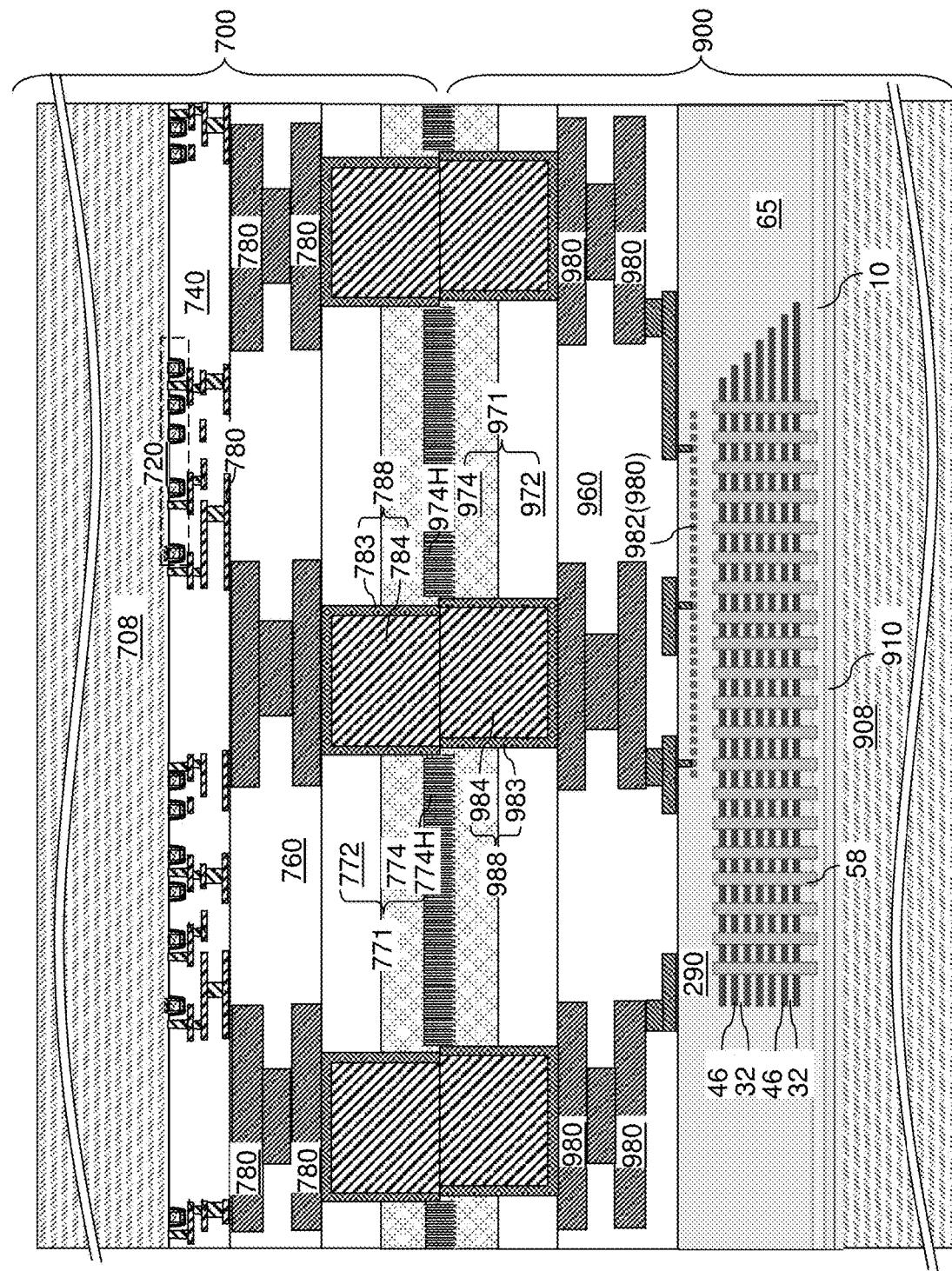
FIG. 45 is a schematic vertical cross-sectional view of a second alternative configuration of the fourth exemplary structure including the first semiconductor die and the second semiconductor die after bonding the second bonding pads to the first bonding pads according to the fourth embodiment of the present disclosure.

Referring to FIG. 45, a second alternative configuration of the fourth exemplary structure is illustrated. In this case, the first semiconductor die 900 of FIG. 40 including the first polymer hairs 974H and the second semiconductor die 700 of FIG. 43 including the second polymer hairs 774H can be bonded to each other by performing the processing steps of FIG. 42. The first polymer hairs 974H can collectively provide significant adhesion to the second pad-level dielectric layer 771 through Van der Waals force and/or through capillary interaction. The second polymer hairs 774H can collectively provide significant adhesion to the first pad-level dielectric layer 971 through Van der Waals force and/or through capillary interaction. Further, the first polymer hairs 974H and the second polymer hairs 774H can provide mutual adhesion to each other through Van der Waals force and/or through capillary interaction. Enmeshing of the first polymer hairs 974H with the second polymer hairs 774H can further enhance adhesion between the first polymer hairs 974H with the second polymer hairs 774H.

Figure 46:
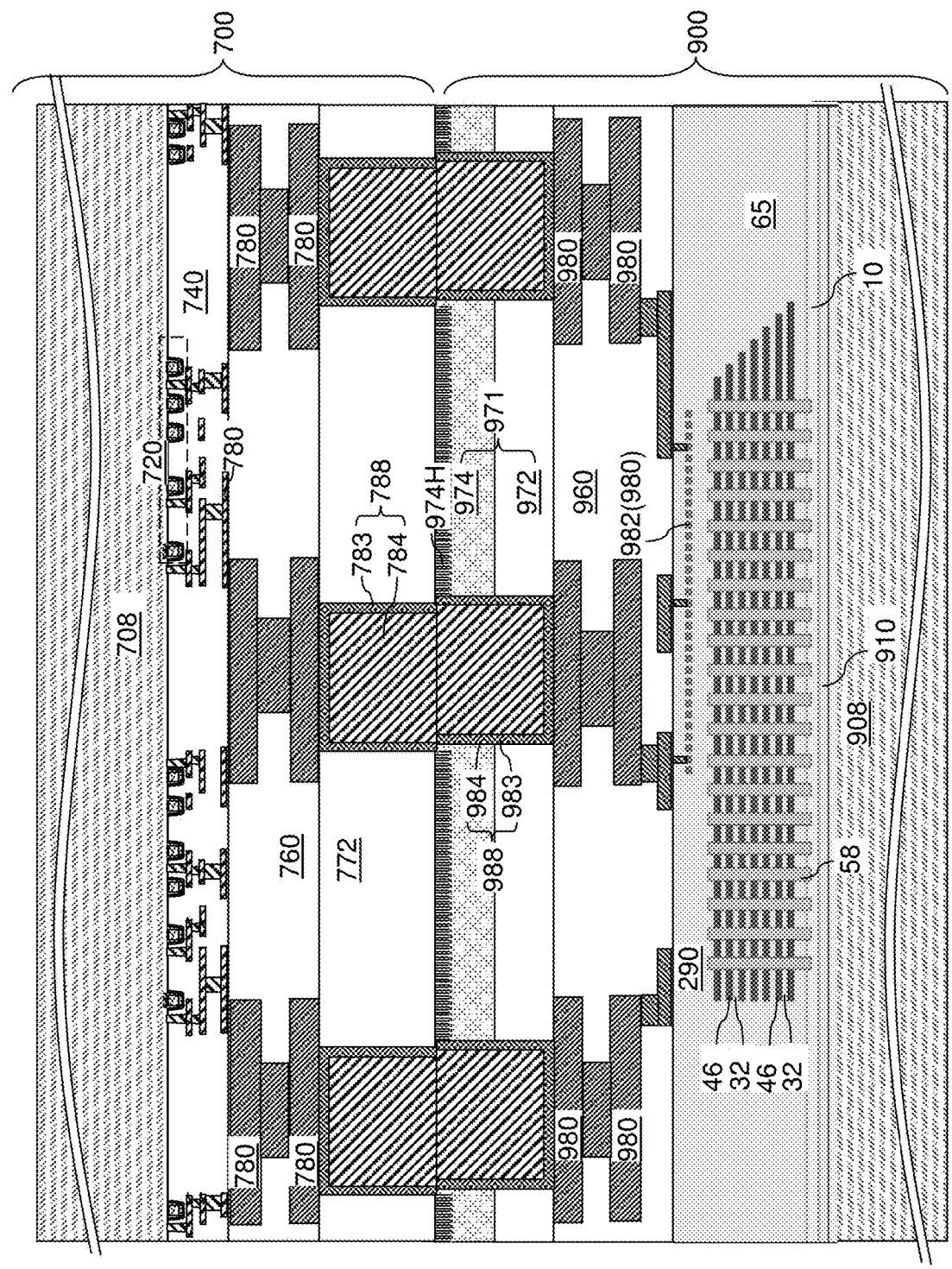
FIG. 46 is a schematic vertical cross-sectional view of a third alternative configuration of the fourth exemplary structure including the first semiconductor die and the second semiconductor die after bonding the second bonding pads to the first bonding pads according to the fourth embodiment of the present disclosure.

While embodiments described above employ two polymer material layers (974, 774) provided on two different semiconductor dies (900, 700), embodiments of the present disclosure can be performed employing only one polymer material layer provided on a semiconductor die. Referring to FIG. 46, an alternative embodiment of the second exemplary structure is illustrated, which can be formed employing the first semiconductor die 900 of FIG. 40, and by employing a second semiconductor die 700 in which a second pad-level dielectric layer excludes a polymer layer and contains only the second pad-level silicon-containing dielectric layer 772 (such as a silicon oxide layer).

In this case, the first bonding pads 988 are bonded to the second bonding pads 788 while the first polymer hairs 974H contact the second pad-level silicon-containing dielectric layer 772. Thus, the first polymer hairs 974H can contact the material of the second pad-level silicon-containing dielectric layer 772 (such as silicon oxide) while the first bonding pads 988 are bonded to the second bonding pads 788. The first polymer hairs 974H can collectively provide significant adhesion to the second pad-level silicon-containing dielectric layer 772 through Van der Waals force and/or through capillary interaction.

Optionally, additional process steps of FIG. 9 may be performed to form through-substrate contact via structures 714 and/or additional bonding structures.

Optionally, a first self-assembled monolayer (SAM) material having a first tail group can be selectively formed on physically exposed surfaces of the first bonding pads 988 while suppressing deposition of the first SAM material on the first polymer material layer 974 and/or the first polymer hairs 974H prior to the bonding process. Additionally or alternatively, a second SAM material having a second tail group can be selectively formed on physically exposed surfaces of the second bonding pads 788 while suppressing deposition of the second SAM material on the second polymer material layer 774 and/or the second polymer hairs 774H. In some embodiment, the second tail group can have affinity to the first tail group to facilitate alignment of the second bonding pads 788 to the first bonding pads 988. The first SAM material and the second SAM material can be decomposed during bonding.

Referring to FIGS. 38-46 and according to various embodiments of the present disclosure, a bonded assembly (900, 700) is provided, which comprises: a first semiconductor die 900 comprising a first substrate 908, first semiconductor devices 920, and first bonding pads 988 that are electrically connected to a respective node of the first semiconductor devices 920 and laterally surrounded by a first pad-level dielectric layer 971, wherein the first pad-level dielectric layer 971 comprises a first polymer material layer 974 and first polymer hairs 974H extending from a horizontal surface of the first polymer material layer 974, having a diameter or maximum width from 0.1 microns to 10 microns, a height from 0.1 microns to 5 microns, and periodicity from 0.2 microns to 10 microns; and a second semiconductor die 700 comprising a second substrate 708, second semiconductor devices 720, and second bonding pads 788 that are electrically connected to a respective node of the second semiconductor devices 720 and laterally surrounded by a second pad-level dielectric layer 971, wherein each of the second bonding pads 788 is bonded to a respective one of the first bonding pads 988, and the first polymer hairs 974H contact the second pad-level dielectric layer 771.

In one embodiment, the first polymer hairs have the diameter or maximum width from 0.2 microns to 4 microns, the height from 0.15 microns to 2 microns, and the periodicity from 0.4 microns to 4.5 microns. In one embodiment, the first pad-level dielectric layer comprises a first pad-level silicon-containing dielectric layer laterally surrounding portions of the first bonding pads that are proximal to the first substrate, and contacting the first polymer hairs. In another embodiment, the second pad-level dielectric layer comprises a second polymer material layer.

Figure 47:
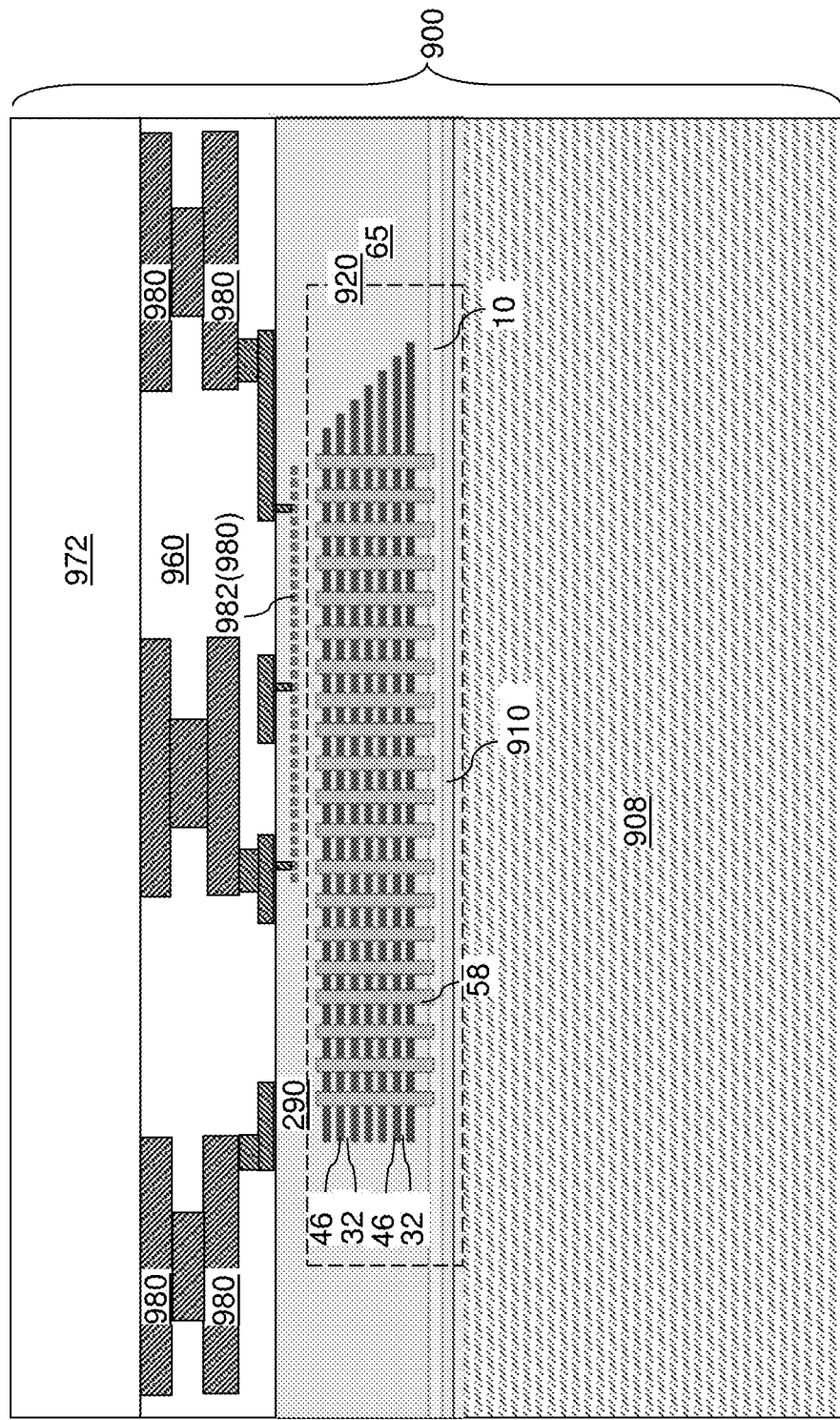
FIG. 47 is a schematic vertical cross-sectional view of the first semiconductor die after formation of a first pad-level silicon-containing dielectric layer according to the fifth embodiment of the present disclosure.

Referring to FIG. 47, a first semiconductor die 900 according to the fifth embodiment of the present disclosure is illustrated, which can be derived from the first semiconductor die 900 of FIG. 10 by forming a first pad-level silicon-containing dielectric layer 972. The first pad-level silicon-containing dielectric layer 972 includes a silicon-containing dielectric material such as silicon oxide, silicon nitride, silicon carbon nitride, silicon oxynitride, or any other dielectric material that includes silicon atoms at an atomic percentage greater than 10%. The first pad-level silicon-containing dielectric layer 972 can be deposited by chemical vapor deposition, spin coating, and/or physical vapor deposition, and may have a thickness in a range from 1,000 nm to 10,000 nm, although lesser and greater thicknesses can also be employed.

Figure 48:
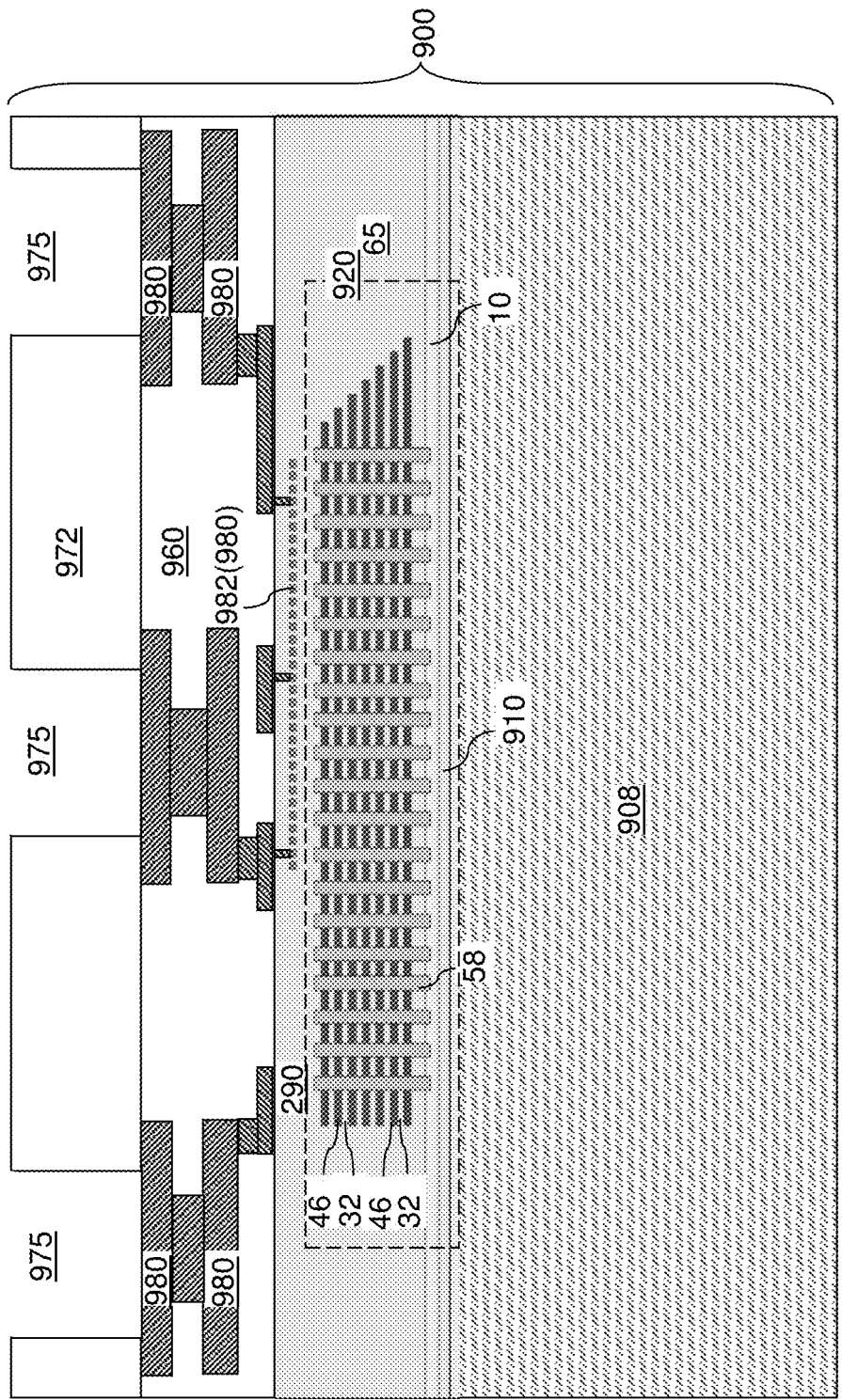
FIG. 48 is a schematic vertical cross-sectional view of the first semiconductor die after formation of first pad cavities according to the fifth embodiment of the present disclosure.

Referring to FIG. 48, a first photoresist layer (not shown) can be applied over the first pad-level silicon-containing dielectric layer 972, and can be lithographically patterned to form an array of discrete openings in areas that overlie a respective one of the topmost ones of the first metal interconnect structures 980, i.e., a subset of the first metal interconnect structures 980 that is in contact with the bottom surface of the first pad-level silicon-containing dielectric layer 972. The openings in the photoresist layer can have the shapes of bonding pads to be subsequently formed. Each opening in the photoresist layer can have a horizontal cross-sectional shape of a polygon, a circle, an ellipse, or another two-dimensional curvilinear shape having a closed periphery. For example, the openings in the photoresist layer can have rectangular shapes. Each side of the rectangular shapes may have a lateral dimension in a range from 2 microns to 60 microns, such as from 5 micron to 30 microns, although lesser and greater lateral dimensions can also be employed.

An anisotropic etch process can be performed to transfer the pattern in the first photoresist layer through the first pad-level silicon-containing dielectric layer 972. First pad cavities 975 are formed through the first pad-level silicon-containing dielectric layer 972. A top surface of a respective topmost one of the first metal interconnect structures 980 is physically exposed at the bottom of each first pad cavity 975. The first photoresist layer can be subsequently removed, for example, by ashing.

Figure 49:
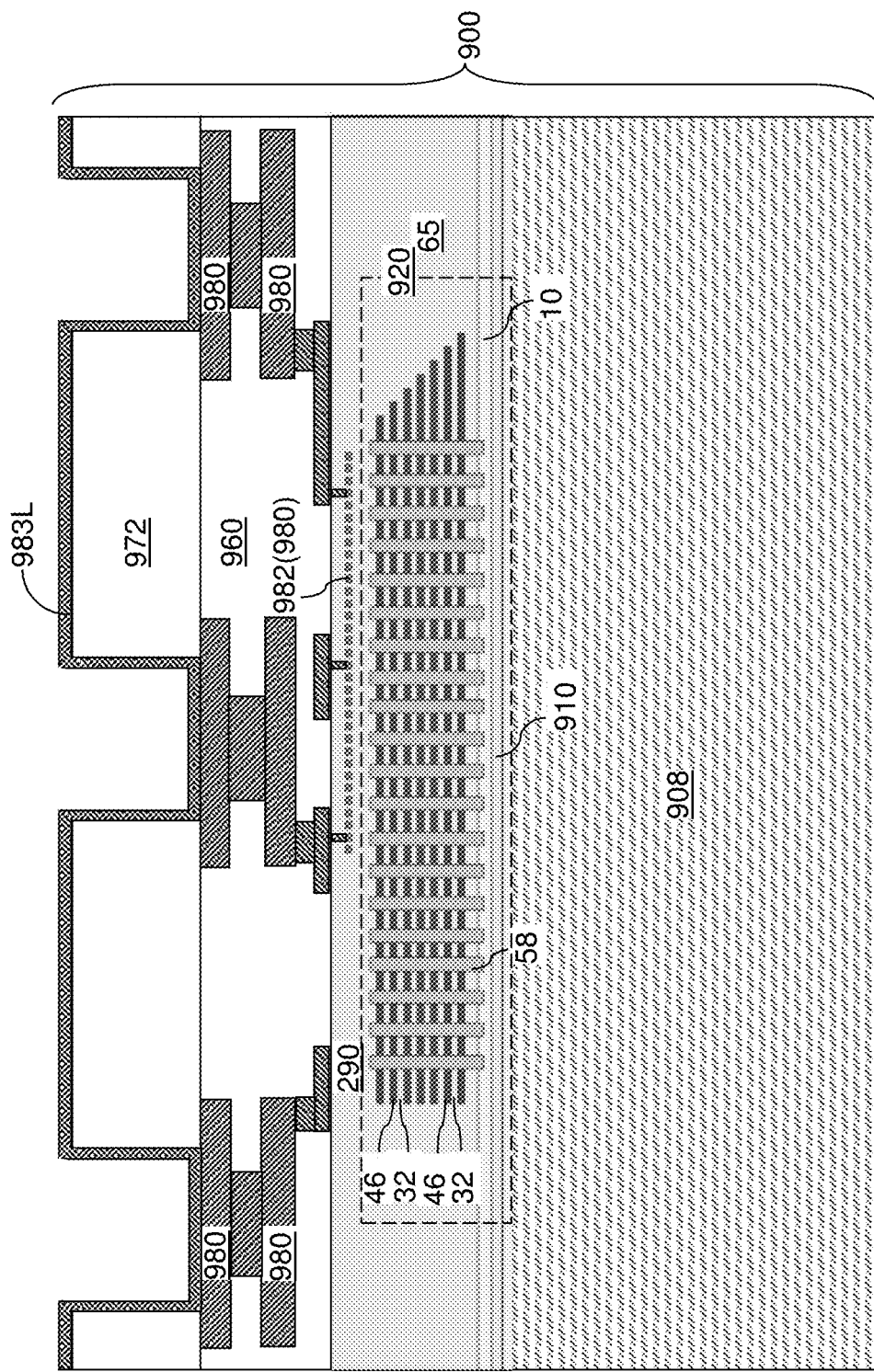
FIG. 49 is a schematic vertical cross-sectional view of the first semiconductor die after formation of a first metallic barrier liner layer according to the fifth embodiment of the present disclosure.

Referring to FIG. 49, a first metallic barrier liner layer 983L can be deposited by a conformal or a non-conformal deposition process. The first metallic barrier liner layer 983L includes a metallic barrier material that functions as a diffusion barrier material for metallic materials, moisture, and impurity atoms. For example, the first metallic barrier liner layer 983L can include TiN, TaN, WN, TiC, TaC, WC, or an alloy of a stack thereof. The first metallic barrier liner layer 983L may be deposited by physical vapor deposition and/or by chemical vapor deposition. The thickness of vertically-extending portions (or tapered portions) of the first metallic barrier liner layer 983L that are in contact with sidewalls of the first pad-level silicon-containing dielectric layer 972 can be in a range from 3 nm to 100 nm, such as from 6 nm to 50 nm, although lesser and greater thicknesses can also be employed.

Figure 50:
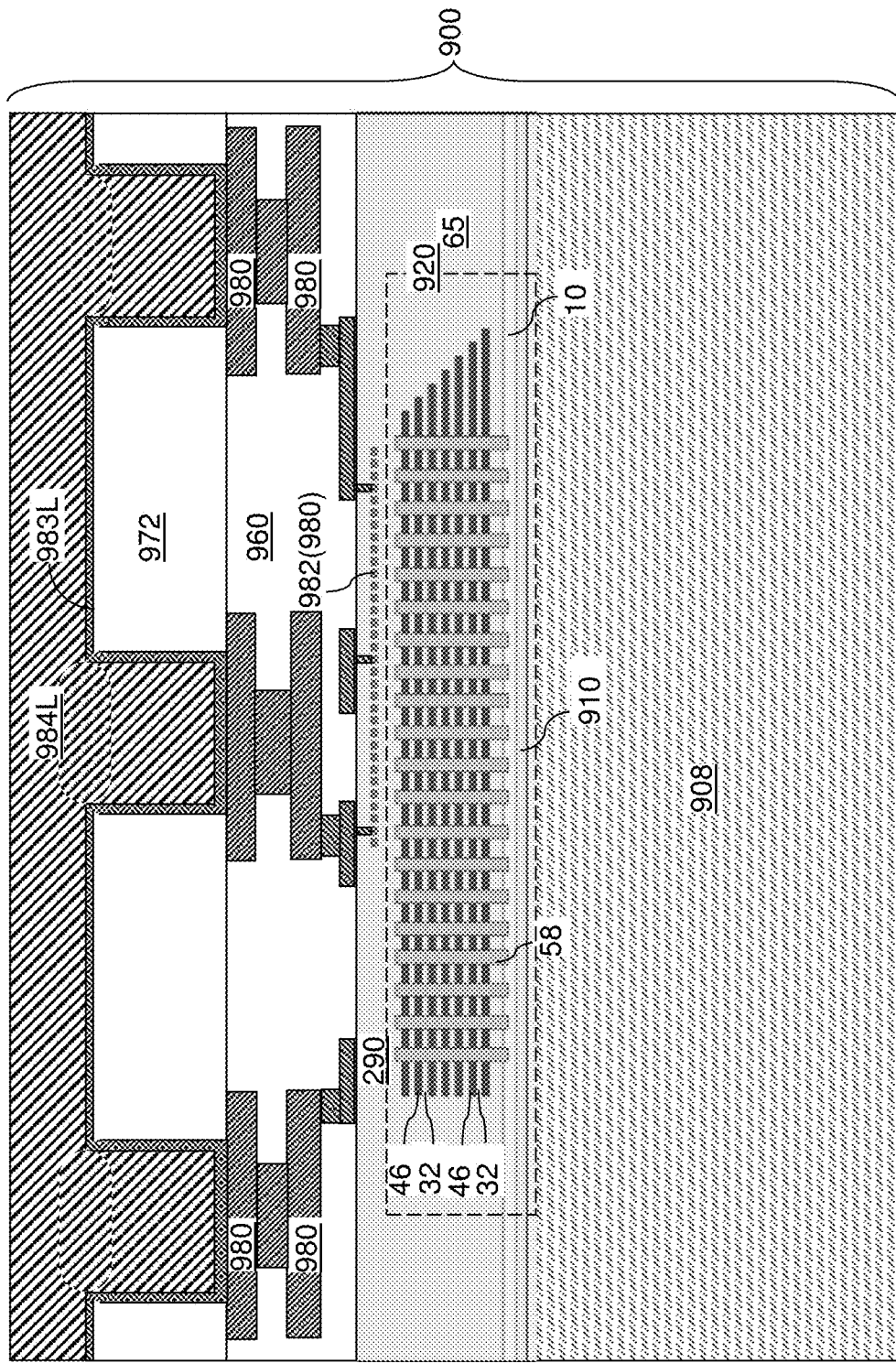
FIG. 50 is a schematic vertical cross-sectional view of the first semiconductor die after formation of a first metallic fill material layer according to the fifth embodiment of the present disclosure.

Referring to FIG. 50, a first metallic fill material layer 984L can be deposited on the first metallic barrier liner 983L. The first metallic fill material layer 984L includes a metallic material that can provide metal-to-metal bonding at an elevated temperature less than 500 degrees Celsius, such as less than 450 degrees Celsius. For example, the first metallic fill material layer 984L can include, and/or can consist essentially of, copper or a copper-containing metallic alloy material. The first metallic fill material layer 984L can be deposited by physical vapor deposition, chemical vapor deposition, electroplating, and/or electroless plating. For example, the first metallic fill material layer 984L can be formed by depositing a metal seed layer by physical vapor deposition, and electroplating an additional metal layer on the metal seed layer. The thickness of the first metallic fill material layer 984L can be selected such that all volumes of the first pad cavities 975 are filled with the metallic material(s) of the first metallic fill material layer 984L.

Figure 51:
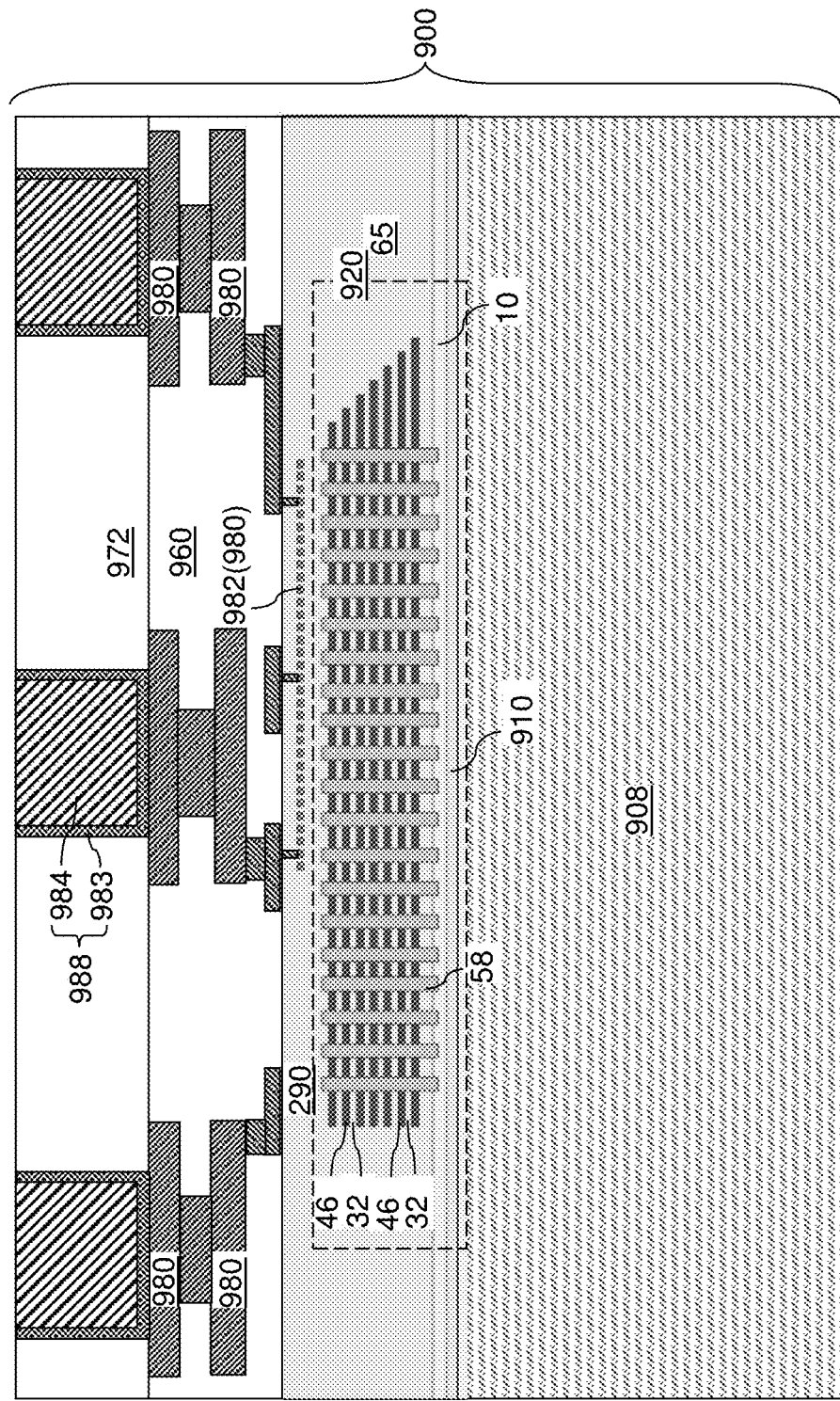
FIG. 51 is a schematic vertical cross-sectional view of the first semiconductor die after formation of first bonding pads according to the fifth embodiment of the present disclosure.

Referring to FIG. 51, a planarization process can be performed to remove portions of the first metallic fill material layer 984L and the first metallic barrier liner layer 983L from above the horizontal plane including the top surface of the first pad-level silicon-containing dielectric layer 972. For example, a chemical mechanical planarization process can be performed to remove the portions of the first metallic fill material layer 984L and the first metallic barrier liner layer 983L that overlie the horizontal plane including the top surface of the first pad-level silicon-containing dielectric layer 972. Each remaining portion of the first metallic fill material layer 984L in a respective first pad cavity 975 constitutes a first metallic fill material portion 984. Each remaining portion of the first metallic barrier liner layer 983L in a respective first pad cavity 975 constitutes a first metallic barrier liner 983. Each contiguous combination of a first metallic barrier liner 983 and a first metallic fill material portion 984 constitutes a first bonding pad 988, which fills a respective one of the first pad cavities 975.

Generally, the first semiconductor die 900 comprises a first substrate 908, first semiconductor devices 920, first bonding pads 988 that are electrically connected to a respective node of the first semiconductor devices 920 and laterally surrounded by a first pad-level dielectric layer as embodied as the first pad-level silicon-containing dielectric layer 972.

Figure 52:
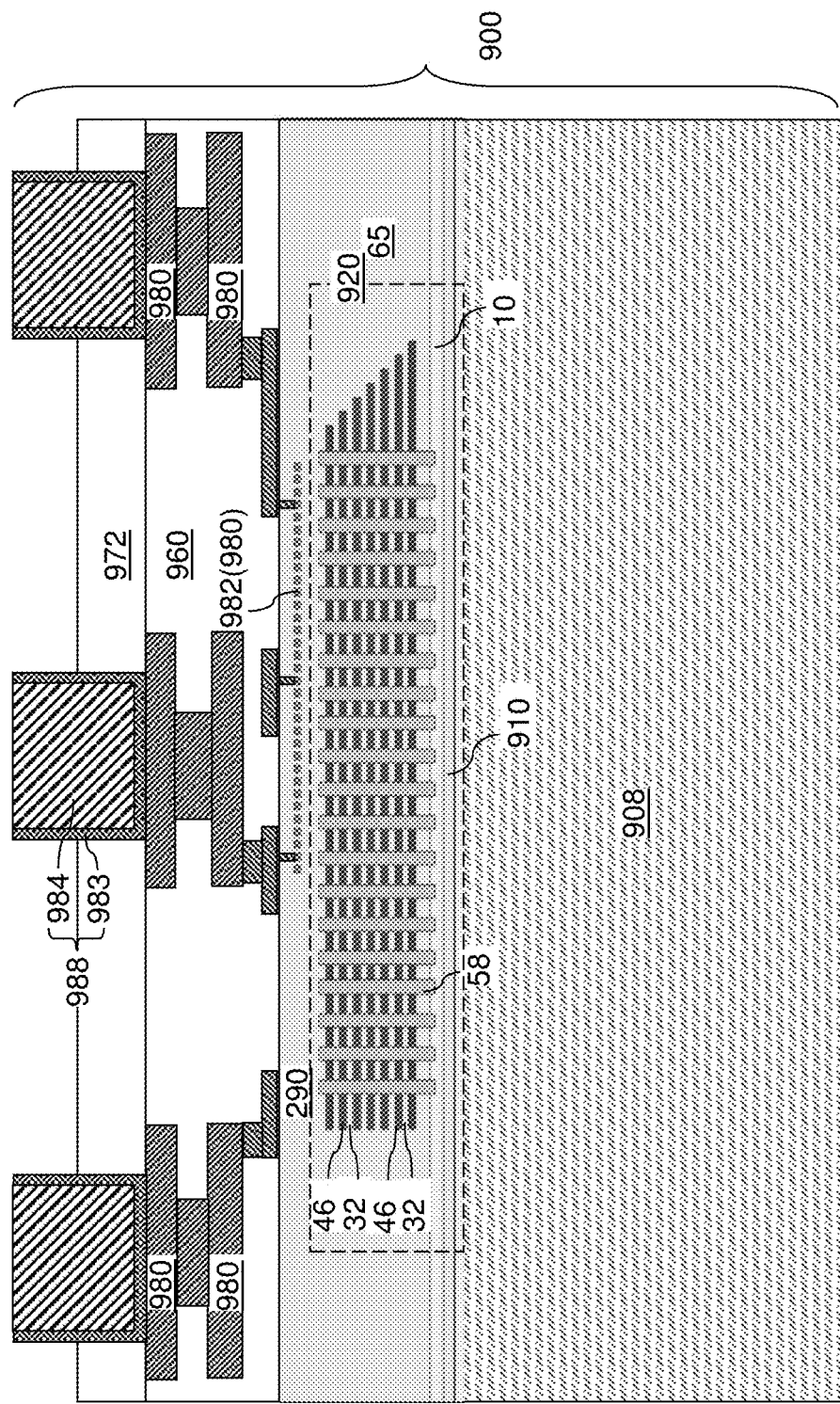
FIG. 52 is a schematic vertical cross-sectional view of the first semiconductor die after recessing the first pad-level silicon-containing dielectric layer according to the fifth embodiment of the present disclosure.

Referring to FIG. 52, the dielectric material of the first pad-level silicon-containing dielectric layer 972 can be vertically recessed to physically expose sidewalls of the first bonding pads 988. For example, a wet etch process can be performed to vertically recess the horizontal top surface of the first pad-level silicon-containing dielectric layer 972. In an illustrative example, if the first pad-level silicon-containing dielectric layer 972 includes silicon oxide, a wet etch process employing hydrofluoric acid can be performed to vertically recess the first pad-level silicon-containing dielectric layer 972. In another example, if the first pad-level silicon-containing dielectric layer 972 includes silicon nitride, a wet etch process employing hot phosphoric acid can be performed to vertically recess the first pad-level silicon-containing dielectric layer 972. The vertical recess distance of the etch process can be in a range from 200 nm to 6,000 nm, such as from 500 nm to 2,500 nm, although lesser and greater thicknesses can also be employed.

Figure 53:
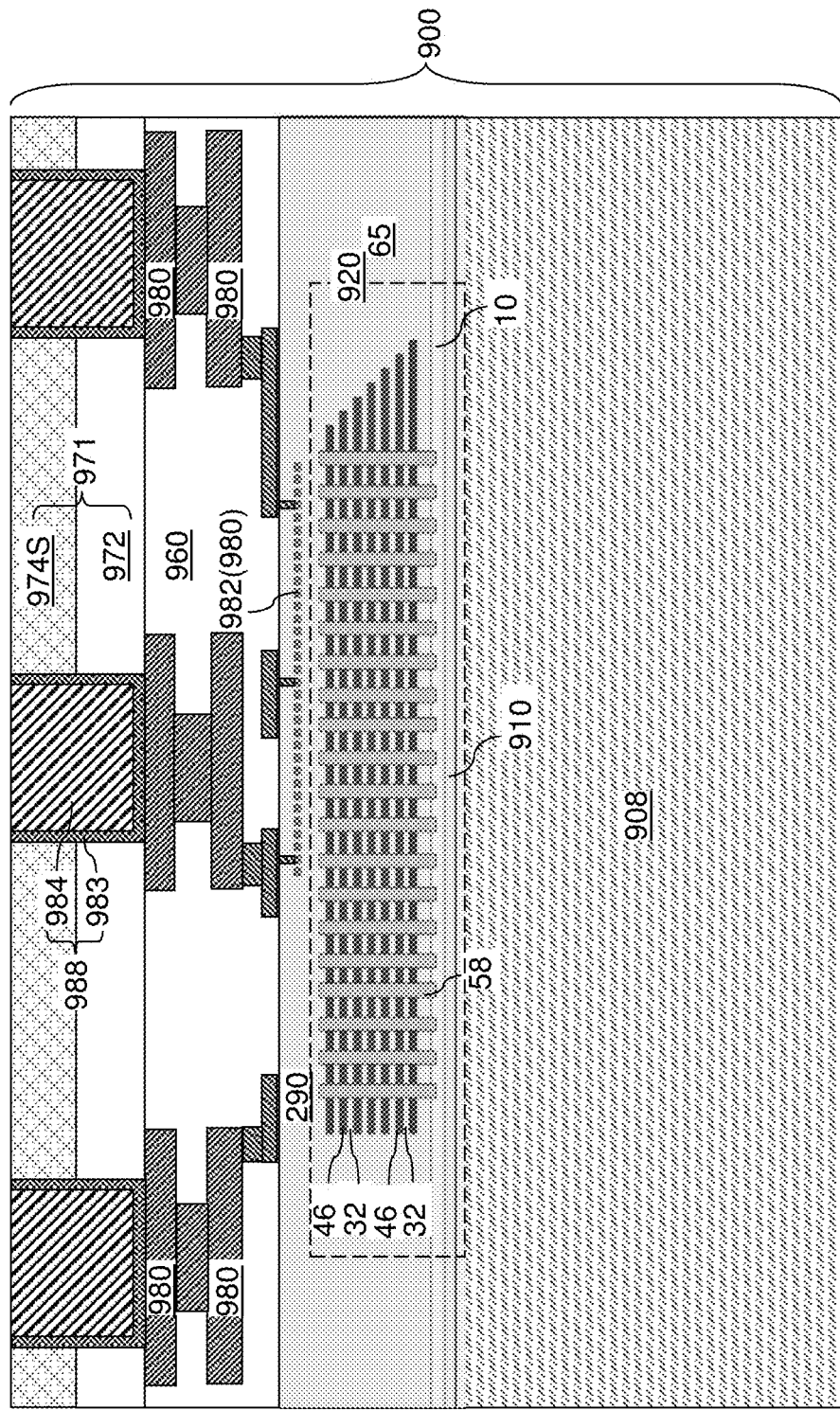
FIG. 53 is a schematic vertical cross-sectional view of the first semiconductor die after formation of a first polymer material layer according to the fifth embodiment of the present disclosure.

Referring to FIG. 53, a first polymer material can be applied over the first pad-level silicon-containing dielectric layer 972 to form a first polymer material layer 974. The first polymer material may comprise any suitable polymer material which may be removed selective to the silicon-containing dielectric layer 972. For example, the first polymer material may comprise functionalized polynorbornene ("PNB"), polycarbonate, polyimide, polyaldehyde, etc. The first polymer material can be applied over the first pad-level silicon-containing dielectric layer 972 by spin coating. Excess portions of the first polymer material may be removed from above the horizontal plane including the top surfaces of the first bonding pads 988, for example, by mechanical sweeping and/or by adjusting the spin speed of a wafer containing the first semiconductor die 900. Alternatively, excess portions of the first polymer material may be removed from above the horizontal plane including the top surfaces of the first bonding pads 988 by stamping with a blanket stamp including a flat surface, which stops at the horizontal plane including the top surfaces of the first bonding pads 988. Alternatively, the first polymer material can optionally be cured, and a chemical mechanical planarization process can be performed to remove portions of the first polymer material from above the horizontal plane including the top surfaces of the first bonding pads 988.

A first semiconductor die 900 is provided, which comprises a first substrate 908, first semiconductor devices 920, and first bonding pads 988 that are electrically connected to a respective node of the first semiconductor devices 920 and laterally surrounded by a first pad-level dielectric layer 971. The first pad-level dielectric layer 971 comprises a stack of a first pad-level silicon-containing dielectric layer 972 and a first polymer material layer 974. While the structure illustrated in FIG. 53 can be employed as a first semiconductor die 900 according to the fifth embodiment of the present disclosure, the structure illustrated in FIG. 53 may be employed as a first semiconductor die 900 in other embodiments, such as the first semiconductor die 900 of FIG. 22, the first semiconductor die 900 of FIG. 31, or the first semiconductor die 900 of FIG. 39. Alternatively, the first semiconductor die 900 of FIG. 22, the first semiconductor die 900 of FIG. 31, or the first semiconductor die 900 of FIG. 39 may be employed in lieu of the first semiconductor die 900 of FIG. 53.

Figure 54:
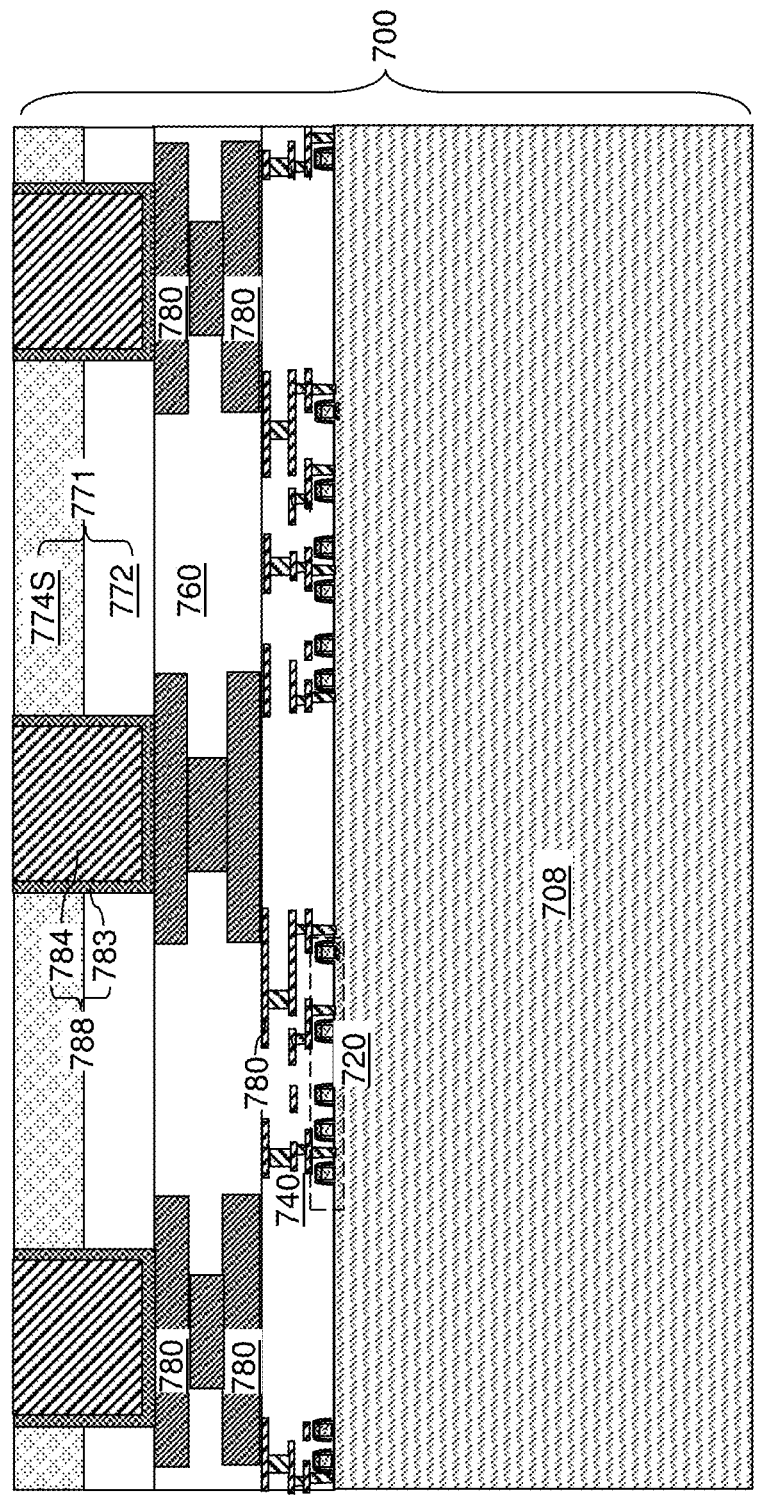
FIG. 54 is a schematic vertical cross-sectional view of a second semiconductor die according to the fifth embodiment of the present disclosure.

Referring to FIG. 54, the processing steps of FIGS. 47-53 can be performed while making suitable modifications to form the second semiconductor die 700 of FIG. 54. Specifically, a second pad-level silicon-containing dielectric layer 772 can be formed over the second interconnect-level dielectric layers 760 and the second metal interconnect structures 780 of the second semiconductor die 700 of FIG. 3 instead of forming the second bonding dielectric layer 770 and the second bonding pads 788. The second pad-level silicon-containing dielectric layer 772 may have any of the material composition that can be employed for the first pad-level silicon-containing dielectric layer 972. The second pad-level silicon-containing dielectric layer 772 can have a thickness in a range from 1,000 nm to 10,000 nm, although lesser and greater thicknesses can also be employed. Subsequently, the processing steps of FIGS. 48-53 can be performed while making suitable modifications to form the second semiconductor die 700.

A second semiconductor die 700 is provided, which comprises a second substrate 708, second semiconductor devices 720, and second bonding pads 788 that are electrically connected to a respective node of the second semiconductor devices 720 and laterally surrounded by a second pad-level dielectric layer 771. The second pad-level dielectric layer 771 comprises a stack of a second pad-level silicon-containing dielectric layer 772 and a second polymer material layer 774 including a second polymer material. While the structure illustrated in FIG. 54 can be employed as a second semiconductor die 700 according to the fifth embodiment of the present disclosure, the structure illustrated in FIG. 54 may be employed as any second semiconductor die 700 in other embodiments in which the second pad-level dielectric layer 771 comprises a stack of a second pad-level silicon-containing dielectric layer 772 and a second polymer material layer 774 including a second polymer material. Alternatively, any second semiconductor die 700 in other embodiments in which the second pad-level dielectric layer 771 comprises a stack of a second pad-level silicon-containing dielectric layer 772 and a second polymer material layer 774 including a second polymer material may be employed in lieu of the second semiconductor die 700 of FIG. 54.

Figure 55:
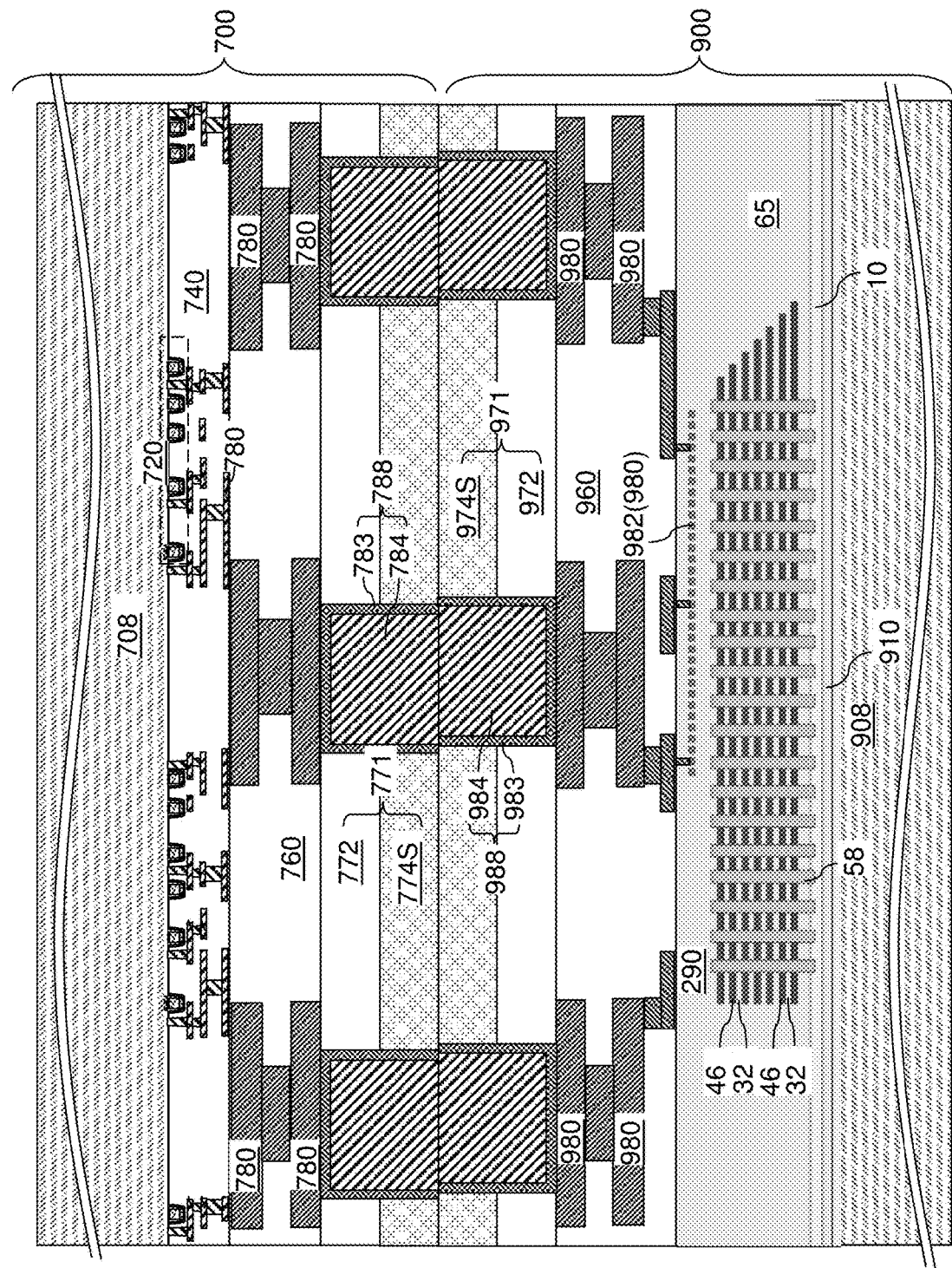
FIG. 55 is a schematic vertical cross-sectional view of a fifth exemplary structure including the first semiconductor die and the second semiconductor die after disposing the second bonding pads on the first bonding pads according to the fifth embodiment of the present disclosure.

Referring to FIG. 55, the first semiconductor die 900 and the second semiconductor die 700 are oriented such that each of the first bonding pads 988 faces a respective one of the second bonding pads 788. The second semiconductor die 700 and the first semiconductor die 900 are brought into contact such that the second polymer material layer 774 contacts the first polymer material layer 974. The first semiconductor die 900 and the second semiconductor die 700 may be laterally aligned such that each second bonding pad 788 contacts a respective one of the first bonding pads 988. In one embodiment, the pattern of the second bonding pads 788 may be a mirror image of the pattern of the first bonding pads 988 with optional differences in the size of bonding pads between the first semiconductor die 900 and the second semiconductor die 700. In one embodiment, the first bonding pads 988 and the corresponding second bonding pads 788 may have the same size (i.e., lateral width). In another embodiment, the first bonding pads 988 and the corresponding second bonding pads 788 may have different sizes. In one embodiment, areal overlap between each facing pair of a first bonding pad 988 and a second bonding pad 788 may be at least 80%, and/or at least 90%, such as 90 to 100%, of the area of the smaller one of the first bonding pad 988 and the second bonding pad 788.

Figure 56:
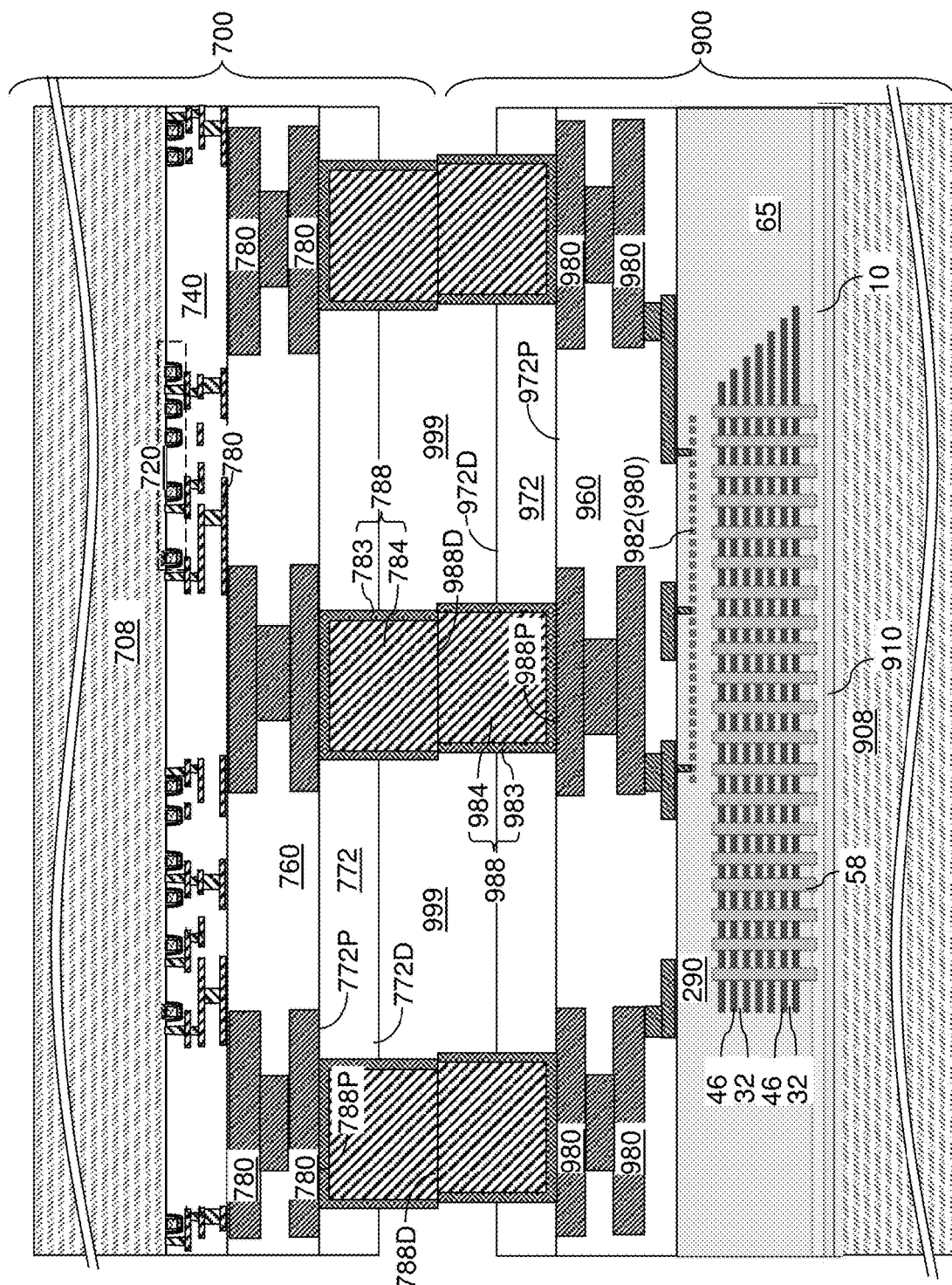
FIG. 56 is a schematic vertical cross-sectional view of the fifth exemplary structure after bonding the second bonding pads to the first bonding pads according to the fifth embodiment of the present disclosure.

Referring to FIG. 56, the second bonding pads 788 may be bonded to the first bonding pads 988 by performing an anneal process that induces metal-to-metal bonding between the second bonding pads 788 and the first bonding pads 988 while the first polymer material layer 974 and the second polymer material layer 774 are gradually decomposed. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 150 degrees Celsius to 400 degrees Celsius.

Generally, the first polymer material and the second polymer material may remain in the bonded assembly (900, 700) if the decomposition temperatures of the first polymer material and the second polymer material are above the anneal temperature employed to bond the second bonding pads 788 to the first bonding pads 988. Conversely, the first polymer material and the second polymer material may be removed from the bonded assembly (900, 700) if the decomposition temperatures of the first polymer material and the second polymer material are below the anneal temperature employed to bond the second bonding pads 788 to the first bonding pads 988.

In an illustrative example, polyphthalaldehyde has a decomposition temperature of about 120 degrees Celsius, polypropylene carbonate has a decomposition temperature in a range from 200 degrees Celsius to 300 degrees Celsius, functionalized polynorbornene has a decomposition temperature in a range from 425 degrees Celsius to 450 degrees Celsius, and polyimide has a decomposition temperature in a range from 500 degrees to 600 degrees. Thus, if the first polymer material and the second polymer material include polyphthalaldehyde and/or polypropylene carbonate and if the anneal temperature that induces metal-to-metal bonding between the first bonding pads 988 and the second bonding pads 788 is 400 degrees Celsius, the first polymer material layer 974 and the second polymer material layer 774 can be removed during bonding. In such cases, the first polymer material layer 974 and the second polymer material layer 774 can retard oxidation of the first bonding pads 988 and the second bonding pads 788 until the first polymer material and the second polymer material are thermally decomposed. If the first polymer material and the second polymer material include functionalized polynorbornene and/or polyimide and if the anneal temperature that induces metal-to-metal bonding between the first bonding pads 988 and the second bonding pads 788 is 400 degrees Celsius, the first polymer material layer 974 and the second polymer material layer 774 can remain after the bonding process and provide additional bonding strength between the first semiconductor die 900 and the second semiconductor die 700.

Optionally, additional process steps of FIG. 9 may be performed to form through-substrate contact via structures 714 and/or additional bonding structures.

Optionally, a first self-assembled monolayer (SAM) material having a first tail group can be selectively formed on physically exposed surfaces of the first bonding pads 988 while suppressing deposition of the first SAM material on the first polymer material layer 974 prior to the bonding process. Additionally or alternatively, a second SAM material having a second tail group can be selectively formed on physically exposed surfaces of the second bonding pads 788 while suppressing deposition of the second SAM material on the second polymer material layer 774 prior to the bonding process. In some embodiment, the second tail group can have affinity to the first tail group to facilitate alignment of the second bonding pads 788 to the first bonding pads 988. The first SAM material and the second SAM material can be decomposed during bonding.

Generally, if the thermal decomposition temperatures of the first polymer material and the second polymer material are lower than the elevated temperature of an anneal process in which the second bonding pads 788 are bonded to the first bonding pads 988, removal of the first polymer material layer 974 and the second polymer material layer 774 can be performed during the anneal process, i.e., during the bonding process. An air gap 999 is formed in the space from which the first and/or second polymer material layers are removed. The air gap 999 is located between laterally adjacent bonding pads.

Referring to FIGS. 47-56 and according to various embodiments of the present disclosure, a bonded assembly (900, 700) is provided, which comprises: a first semiconductor die 900 comprising a first substrate 908, first semiconductor devices 920, and first bonding pads 988 that are electrically connected to a respective node of the first semiconductor devices 920 and laterally surrounded by a first pad-level dielectric layer (as embodied as the first pad-level silicon-containing dielectric layer 972), wherein the first pad-level dielectric layer comprises a first distal surface 972D that is more proximal to the first substrate 908 than distal surfaces 988D of the first bonding pads 988 are to the first substrate 908; and a second semiconductor die 700 comprising a second substrate 708, second semiconductor devices 720, and second bonding pads 788 that are electrically connected to a respective node of the second semiconductor devices 720 and laterally surrounded by a second pad-level dielectric layer (as embodied as the first pad-level silicon-containing dielectric layer 772), wherein each of the second bonding pads 788 is bonded to a respective one of the first bonding pads 988, the second pad-level dielectric layer comprises a second distal surface 772D that is more proximal to the second substrate 708 than distal surfaces 788D of the second bonding pads 788 are to the second substrate 708, and an air gap 999 is present between the first pad-level dielectric material layer and the second pad-level dielectric layer, and the air gap laterally surrounds each bonded pair of the first bonding pad 988 and second bonding pad 788.

In one embodiment, the proximal surfaces 988P of the first bonding pads 988 can be located within a same horizontal plane as the proximal surface 972P of the first pad-level dielectric layer (which comprises the first pad-level silicon-containing dielectric layer 972) that is in contact with first interconnect-level dielectric layers 960. In one embodiment, the proximal surfaces 788P of the second bonding pads 788 can be located within a same horizontal plane as the proximal surface 772P of the second pad-level dielectric layer (which comprises the second pad-level silicon-containing dielectric layer 772) that is in contact with second interconnect-level dielectric layers 760. The distal surfaces 988D of the first bonding pads 988 are in contact with the distal surfaces 788D of the second bonding pads 788, and are located within a horizontal plane including the bonding interfaces between the first bonding pads 988 and the second bonding pads 788.

In one embodiment, each of the first bonding pads 988 and the second bonding pads 788 comprises a respective metallic barrier liner (982, 783) including a respective metallic nitride material and a respective metallic fill material portion (984, 784) laterally surrounded by the respective metallic barrier liner (982, 783); and each of the metallic barrier liners (982, 783) comprises a respective outer sidewall that includes a distal segment that is physically exposed to the air gap 999 and a proximal segment that contacts one of the first pad-level dielectric layer and the second pad-level dielectric layer.

The air gap 999 provides an effective dielectric constant of about 1.00059, and reduces capacitive coupling between the bonded pairs of the first bonding pads 988 and the second bonding pads 788. The RC delay through the bonded pairs of the bonding pads 988 and the second bonding pads 788 can be minimized by the air gap 999, which provides low dielectric constant, and thus, reduces the capacitive coupling of signals.

The various embodiments of the present disclosure can be employed to provide various bonded assemblies (900, 700) in which at least one polymer material layer and/or polymer hairs can enhance bonding strength between the first semiconductor die 900 and the second semiconductor die 700, or low capacitive coupling between adjacent bonded pairs of the bonding pads 988 and the second bonding pads 788 is provided through an air gap 999.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly, comprising:
a first semiconductor die comprising a first substrate, first semiconductor devices, and first bonding pads that are electrically connected to a respective node of the first semiconductor devices and laterally surrounded by a first pad-level dielectric layer, wherein the first pad-level dielectric layer comprises a stack of a first proximal polymer material layer and a first distal polymer material layer having at least one of greater hydrophilicity or greater cross-linking density than first proximal polymer material layer; and
a second semiconductor die comprising a second substrate, second semiconductor devices, and second bonding pads that are electrically connected to a respective node of the second semiconductor devices and laterally surrounded by a second pad-level dielectric layer, wherein each of the second bonding pads is bonded to a respective one of the first bonding pads, and the first distal polymer material layer contacts the second pad-level dielectric layer.

2. The bonded assembly of claim 1, wherein:
the first distal polymer material layer has higher surface energy than the first proximal polymer material layer; and
the first distal polymer material layer has a smaller contact angle than the first proximal polymer material layer.

3. The bonded assembly of claim 1, wherein:
the first proximal polymer material layer has a first cross-linking density;
the first distal polymer material layer has a second cross-linking density; and
the second cross-linking density is higher than the first cross-linking density.

4. The bonded assembly of claim 1, wherein the first distal polymer material layer and the first proximal polymer material layer comprise polymers of a same monomer, and the first distal polymer material layer has the greater hydrophilicity than the first proximal polymer layer.

5. The bonded assembly of claim 4, wherein the first distal polymer material layer comprises polar functional groups.

6. The bonded assembly of claim 5, wherein the polar function groups comprise at least one of a carbonyl group, a carboxyl group, an amine group, an amide group, or a hydroxyl group.

7. The bonded assembly of claim 5, wherein:
the first distal polymer material layer includes the polar functional groups at a distal functional group density; and
the first proximal polymer material layer is essentially free of the polar function groups or includes the polar functional groups at a proximal functional group density that is lower than the distal functional group density.

8. The bonded assembly of claim 1, wherein the second pad-level dielectric layer comprises a stack of a second proximal polymer material layer and a second distal polymer material layer having greater hydrophilicity than second proximal polymer material layer and contacting the second proximal polymer material layer.

9. The bonded assembly of claim 1, wherein the second pad-level dielectric layer comprises a stack of a second proximal polymer material layer and a second distal polymer material layer having greater cross-linking density than the second proximal polymer material layer and contacting the second proximal polymer material layer.

10. The bonded assembly of claim 1, wherein the second pad-level dielectric layer comprises a silicon-containing dielectric material in contact with the first distal polymer material layer.

11. A bonded assembly, comprising:
a first semiconductor die comprising a first substrate, first semiconductor devices, and first bonding pads that are electrically connected to a respective node of the first semiconductor devices;
a second semiconductor die comprising a second substrate, second semiconductor devices, and second bonding pads that are electrically connected to a respective node of the second semiconductor devices; and
a pad-level polymer material layer including a blend of two miscible polymer materials laterally surrounding the first bonding pads and the second bonding pads.

12. The bonded assembly of claim 11, further comprising:
a first pad-level silicon-containing dielectric layer laterally surrounding portions of the first bonding pads that are proximal to the first substrate; and
a second pad-level silicon-containing dielectric layer laterally surrounding portions of the second bonding pads that are proximal to the second substrate.

13. The bonded assembly of claim 12, wherein the pad-level polymer material layer contacts portions of sidewalls of the first bonding pads that are distal from the first substrate, and contacts portions of sidewalls of the second bonding pads that are distal from the second substrate.

14. The bonded assembly of claim 11, wherein the pad-level polymer material layer has a compositional gradient such that a concentration of a first polymer material of the two miscible polymer materials decreases with a distance from the first substrate.

15. The bonded assembly of claim 11, wherein the two miscible polymer materials are selected from:
a combination of styrene maleic anhydride (SMA) and tetra-glycidyl ether of diphenyl diamino methane (TGDDM);
a combination of maleic anhydride grafted polypropylene (PP-g-MA) and tetra-glycidyl ether of diphenyl diamino methane (TGDDM); or
a combination of poly(methyl methacrylate) (PMMA) and polyvinylidene fluoride (PVDF).

16. A method of forming a bonded assembly, comprising:
providing a first semiconductor die comprising a first substrate, first semiconductor devices, and first bonding pads that are electrically connected to a respective node of the first semiconductor devices and laterally surrounded by a first polymer material layer including a first polymer material;
providing a second semiconductor die comprising a second substrate, second semiconductor devices, and second bonding pads that are electrically connected to a respective node of the second semiconductor devices and laterally surrounded by a second polymer material layer including a second polymer material, wherein the second polymer material is miscible with and is different from the first polymer material;
bringing the first semiconductor die and the second semiconductor die into contact with each other such that the second bonding pads are disposed on a respective one of the first bonding pads; and
mixing the first polymer material and the second polymer material, whereby a pad-level polymer material layer including a blend of first polymer material and the second polymer material is formed.

17. The method of claim 16, wherein:
the first semiconductor die further comprises a first pad-level silicon-containing dielectric layer that comprises silicon oxide, silicon nitride, or silicon oxynitride and laterally surrounds the first bonding pads;
the second semiconductor die further comprises a second pad-level silicon-containing dielectric layer that comprises silicon oxide, silicon nitride, or silicon oxynitride and laterally surrounds the second bonding pads;
the first polymer material layer is formed on the first pad-level silicon-containing dielectric layer; and
the second polymer material layer is formed on the second pad-level silicon-containing dielectric layer.

18. The method of claim 16, wherein mixing the first polymer material and the second polymer material comprises annealing the first polymer material layer and the second polymer material layer at an elevated temperature in a range from 200 degrees Celsius to 250 degrees Celsius.

19. The method of claim 16, further comprising:
selectively forming a first self-assembled monolayer (SAM) material having a first tail group on physically exposed surfaces of the first bonding pads while suppressing deposition of the first SAM material on the first polymer material layer;
selectively forming a second SAM material having a second tail group on physically exposed surfaces of the second bonding pads while suppressing deposition of the second SAM material on the second polymer material layer, wherein the second tail group has affinity to the first tail group; and
inducing bonding between the first bonding pads and the second bonding pads, wherein the first SAM material and the second SAM material are decomposed during bonding.

20. The method of claim 16, wherein the first polymer material and the second polymer material are selected from:
a combination of styrene maleic anhydride (SMA) and tetra-glycidyl ether of diphenyl diamino methane (TGDDM);
a combination of maleic anhydride grafted polypropylene (PP-g-MA) and tetra-glycidyl ether of diphenyl diamino methane (TGDDM); or
a combination of poly(methyl methacrylate) (PMMA) and polyvinylidene fluoride (PVDF).

* * * * *